US008430539B2

(12) United States Patent \
Matsuzaki et al.

(10) Patent No.: US 8,430,539 B2 \
(45) Date of Patent: *Apr. 30, 2013

(54) SHEET AND LIGHT EMITTING DEVICE

(75) Inventors: Jyunpei Matsuzaki, Osaka (JP); \
Shin-ichi Wakabayashi, Osaka (JP); \
Seiji Nishiwaki, Hyogo (JP); Tatsuya Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 217 days.

This patent is subject to a terminal disclaimer.

(21) Appl. No.: 12/997,299

(22) PCT Filed: May 6, 2010

(86) PCT No.: PCT/JP2010/003120 \
§ 371 (c)(1), \
(2), (4) Date: Dec. 10, 2010

(87) PCT Pub. No.: WO2010/131440 \
PCT Pub. Date: Nov. 18, 2010

(65) Prior Publication Data

US 2011/0090697 A1    Apr. 21, 2011

(30) Foreign Application Priority Data

May 12, 2009   (JP) .................... 2009-115986

(51) Int. Cl. \
*F21V 5/00*   (2006.01)

(52) U.S. Cl. \
USPC ................... 362/326; 362/332; 362/97.4

(58) Field of Classification Search ............ 362/19, 362/97.1, 97.4, 84, 293, 326, 332; 313/112, 313/506 \
See application file for complete search history.

(56) References Cited

U.S. PATENT DOCUMENTS

| 6,803,154 | B1 | 10/2004 | Tanaka |
| 7,559,681 | B2 * | 7/2009 | Suehiro et al. ............. 362/558 |
| 8,227,966 | B2 * | 7/2012 | Wakabayashi et al. ....... 313/112 |
| 2001/0035713 | A1 | 11/2001 | Kimura |
| 2002/0180348 | A1 | 12/2002 | Oda et al. |
| 2005/0207011 | A1 | 9/2005 | Ito et al. |
| 2008/0037126 | A1 | 2/2008 | Kitamura et al. |

FOREIGN PATENT DOCUMENTS

| JP | 11-283751 A | 10/1999 |
| JP | 2002-008850 A | 1/2002 |
| JP | 2002-122702 A | 4/2002 |
| JP | 2003-059641 A | 2/2003 |
| JP | 2005-077966 A | 3/2005 |
| JP | 2005-276581 | 10/2005 |
| WO | 2005/124403 A1 | 12/2005 |
| WO | 2008/069324 A1 | 6/2008 |

OTHER PUBLICATIONS

International Search Report for corresponding International Application No. PCT/JP2010/003120 mailed Jun. 8, 2010. \
C.G. Bernhard, "Structural and functional adaptation in a visual system", Endeavour, vol. 26, pp. 79-84, 1967 (cited in [0133] of the specification). \
Kanamori et al., "Broadband antireflection gratings fabricated upon silicon substrates", Optics Letters, vol. 24, No. 20, pp. 1422-1424, Oct. 15, 1999 (cited in [0133] of the specification). \
Chinese Office Action for corresponding Chinese Application No. 201080001821.7 issued Dec. 5, 2012 and English translation.

* cited by examiner

*Primary Examiner* — Thomas Sember

(57) ABSTRACT

A light emitting device 107 includes a surface structure 113 in a surface of a transparent substrate 105 which is adjacent to a light emitting body. The surface of the transparent substrate 105 is divided into minute regions, without leaving any gap therebetween, such that the diameter of the largest one of the inscribed circles of the minute regions is from 0.2 μm to 1.5 μm. Each of the minute regions is in the form of a protrusion or recess. The proportion of the protrusions and the proportion of the recesses are P and 1−P, respectively, and P is in the range of 0.4 to 0.98. At least part of the minute regions has a micro periodic structure 114 that is formed by indentations and projections.

18 Claims, 28 Drawing Sheets

(a)　　　(b)

FIG.4
(a)
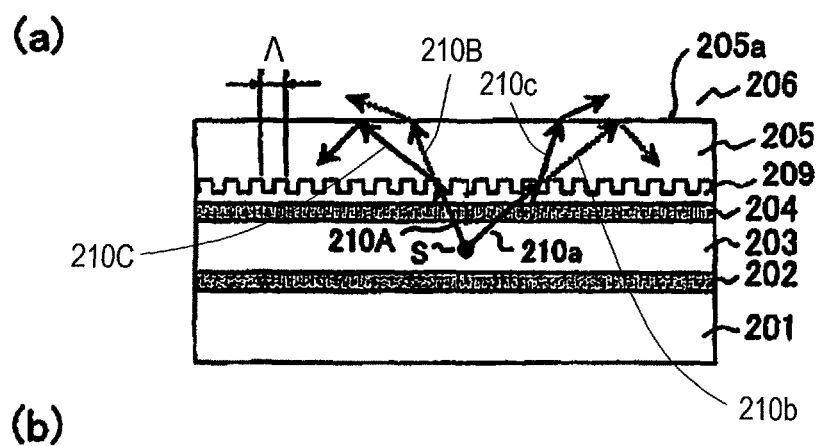
(b)
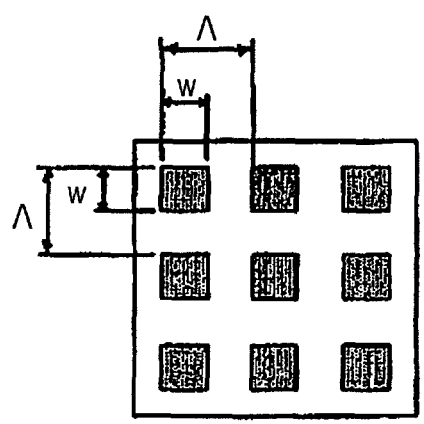

FIG.5
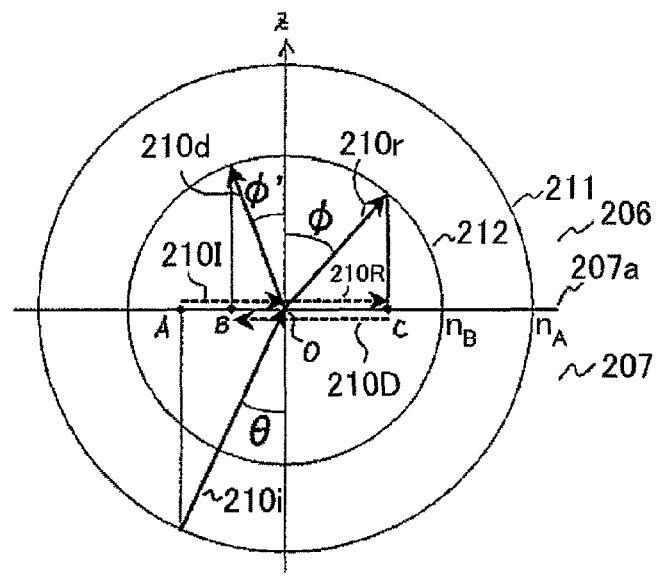
FIG.6
(a)
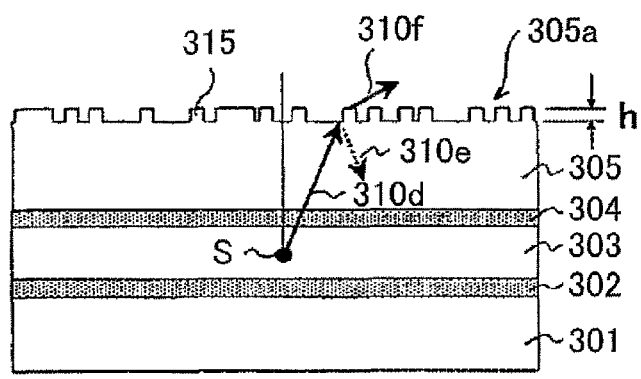
(b)
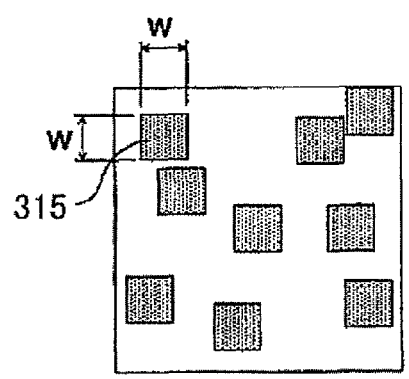

FIG.8
(a)
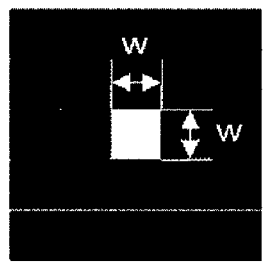
(b)
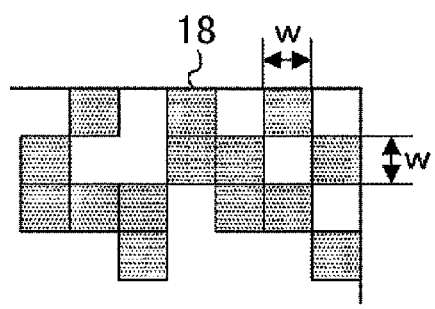
FIG.9
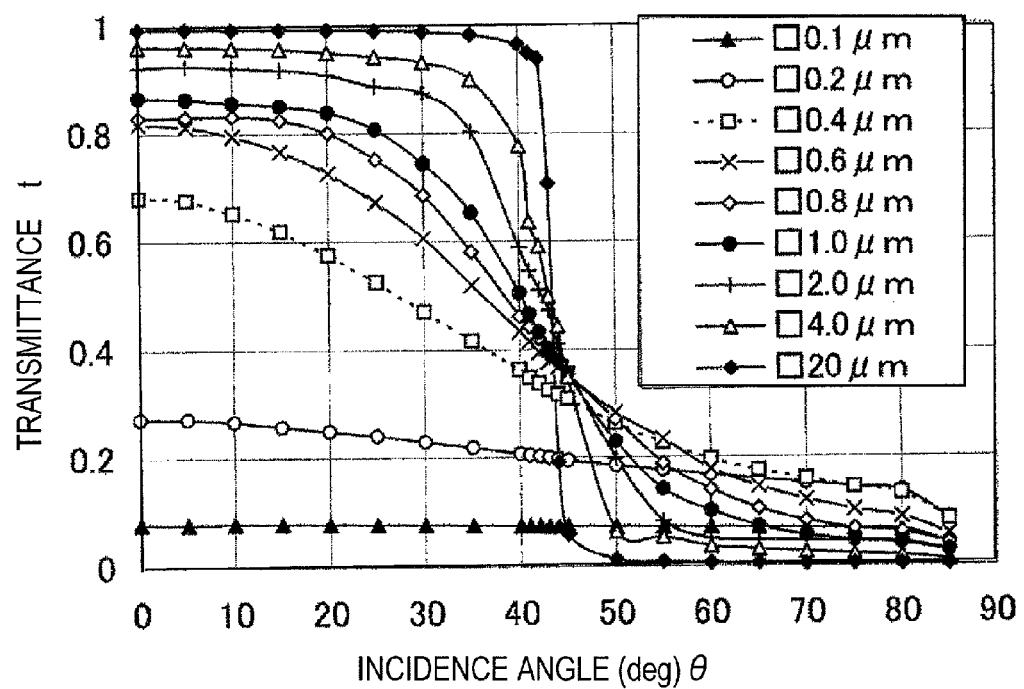

FIG.12
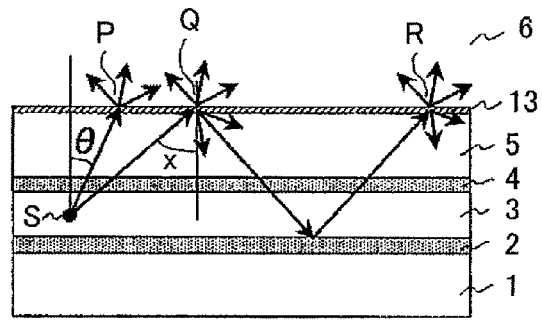
FIG.13
(a)
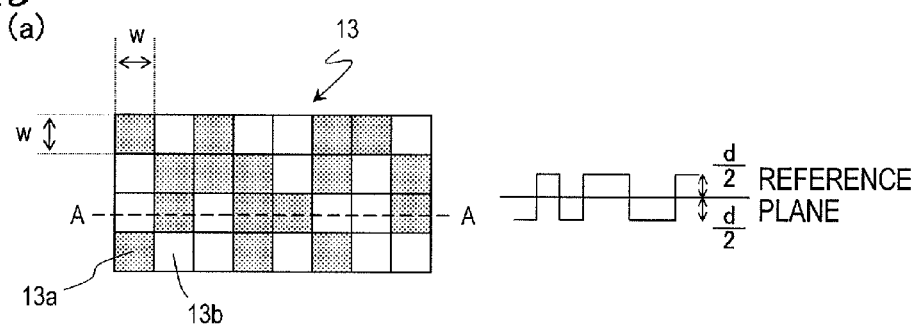
(b)
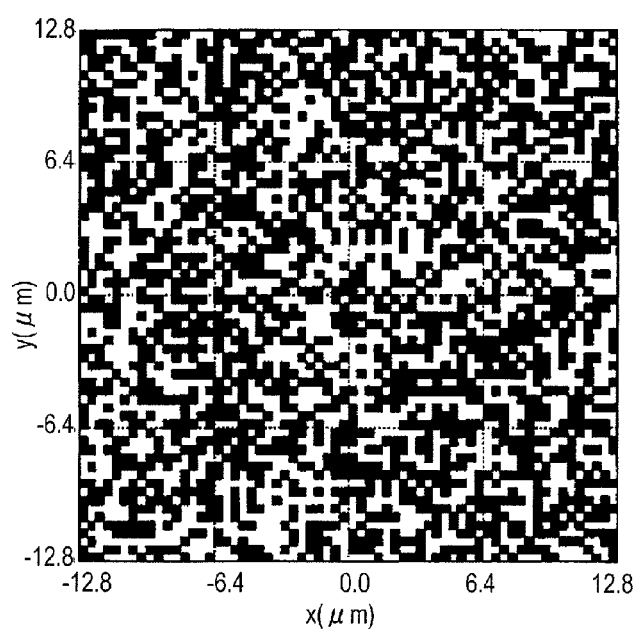

FIG.16
(a)
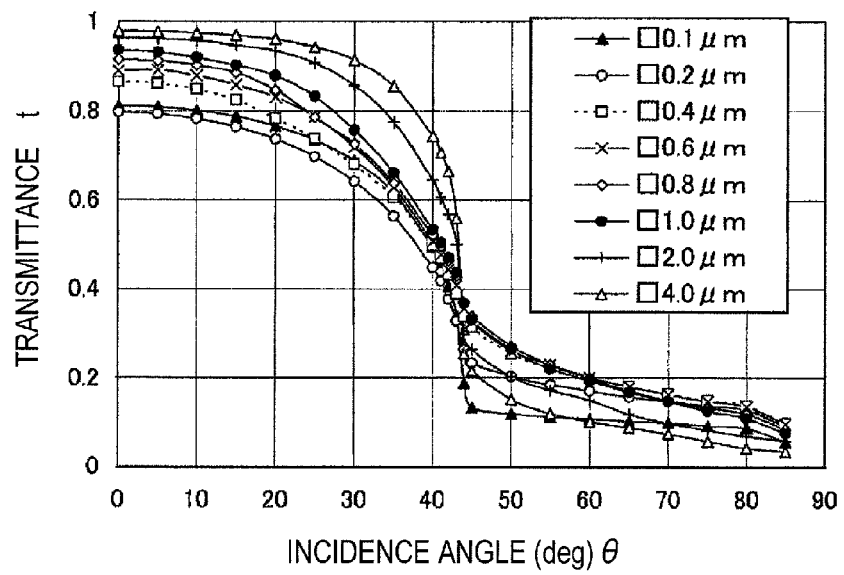
(b)
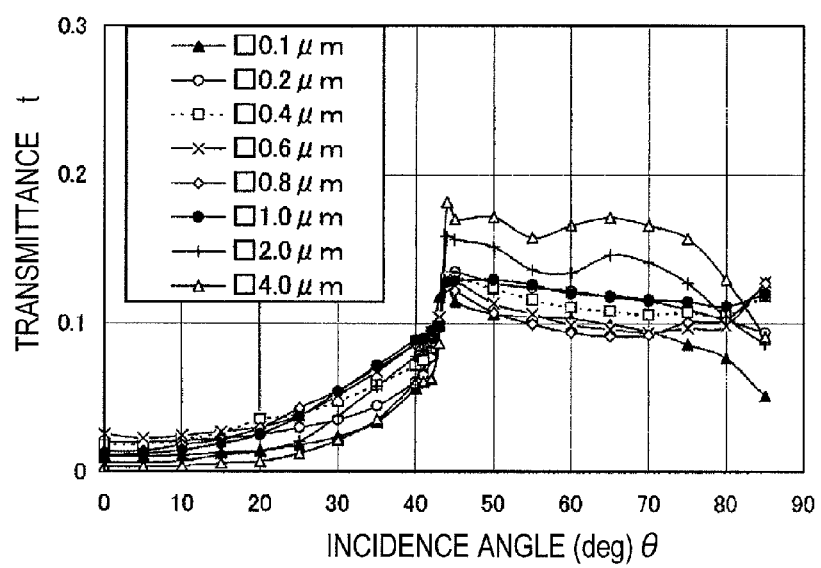

*FIG.18*
(a)
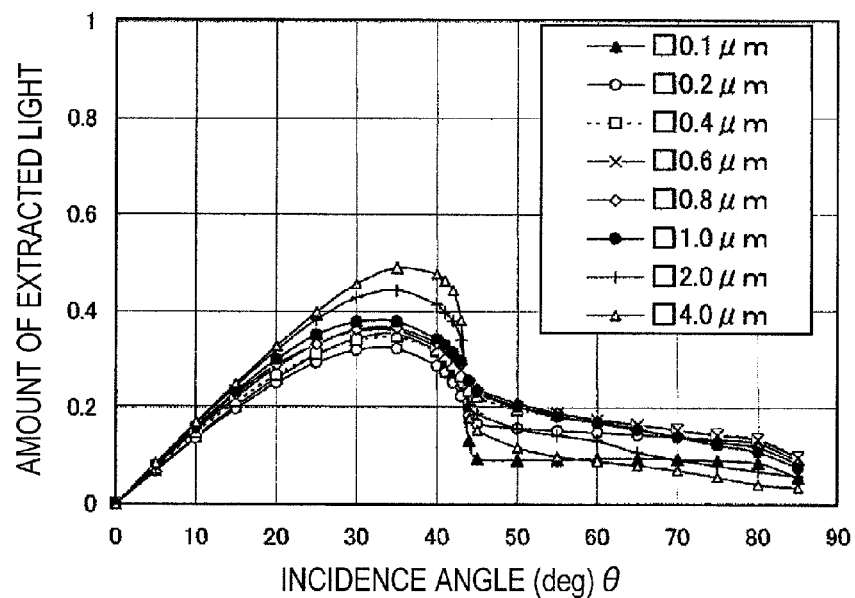
(b)
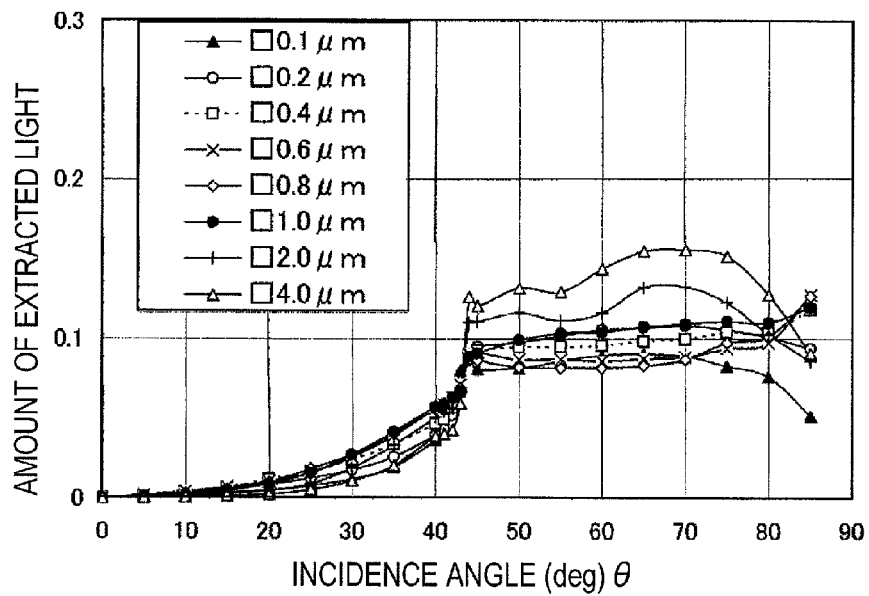

FIG.19
(a) 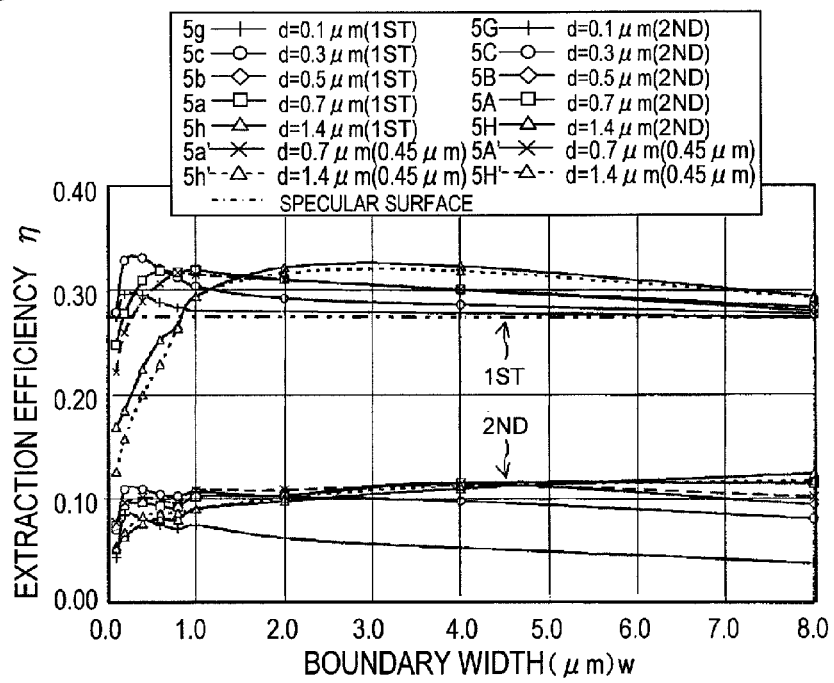
(b) 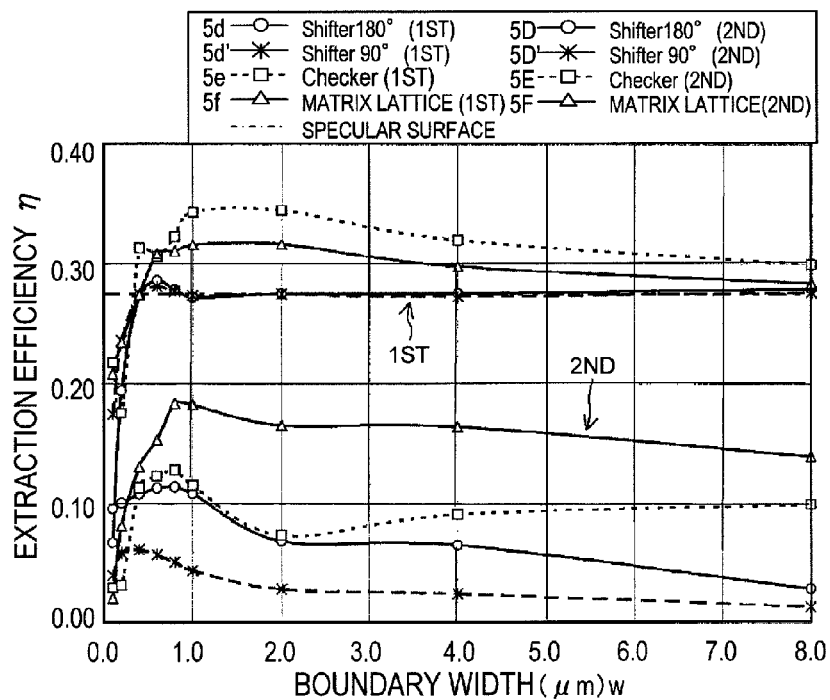

*FIG.22*
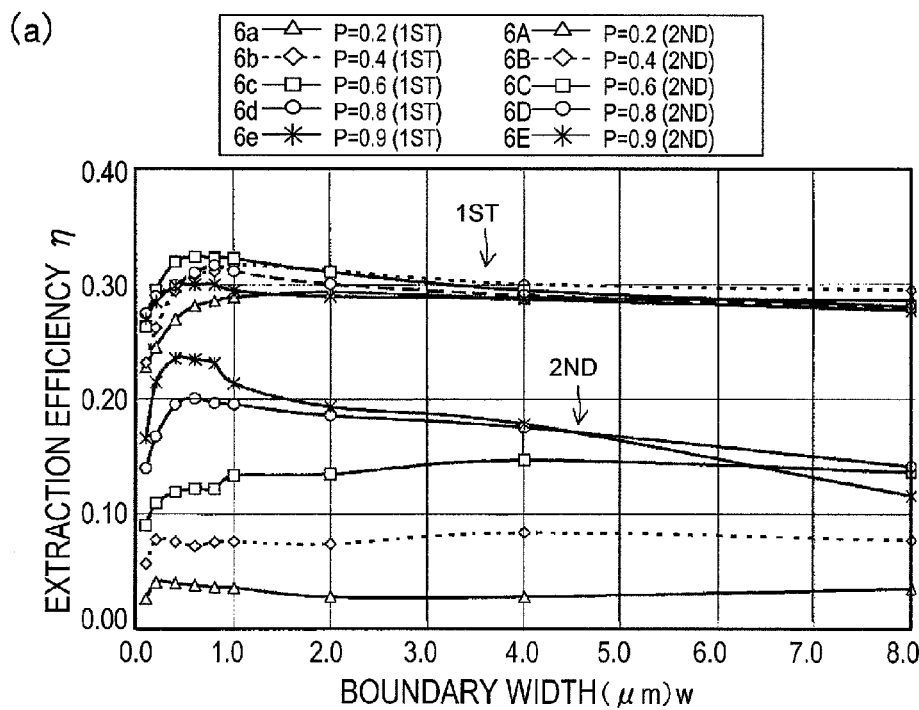
(a)
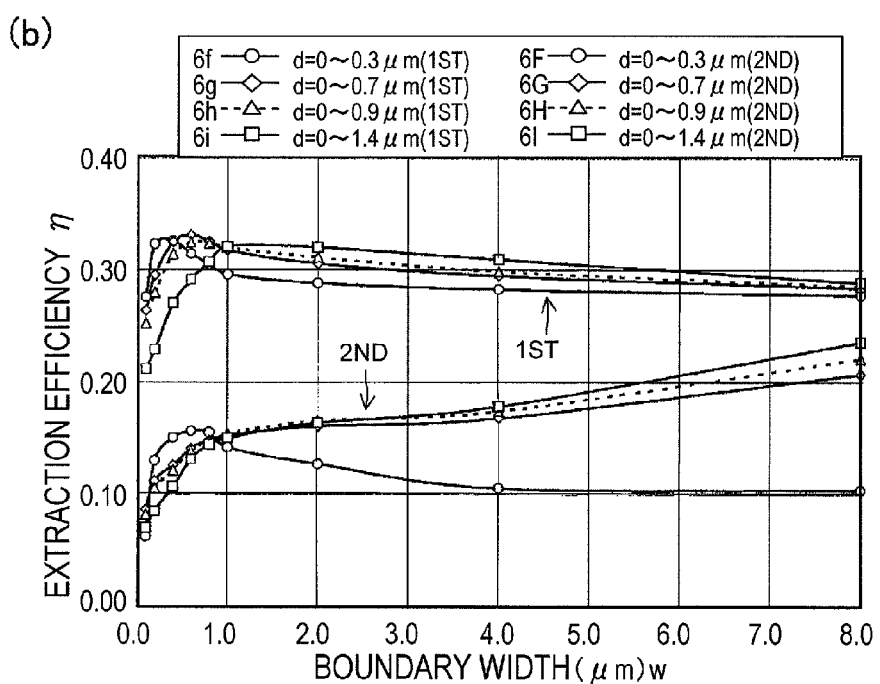
(b)

FIG.26
(a)
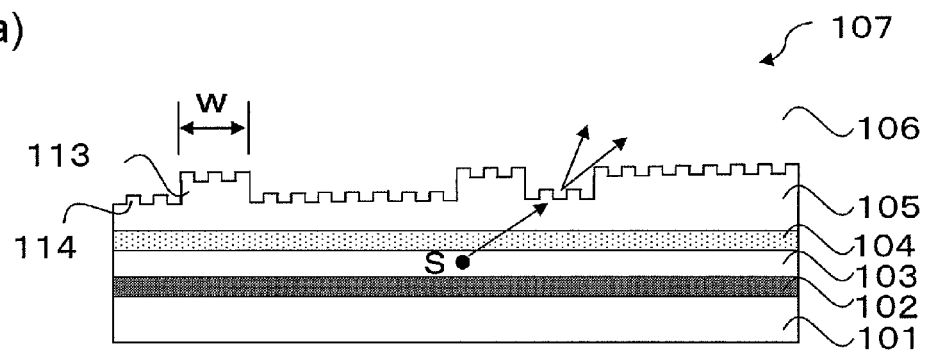
(b)
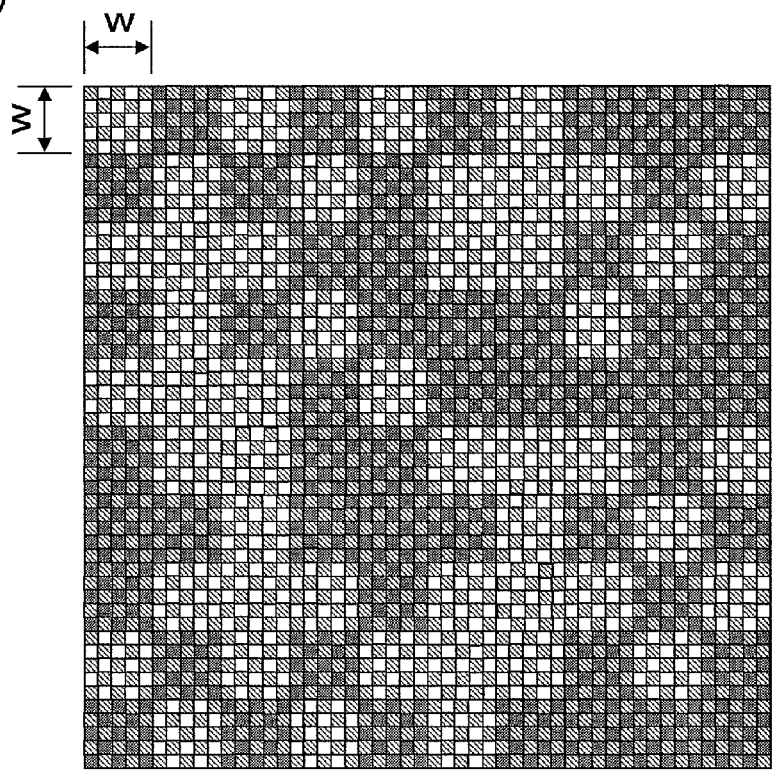

*FIG.31*
(a)
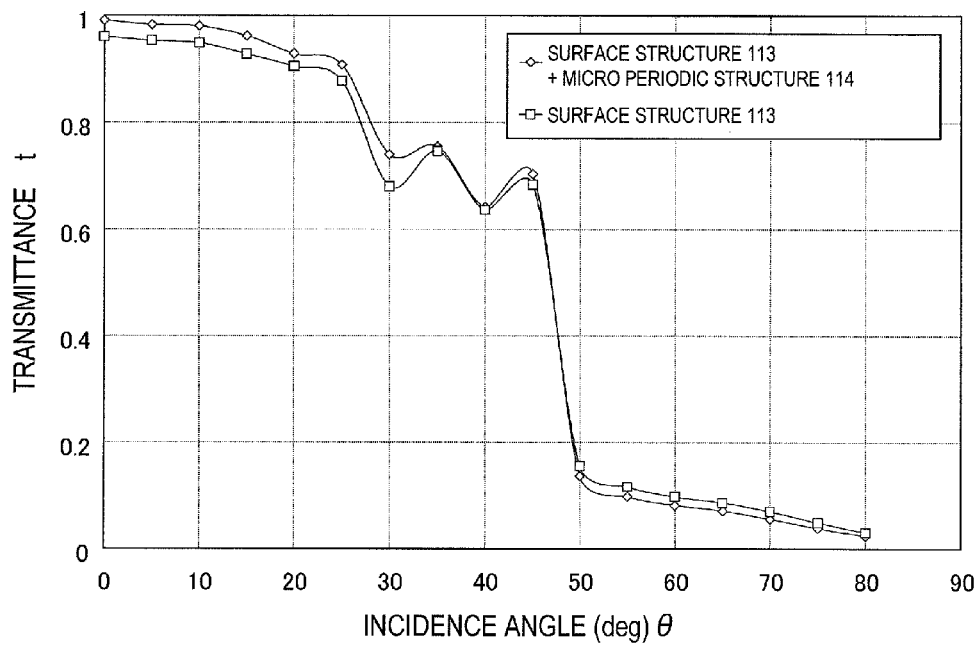
(b)
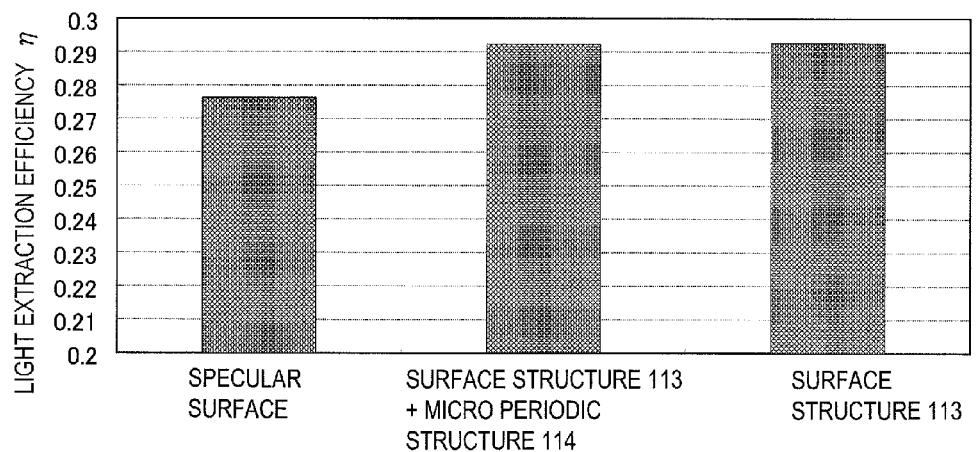

FIG. 32
(a)
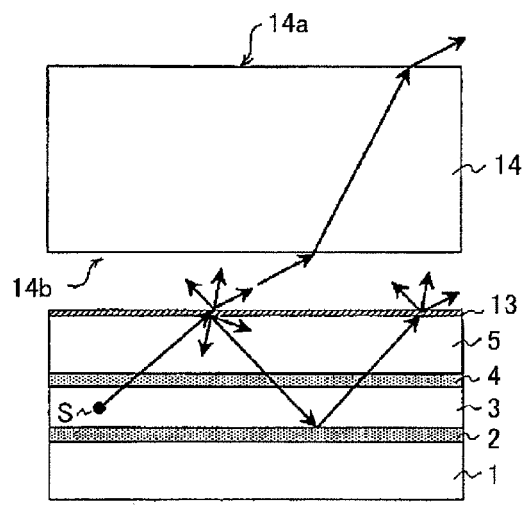
(b)
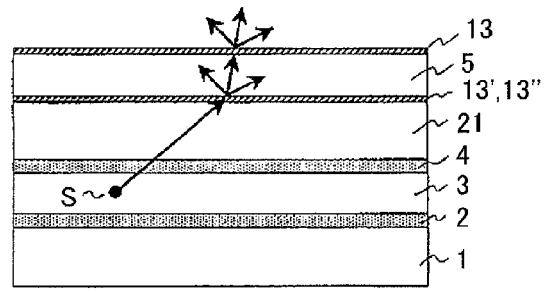
FIG. 33
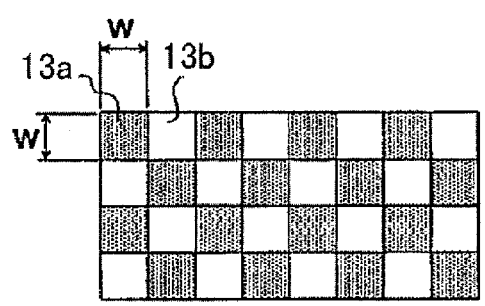

*FIG.34*
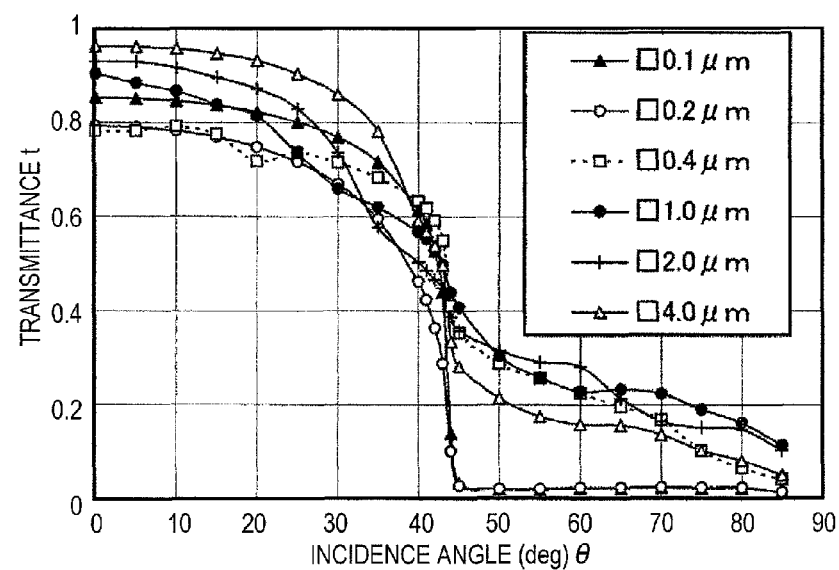
*FIG.35*
(a) 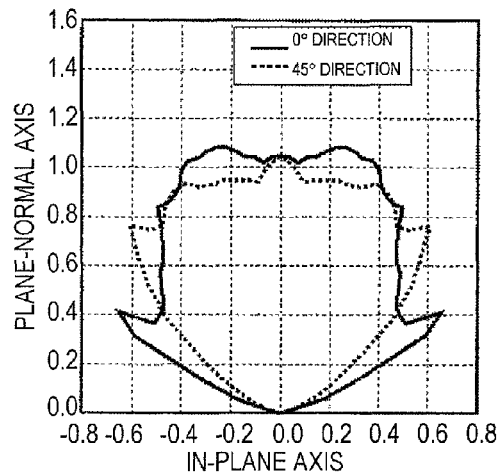   (b) 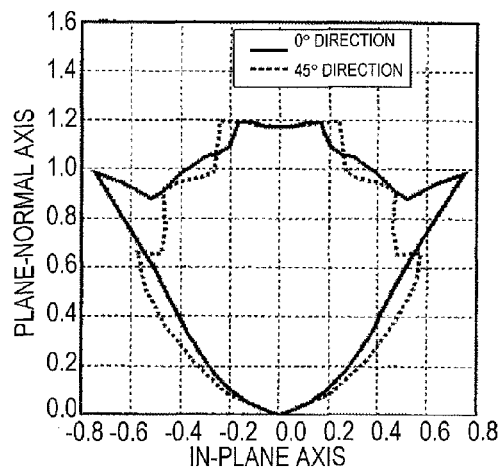

FIG.36
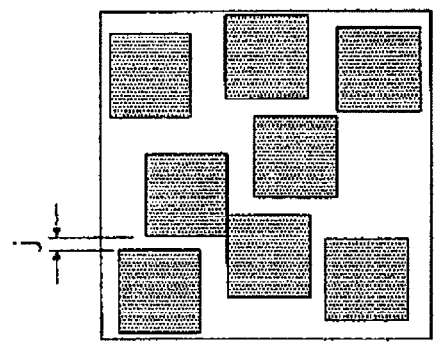
(a)
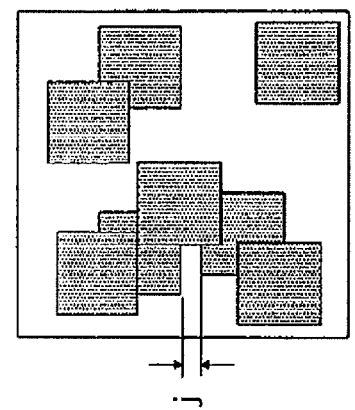
(b)
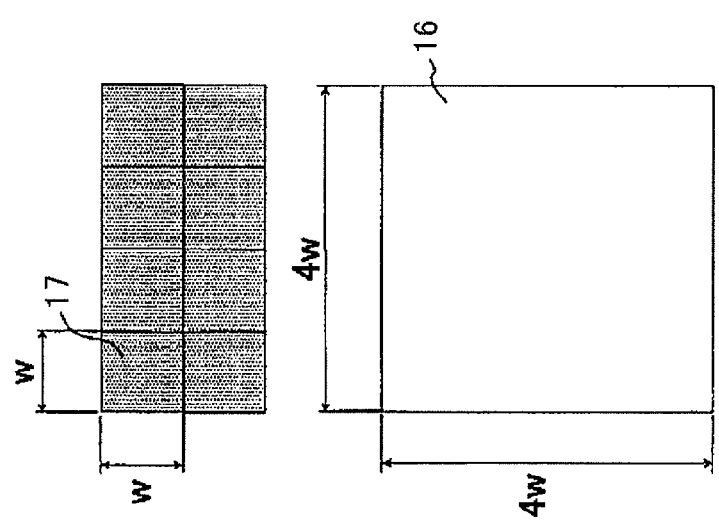
(c)

SHEET AND LIGHT EMITTING DEVICE

TECHNICAL FIELD

The present invention relates to a transparent sheet for use with a light emitting body with one of the surfaces of the sheet being adjacent to the light emitting body, and a light emitting device which includes the sheet.

BACKGROUND ART

There are conventional techniques disclosed in Patent Documents 1 and 2, for example.

FIG. 1 shows a cross-sectional structure of a light emitting device employing a common organic electroluminescence element (organic EL element) and propagation of light. An electrode 102, a light emitting layer 103, and a transparent electrode 104 are stacked in this order on a substrate 101, and a transparent substrate 105 is provided on the transparent electrode 104. When a voltage is applied between the electrode 102 and the transparent electrode 104, light is radiated from a point S in the light emitting layer 103. The light enters the transparent electrode 104 directly or after being reflected by the electrode 102, and is then transmitted through the transparent electrode 104. The light transmitted through the transparent electrode 104 impinges on a surface of the transparent substrate 105 at point P at an incidence angle θ from the normal to the surface. At the point P, the light is refracted to be emitted into an air layer 106.

When the incidence angle θ exceeds the critical angle $\theta_c = \sin^{-1}(1/n'_1)$ where $n'_1$ is the refractive index of the transparent substrate 105, total reflection occurs. For example, a light ray that is incident on the surface of the transparent substrate 105 at point Q at an angle greater than or equal to $\theta_c$ is totally reflected without being emitted into the air layer 106.

FIGS. 2(a) and 2(b) are diagrams for illustrating the light extraction efficiency of the light emitting device on the assumption that the transparent substrate 105 has a multilayer structure. In FIG. 2(a), the formula shown below holds according to Snell's law:

$$n'_k \times \sin \theta'_k = n'_{k-1} \times \sin \theta'_{k-1} = \ldots = n'_1 \times \sin \theta'_1 = n_0 \times \sin \theta_0 \quad \text{(Formula 1)}$$

where $n'_k$ is the refractive index of the light emitting layer 103; $n_0$ is the refractive index of the air layer 106; $n'_{k-1}, n'_{k-2}, \ldots,$ and $n'_1$ are the refractive indices of a plurality of intervening transparent layers between the light emitting layer 103 and the air layer 106 in order of distance from the light emitting layer 103, closest first; $\theta'_k$ is the propagation direction of a light ray radiated from the point S in the light emitting layer 3 (the angle from the normal to a refracting surface); and $\theta'_{k-1}, \theta'_{k-2}, \ldots, \theta'_1,$ and $\theta_0$ are the angles of refraction at the refracting surfaces in order of distance from the light emitting layer 103, closest first.

Therefore, the formula shown below holds:

$$\sin \theta'_k = \sin \theta_0 \times n_0/n'_k \quad \text{(Formula 2)}$$

Thus, Formula 2 is basically identical with Snell's law under the condition that the light emitting layer 103 is in direct contacts with the air layer 106. Formula 2 means that total reflection occurs when $\theta'_k \geq \theta_c = \sin^{-1}(n_0/n'_k)$ irrespective of the refractive indices of the intervening transparent layers.

FIG. 2(b) schematically shows the range of light which can be extracted from the light emitting layer 103. The light which can be extracted is included in the extent of a pair of cones 107 and 107' whose vertexes are at the light radiation point S. The vertex angle of each of the cones 107 and 107' is twice the critical angle $\theta_c$. The center axes of the cones 107 and 107' are on the z-axis that is normal to the refracting surface. Assuming that the light is radiated from the point S with equal intensities in all directions and that the transmittance of light which is incident on the refracting surface at an incidence angle equal to or smaller than the critical angle is 100%, the extraction efficiency η from the light emitting layer 103 is equal to the ratio of part of the surface area of the sphere 108 corresponding to the circular bases of the cones 107 and 107' to the entire surface area of the sphere 108, and is expressed by the formula shown below:

$$\eta = 1 - \cos \theta_c \quad \text{(Formula 3)}$$

Note that the actual extraction efficiency η is smaller than $1 - \cos \theta_c$ because the transmittance for the incidence angles equal to or smaller than the critical angle does not reach 100%. The total efficiency of the light emitting element is equal to a value obtained by multiplying the above-described extraction efficiency η by the light emission efficiency of the light emitting layer.

Patent Document 1 discloses an organic EL element, in the context of the above-described mechanism, which is based on the concept that a diffraction grating is formed in a substrate interface, an internal surface, or a reflecting surface to change the incidence angle of light on a light extraction surface such that the light extraction efficiency is improved with the view of preventing total reflection of light propagating from the transparent substrate to the ambient air at the transparent substrate surface.

Patent Document 2 describes providing a plurality of protrusions over the surface of a transparent substrate of an organic EL element such that reflection of light at the interface between the transparent substrate and the air layer can be prevented, for the purpose of providing a planar light emitting device with excellent light extraction efficiency.

CITATION LIST

Patent Literature

Patent Document 1: Japanese Laid-Open Patent Publication No. 11-283751
Patent Document 2: Japanese Laid-Open Patent Publication No. 2005-276581

NON-PATENT LITERATURE

Non-patent Document 1: 'Structual and functional adaptation in visual system' Endeavour Vol. 26, pp. 79-84, 1967
Non-patent Document 2: Optics Letters Vol. 24, No. 20, p. 1422

SUMMARY OF INVENTION

Technical Problem

However, the above-described conventional light emitting devices have problems which will be described below.

In a conventional light emitting device which employs the organic EL element shown in FIG. 1, the maximum value of the light extraction efficiency η from the light emitting layer 103 does not exceed $1 - \cos \theta_c$. If the refractive index of the light emitting layer 103 is determined, the maximum value of the light extraction efficiency is uniquely limited. For example, when $n_0 = 1.0$ and $n'_k = 1.457$ in Formula 2, the critical angle $\theta_c = \sin^{-1}(n_0/n'_k) = 43.34°$, and the maximum value of the light extraction efficiency is as small as about 1−cos $\theta_c=0.273$. When $n'_k=1.70$, the maximum value of the light extraction efficiency is even smaller, e.g., about 0.191.

The technique disclosed in Patent Document 1 enables extraction of light which would otherwise be totally reflected, although the opposite case may occur. Assuming that there is no diffraction grating layer, a light ray emitted from a point in the light emitting layer may impinge on the refracting surface (emission surface) of the transparent substrate at an incidence angle smaller than the critical angle and then be transmitted and refracted. When there is a diffraction grating layer which diffracts the light ray, the incidence angle on the refracting surface may exceed the critical angle such that the light ray can be totally reflected. This means that the technique disclosed in Patent Document 1 does not necessarily ensure the improvement of the light extraction efficiency. In the technique disclosed in Patent Document 1, diffracted light rays whose directions are shifted by equal amounts are derived from each one of the light rays. Light including such diffracted light rays has a light intensity distribution which varies depending on the direction, and the predetermined amount of shift width depends on the wavelength of emitted light. Thus, color imbalance occurs depending on the direction.

In the light emitting device disclosed in Patent Document 1, ambient light (incoming from the air layer side) is regularly reflected by the surface of the transparent substrate, and this reflection causes a disturbance with the light extracted from the light emitting layer (resulting in, so-called, "ambient light reflection"). Therefore, the surface of the transparent substrate needs an optical treatment, such as an antireflection film or the like, which increases the manufacturing cost. When ambient light impinging on the surface of the transparent substrate is diffuse-reflected, decrease in contrast (so-called "poor black state") occurs. For example, when a light emitting device is used for display applications, the expression at low luminance levels may disadvantageously not be visually perceived.

The light emitting device disclosed in Patent Document 2 is directed to antireflection at the refracting surface. The structure of Patent Document 2 only improves the light extraction efficiency by about 10% to 20%.

The present invention was conceived in view of the above circumstances. One of the objects of the present invention is to provide a sheet and a light emitting device, which enable light which is incident on the transparent substrate at an incidence angle equal to or greater than the critical angle to be emitted out such that the light extraction efficiency can be greatly improved, and which prevent ambient light reflection and a poor black state as well as variation in light intensity distribution and color imbalance which would occur depending on the direction.

Solution to Problem

The first sheet of the present invention is a transparent sheet for use with a light emitting body with one of surfaces of the transparent sheet being adjacent to the light emitting body, wherein the other surface of the transparent sheet includes a plurality of minute regions $\delta$, a largest inscribed circle of the minute regions $\delta$ having a diameter from 0.2 μm to 1.5 μm, one of the minute regions $\delta$ being adjoined by and surrounded by some other ones of the minute regions $\delta$, the plurality of minute regions $\delta$ include a plurality of minute regions $\delta_1$ which are selected from the plurality of minute regions $\delta$ so as to constitute 40% to 98% of the minute regions $\delta$ and a plurality of minute regions $\delta_2$ which constitute the remaining portion of the minute regions $\delta$, the minute regions $\delta_1$ include a raised portion protruding above the other surface, the raised portion having a height of d/2 relative to a predetermined reference plane parallel to the other surface, the minute regions $\delta_2$ include a recessed portion receding below the other surface, the recessed portion having a depth of d/2 relative to the predetermined reference plane, the predetermined reference plane is equidistant from the minute regions $\delta_1$ and the minute regions $\delta_2$ in terms of a direction perpendicular to the other surface, d is from 0.2 μm to 1.4 μm, and at least part of the raised portions and the recessed portions has a micro periodic structure that is formed by indentations and projections.

The second sheet of the present invention is a transparent sheet for use with a light emitting body with one of surfaces of the transparent sheet being adjacent to the light emitting body, wherein the other surface of the transparent sheet includes a plurality of minute regions $\delta$, a largest inscribed circle of the minute regions $\delta$ having a diameter from 0.2 μm to 1.5 μm, one of the minute regions $\delta$ being adjoined by and surrounded by some other ones of the minute regions $\delta$, respective ones of the plurality of minute regions $\delta$ include raised portions protruding above the other surface, the raised portions having random heights within a range of 0 to d/2 relative to a predetermined reference plane parallel to the other surface, or recessed portions receding below the other surface, the recessed portions having random depths within a range of 0 to d/2 relative to the predetermined reference plane, the predetermined reference plane is equidistant from a highest one of the minute regions $\delta$ and a lowest one of the minute regions $\delta$ in terms of a direction perpendicular to the other surface, d is from 0.2 μm to 1.4 μm, and at least part of the raised portions and the recessed portions has a micro periodic structure that is formed by indentations and projections.

The third sheet of the present invention is a transparent sheet for use with a light emitting body with one of surfaces of the transparent sheet being adjacent to the light emitting body, wherein the other surface of the transparent sheet includes a plurality of minute regions $\delta$, a largest inscribed circle of the minute regions $\delta$ having a diameter from 0.4 μm to 1.0 μm, one of the minute regions $\delta$ being adjoined by and surrounded by some other ones of the minute regions $\delta$, the plurality of minute regions $\delta$ include a plurality of minute regions $\delta_1$ and a plurality of remaining minute regions $\delta_2$, the minute regions $\delta_1$ and the minute regions $\delta_2$ are configured to produce a phase difference of 180° between part of light perpendicularly impinging on the one surface which is transmitted through the minute regions $\delta_1$ and another part of the light perpendicularly impinging on the one surface which is transmitted through the minute regions $\delta_2$, and at least part of respective ones of the minute regions $\delta_1$ and the minute regions $\delta_2$ has a micro periodic structure that is formed by indentations and projections.

In one embodiment, the minute regions $\delta$ are polygonal and congruent with one another.

In one embodiment, in the micro periodic structure, a bottom surface of each of the indentations and an upper surface of each of the projections have a rectangular shape with a width of A/2; in the micro periodic structure, a period A of the indentations or projections along a direction parallel to the other surface is from 0.1 μm to 0.2 μm; and a height h of the indentations or projections of the micro periodic structure is from 0.1 μm to 1.4 μm.

In one embodiment, in the micro periodic structure, the indentations and the projections have a conical shape; a period A of the conical indentations or projections along a direction parallel to the other surface is from 0.1 μm to 0.2 μm; and a height h of the conical indentations or projections is from 0.1 μm to 1.4 μm.

The first light emitting device is a light emitting device which includes a light emitting body and a transparent protection layer provided on a light emitting surface of the light emitting body, wherein the transparent protection layer has a surface which adjoins the light emitting surface and a surface opposite to the adjoining surface, the opposite surface including a plurality of minute regions δ, a largest inscribed circle of the minute regions δ having a diameter from 0.2 μm to 1.5 μm, one of the minute regions δ being adjoined by and surrounded by some other ones of the minute regions δ, the plurality of minute regions δ include a plurality of minute regions $\delta_1$ which are selected from the plurality of minute regions δ so as to constitute 40% to 98% of the minute regions δ and a plurality of minute regions $\delta_2$ which constitute the remaining portion of the minute regions δ, the minute regions $\delta_1$ include a raised portion protruding above the other surface, the raised portion having a height of d/2 relative to a predetermined reference plane parallel to the other surface, the minute regions $\delta_2$ include a recessed portion receding below the other surface, the recessed portion having a depth of d/2 relative to the predetermined reference plane, the predetermined reference plane is equidistant from the minute regions $\delta_1$ and the minute regions $\delta_2$ in terms of a direction perpendicular to the other surface, the light emitting body is configured to emit light whose center wavelength of an emission spectrum is λ, $\lambda/6(n_1-n_0)<d<\lambda/(n_1-n_0)$ holds where $n_1$ is a refractive index of the protection layer and $n_0$ is a refractive index of a medium with which the protection layer is in contact at the opposite surface, $n_0$ being smaller than $n_1$, and at least part of the raised portions and the recessed portions has a micro periodic structure that is formed by indentations and projections.

The second light emitting device is a light emitting device which includes a light emitting body and a transparent protection layer provided on a light emitting surface of the light emitting body, wherein the transparent protection layer has a surface which adjoins the light emitting surface and a surface opposite to the adjoining surface, the opposite surface including a plurality of minute regions δ, a largest inscribed circle of the minute regions δ having a diameter from 0.2 μm to 1.5 μm, one of the minute regions δ being adjoined by and surrounded by some other ones of the minute regions δ, respective ones of the plurality of minute regions δ include raised portions protruding above the other surface, the raised portions having heights within a range of 0 to d/2 relative to a predetermined reference plane parallel to the other surface, or recessed portions receding below the other surface, the recessed portions having depths within a range of 0 to d/2 relative to the predetermined reference plane, the predetermined reference plane is equidistant from a highest one of the minute regions δ and a lowest one of the minute regions δ in terms of a direction perpendicular to the other surface, the light emitting body is configured to emit light whose center wavelength of an emission spectrum is λ, $\lambda/6(n_1-n_0)<d<\lambda/(n_1-n_0)$ holds where $n_1$ is a refractive index of the protection layer and $n_0$ is a refractive index of a medium with which the protection layer is in contact at the opposite surface, $n_0$ being smaller than $n_1$, and at least part of the raised portions and the recessed portions has a micro periodic structure that is formed by indentations and projections.

The third light emitting device is a light emitting device which includes a light emitting body and a transparent protection layer provided on a light emitting surface of the light emitting body, wherein the transparent protection layer has a surface which adjoins the light emitting surface and a surface opposite to the adjoining surface, the opposite surface including a plurality of minute regions δ, a largest inscribed circle of the minute regions δ having a diameter from 0.4 μm to 1.0 μm, one of the minute regions δ being adjoined by and surrounded by some other ones of the minute regions δ, the plurality of minute regions δ include a plurality of minute regions $\delta_1$ and a plurality of remaining minute regions $\delta_2$, the minute regions $\delta_1$ and the minute regions $\delta_2$ are configured to produce a phase difference of 180° between part of light perpendicularly impinging on the one surface which is transmitted through the minute regions $\delta_1$ and another part of the light perpendicularly impinging on the one surface which is transmitted through the minute regions $\delta_2$, and at least part of respective ones of the minute regions δ1 and the minute regions δ2 has a micro periodic structure that is formed by indentations and projections.

In one embodiment, the medium is air.

In one embodiment, the medium is aerogel.

In one embodiment, $n_2-n_1<0.1$ holds where $n_2$ is a refractive index of part of the light emitting body from which light is radiated.

In one embodiment, in the micro periodic structure, a bottom surface of each of the indentations and an upper surface of each of the projections have a rectangular shape with a width of A/2; in the micro periodic structure, a period A of the indentations or projections along a direction parallel to the other surface is from 0.1 μm to 0.2 μm; and a height h of the indentations or projections of the micro periodic structure is from 0.1 μm to 1.4 μm.

In one embodiment, in the micro periodic structure, the indentations and the projections have a conical shape; a period A of the conical indentations or projections across a plane parallel to the opposite surface is from 0.1 μm to 0.2 μm; and a height h of the conical indentations or projections is from 0.1 μm to 1.4 μm.

Advantageous Effects of Invention

With the above solutions, extraction of light rays whose incidence angles are greater than the critical angle can be repeatedly realized, so that the light extraction efficiency can be greatly improved. Moreover, diffraction caused by the random structure leads to elimination of regularity in diffraction direction, so that ambient light reflection as well as variation in light intensity distribution and color imbalance which would otherwise occur depending on the direction can be prevented. Also, decrease in contrast due to components scattered by reflection (so-called "poor black state") can be prevented.

BRIEF DESCRIPTION OF DRAWINGS

FIG. 4(a) shows a cross section of a light emitting device which includes a diffraction grating having a periodic structure at an interface. FIG. 4(b) is the top view of the structure of FIG. 4(a).

FIG. 5 illustrates the direction of diffraction caused by a diffraction grating.

FIG. 6(a) shows a cross section of a light emitting device which has protrusions randomly arranged on the surface. FIG. 6(b) is a top view of the structure of FIG. 6(a).

FIG. 8(a) shows an arrangement of a pinhole. FIG. 8(b) shows an arrangement of phase shifters.

FIG. 9 illustrates the transmittance over the incidence angle at the refracting surface over which 180°-phase shifters are randomly arranged.

FIG. 12 shows a cross-sectional structure of an organic electroluminescence element of the first embodiment and propagation of light.

FIG. 13(a) is an enlarged view showing part of the surface structure of the first embodiment. FIG. 13(b) is a pattern diagram which covers a broader area.

FIG. 16 illustrates the incidence angle dependence of transmittance t of the surface structure of the first embodiment. FIG. 16(a) is a diagram showing the incidence angle dependence of the transmittance in the first light extraction. FIG. 16(b) is a diagram showing the incidence angle dependence of the transmittance in the second light extraction.

FIG. 18 illustrates the incidence angle dependence of the amount of extracted light via the surface structure of the first embodiment. FIG. 18(a) is a diagram showing the incidence angle dependence of the amount of extracted light in the first light extraction. FIG. 18(b) is a diagram showing the incidence angle dependence of the amount of extracted light in the second light extraction.

FIGS. 19(a) and 19(b) are diagrams which illustrate the light extraction efficiencies of the surface structure of the first embodiment.

FIG. 22(a) illustrates the light extraction efficiency of the surface structure of the second embodiment. FIG. 22(b) illustrates the light extraction efficiency of the surface structure of the third embodiment.

FIGS. 26(a) and 26(b) are a cross-sectional view and a top view of a light emitting device 107 of the eighth embodiment.

FIG. 31(a) shows an analysis result of the angle dependence of the transmittance t. FIG. 31(b) shows the light extraction efficiencies of the three models.

FIGS. 32(a) and 32(b) show a cross-sectional structure of an organic electroluminescence element of another embodiment and propagation of light.

FIG. 33 is a pattern diagram illustrating a checker-pattern surface structure.

FIG. 34 illustrates the incidence angle dependence of the transmittance t of the surface structure shown in FIG. 33.

FIGS. 35(a) and 35(b) illustrate the viewing angle dependence of light which is emitted from the checker-pattern surface structure.

FIGS. 36(a) to 36(c) illustrate how to randomly arrange protrusions.

DESCRIPTION OF EMBODIMENTS

Before the descriptions of embodiments of the present invention, the research history prior to the creation of the concept of the present invention is described with considerations for the prior art examples such as disclosed in, for example, Patent Document 1 and Patent Document 2.

Figure 3:
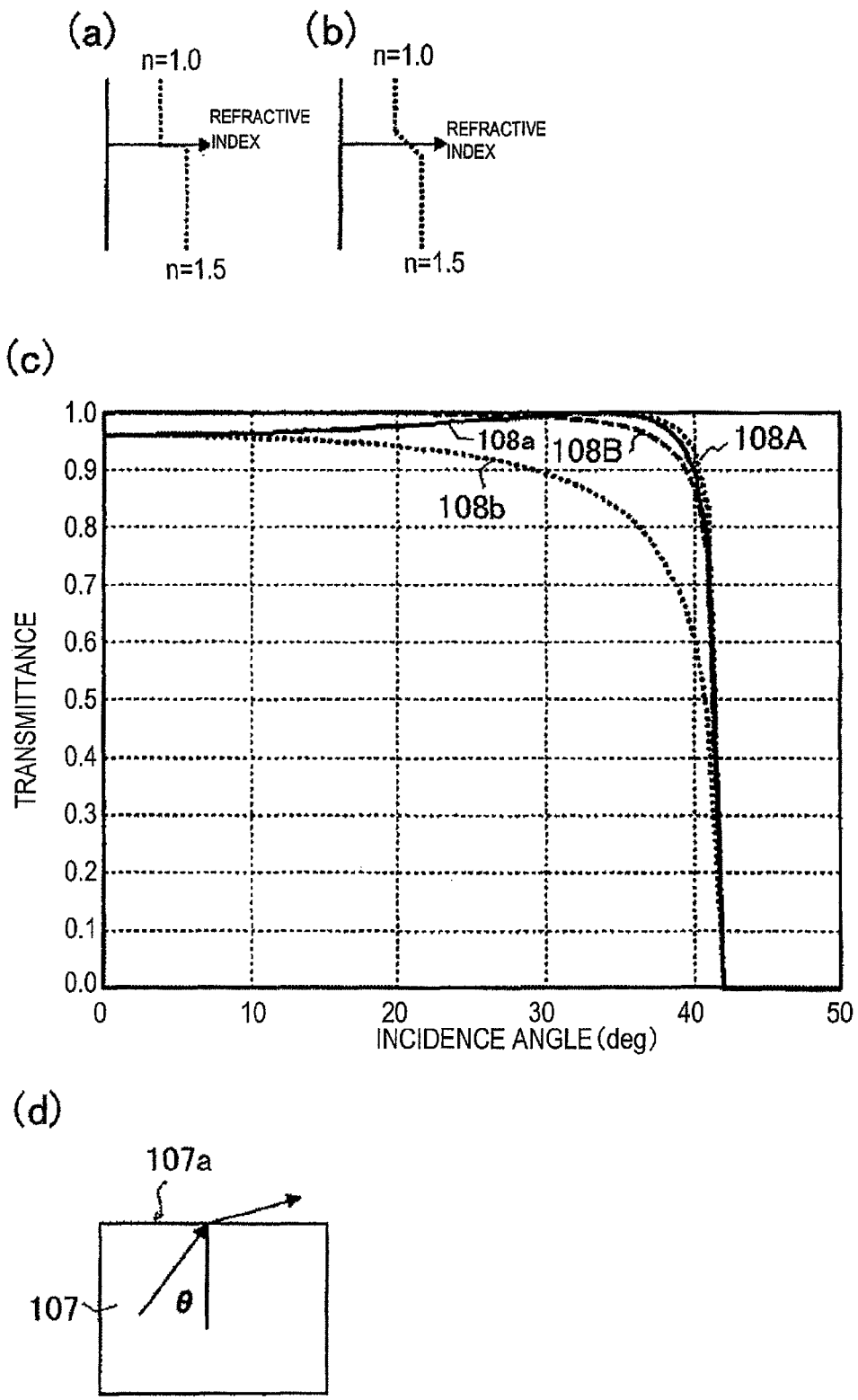
FIG. 3(a) shows a step wise change of the refractive index.
FIG. 3(b) shows a moderate change of the refractive index.
FIG. 3(c) illustrates the relationship between the incidence angle at a refracting surface and the transmittance.
FIG. 3(d) shows the refracting surface.

FIG. 3 illustrates the transmittance at a refracting surface (the interface between a transparent layer surface and an air layer). Now, consider a light ray traveling from the inside of the transparent layer 107 with the refractive index of 1.5 along a sheet direction and impinging on a refracting surface 107a of the transparent layer 107 at an incidence angle θ so that the light ray undergoes refraction toward the air layer (refractive index: 1.0). Here, the transmittance of this light ray relates to the polarization of the light. Usually, the refractive index distribution along the normal to the refracting surface 107a in the vicinity of the refracting surface 107a has a stepped shape as shown in FIG. 3(a). Therefore, the P-polarization (an oscillation component whose electric field vector is parallel to the sheet of the drawing) exhibits a transmittance characteristic represented by the curve 108a, and the S-polarization (an oscillation component whose electric field vector is perpendicular to the sheet of the drawing) exhibits a transmittance characteristic represented by the curve 108b. They exhibit different behaviors when the incidence angle is not more than the critical angle (=41.8°) but become zero as the incidence angle exceeds the critical angle.

On the other hand, assuming that the outermost part of the transparent layer 107 has a multilayer structure so that the refractive index distribution has a tapered shape as shown in FIG. 3(b), the P-polarization exhibits a transmittance characteristic represented by the curve 108A, and the S-polarization exhibits a transmittance characteristic represented by the curve 108B. Although both of them become zero as the critical angle is exceeded, the transmittance becomes closer to 100% when the incidence angle is equal to or smaller than the critical angle, so that the distribution approaches to the shape of a step function with the border occurring at the critical angle. In the example of FIG. 3(b), the calculation is based on the assumption that the structure has a multilayer structure of 50 stacked layers each having the thickness of 0.01 μm, with the refractive index varying from 1.5 to 1.0 with the intervals of 0.01. The difference between the P-polarization and the S-polarization decreases as the ramp of the change of the refractive index along the thickness direction is more moderate so that, as a result, as for the both polarizations, the graph of the transmittance relative to the incidence angle approaches to a step function.

To prevent total reflection, it is necessary to provide any means of controlling the incidence angle of light that is incident on the refracting surface so as to be equal to or smaller than the critical angle. We consulted Patent Document 1 for an example of such means and studied a light emitting device that uses an organic EL element shown in FIG. 4, in which a diffraction grating 209 is provided at the interface between a transparent substrate 205 and a transparent electrode 204.

As shown in FIG. 4(a), an electrode 202, a light emitting layer 203, a transparent electrode 204, and a diffraction grating layer 209 are staked on a substrate 201 in this order, and a transparent substrate 205 is provided on the diffraction grating layer 209. The diffraction grating layer 209 has a periodic structure of raised portions and recessed portions with the pitch of Λ in both x-direction and y-direction, at its border with the transparent substrate 205. The shape of the raised portion may be a right square with width w as shown in FIG. 4(b). The raised portions having such a shape are in a matrix-lattice arrangement. Application of a voltage between the electrode 202 and the transparent electrode 204 causes radiation of light from the point S in the light emitting layer 203. This light enters the transparent electrode 204 directly or after being reflected by the electrode 202 and is transmitted therethrough. The light is then transmitted through the diffraction grating layer 209 so that it undergoes diffraction. For example, assuming that a light ray 210a emitted from the point S travels straight without being diffracted by the diffraction grating layer 209, the light ray would impinge on a refracting surface 205a of the transparent substrate 205 at an incidence angle equal to or greater than the critical angle and be totally reflected by the refracting surface 205a as represented as a light ray 210b. However, in actuality, the light ray is diffracted by the diffraction grating layer 209 so that the incidence angle of the light ray on the refracting surface 205a is smaller than the critical angle as represented as a light ray 210c. Therefore, the light ray can be transmitted through the refracting surface 205a.

The direction of diffraction of light by the above-described diffraction grating is described with reference to FIG. 5. Now, consider a light ray traveling from the inside of a transparent layer 207 of refractive index $n_A$ along the sheet direction and impinging on a refracting surface 207a of the transparent layer 207 at the point O at the incidence angle θ so that the light ray is diffracted toward a transparent layer 206 of refractive index $n_B$. The refracting surface 207a is provided with a diffraction grating of pitch Λ along the surface of the sheet of the drawing. A circle 211 around the point O at the center with radius $n_A$ and a circle 212 around the point O at the center with radius $n_B$ are drawn. Here, a vector originating from a point on the circle 211 and directed to the point O at angle θ is referred to as incidence vector 210i, and the orthogonal projection vector of the incidence vector 210i onto the refracting surface 207a (a vector extending from the foot of the perpendicular A to the point O) is denoted by 210I. A vector 210r originating from the point O and terminating at a point on the circle 212 is drawn such that the orthogonal projection vector 210R of the vector 210r is identical with the vector 210I. Now consider a vector (grating vector) originating from the foot of the perpendicular C and having largeness qλ/Λ. Here, q denotes the order of diffraction (integer). The drawing shows a vector 210D for q=1. A vector 210d originating from the point O and terminating at a point on the circle 212 is also drawn such that the terminal B of the vector 210D is coincident with the foot of the perpendicular of the vector 210d. Considering how to draw the vectors, the directional angle φ of the vector 210r (the angle between the vector 210r and the normal to the refracting surface) is expressed as follows:

$$n_B \times \sin\phi = n_A \times \sin\theta \quad \text{(Formula 4)}$$

This exactly represents the Snell's law. On the other hand, the directional angle φ' of the vector 210d that represents the direction of the diffracted light ray (the angle between the vector 210d and the normal to the refracting surface) is expressed as follows:

$$n_B \times \sin\phi' = n_A \times \sin\theta - q\lambda/\Lambda \quad \text{(Formula 5)}$$

In the example of FIG. 5, the angle φ' is defined by a negative value because it passes across the z-axis (a normal to the refracting surface which passes through the point O).

Thus, the diffracted light ray has a direction deviated from the refracted light ray by qλ/Λ. In FIG. 4, the light ray 210b that is assumed as not undergoing diffraction is equivalent to a refracted light ray, and the light ray 210c that is assumed as undergoing diffraction has a direction deviated from the light ray 210b by qλ/Λ so that it does not undergo total reflection at the refracting surface 205a. Therefore, a light ray which would otherwise have been totally reflected can be extracted, so that the improvement of the light extraction efficiency may be expected as compared with an organic EL light emitting device which does not include a diffraction grating layer.

However, when considering a light ray 210A emitted from the point S in FIG. 4(a) on the assumption that the light ray 210A travels straight without undergoing diffraction by the diffraction grating layer 209, the light ray 210A would impinge on the refracting surface 205a of the transparent substrate 205 at an incidence angle equal to or smaller than the critical angle and be refracted by the refracting surface 205a while being transmitted therethrough as represented as a light ray 210B. However, in actuality, it is diffracted by the diffraction grating layer 209, and therefore, the incidence angle of the light on the refracting surface 205a is greater than the critical angle as represented as a light ray 210C, so that the light impinges on the refracting surface 205a at an incidence angle equal to or greater than the critical angle and is totally reflected. Thus, providing the diffraction grating layer 209 does not necessarily ensure the improvement of the light extraction efficiency.

In a light emitting device which includes the organic EL element shown in FIG. 4, diffracted light rays whose directions are equally shifted by qλ/Λ are derived from every one of the light rays. The light including such diffracted light rays has a light intensity distribution which varies depending on the direction, and the shift width qλ/Λ depends on the wavelength λ of emitted light. Therefore, color imbalance occurs depending on the direction in which the light is emitted. Specifically, the color of perceived light differs depending on the viewing direction. Thus, such a device is not suitable to display applications, as a matter of course, and is also not suitable to light sources.

Next, we consulted Patent Document 2 and studied a light emitting device that uses an organic EL element shown in FIG. 6, in which protrusions 315 are provided on the surface of a transparent substrate 305. As shown in FIG. 6(a), an electrode 302, a light emitting layer 303, a transparent electrode 304, and a transparent substrate 305 are staked on a substrate 301 in this order, and a plurality of protrusions 315 are provided on the surface 305a of the transparent substrate 305. Each of the protrusions 315 is in the shape of a quadrangular prism of width w and height h. The protrusions 315 having such a shape are placed at random positions over the transparent substrate surface 305a as shown in FIG. 6(b). Here, w is in the range of 0.4 μm to 20 μm, and h is in the range of 0.4 μm to 10 μm. Such protrusions 315 are provided in the density of 5000 to 1000000 protrusions/mm². Application of a voltage between the electrode 302 and the transparent electrode 304 causes radiation of light at the point S in the light emitting layer 303. A radiated light ray 310d enters the transparent electrode 304 directly or after being reflected by the electrode 302 and is transmitted therethrough. Part of the transmitted light is extracted outside via the protrusions 315 as represented as a light ray 310f. The actual protrusions 315 can be processed by means of side etching so as to be tapered to the tip end and, even without the side etching, the effective refractive index falls on a value around the midpoint between the transparent substrate 305 and the air layer, so that the refractive index distribution can be changed constantly and moderately. Therefore, the refractive index distribution approaches to one that is shown in FIG. 3(b), and hence, reflection of light by the protrusions 315, which is denoted by 310e, can be partially prevented. As a result, the light extraction efficiency can be improved. Even when the size of the protrusions 315 is equal to or greater than the wavelength, the interference of emitted light rays can be prevented because the protrusions 315 are in a random arrangement.

However, when considering that, in a light emitting device which has the structure shown in FIG. 6, the effect of the protrusions resides in antireflection as suggested in Patent Document 2, it is seen from the comparison between the curves 108a and 108b and the curves 108A and 108B of FIG. 3(c) that the improvement in transmittance is achieved only for the light rays that are incident at angles equal to or smaller than the critical angle, and the improvement of the light extraction efficiency is only 10% to 20%, in which a great improvement cannot be expected.

After the above studies, the present inventors continued to examine how to decrease the amount of total reflection by the refracting surface and how to increase the amount of light which can be extracted. At the beginning of the continued examination, we studied the boundary conditions of light at the refracting surface.

Figure 7:
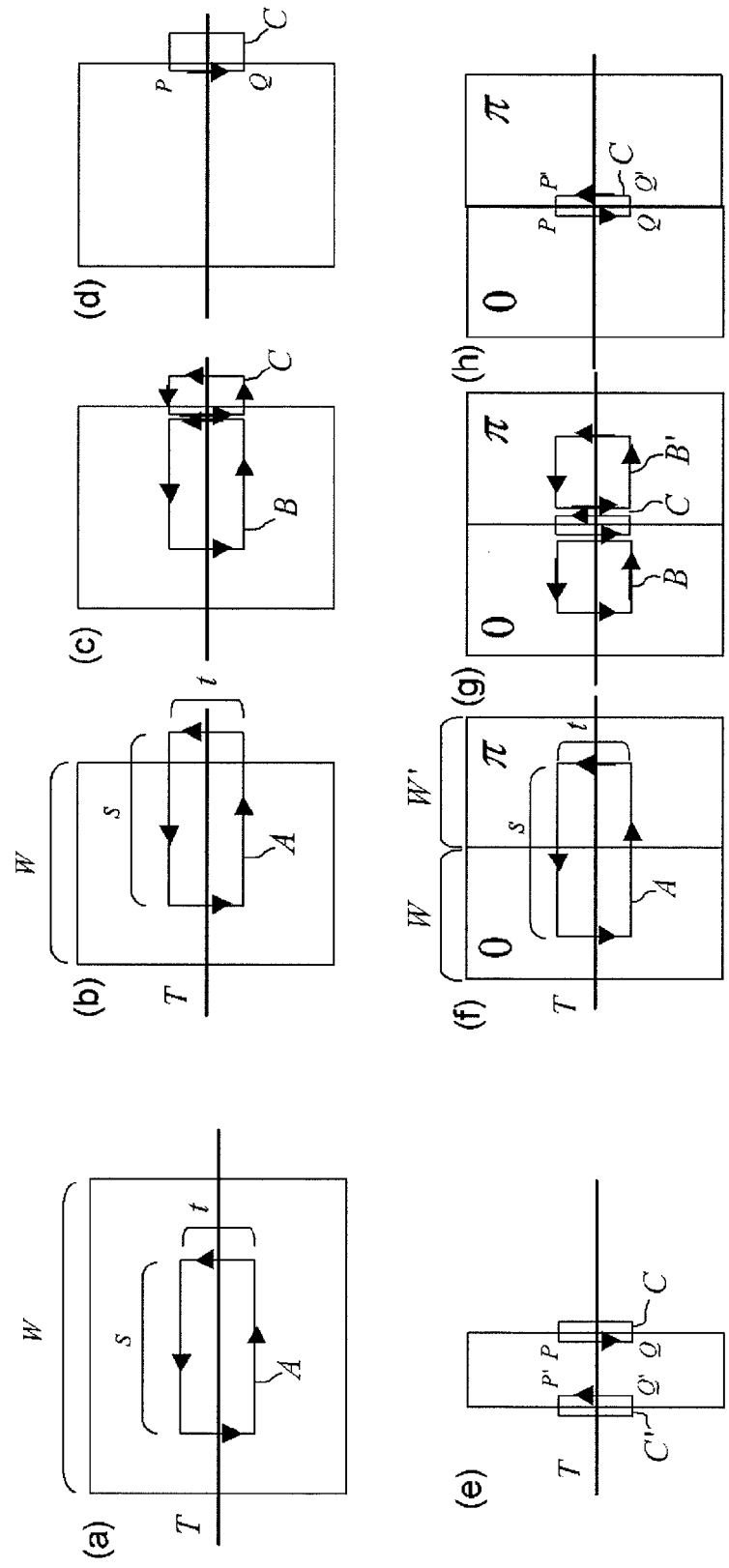
FIGS. 7(a) to 7(h) illustrate the boundary conditions of a field of light at a refracting surface.

FIG. 7 schematically illustrates the boundary conditions of a field of light at the refracting surface, in which a light beam of width W impinging on the refracting surface T is considered. According to the Maxwell equations, the integral of an electric field vector or a magnetic field vector along a closed path A that is traced so as to traverse the refracting surface T is zero. Note that the premises assumed herein are that there is not a charge or a light source in an area inside the closed path and that the intensity and phase of the electric or magnetic field vector along the refracting surface T are continuous.

When width W is sufficiently large as shown in FIG. 7(a), width t that is perpendicular to the refracting surface can be negligibly small as compared with width s that is taken along the refracting surface. Of the contour integral, only components along the refracting surface are remaining. This relationship requires that the electric or magnetic field vector is continuous so as to extend through the refracting surface. One that is derived by utilizing this continuity relationship is the Fresnel's formula, by which the laws of reflection and refraction, the phenomenon of total reflection, etc., are completely elucidated.

As shown in FIG. 7(b), when the width W of the light is several ten times smaller than the wavelength, the width t is nonnegligible. Here, when the contour integral A is divided into B and C (see FIG. 7(c)), the contour integral B is included in the light beam and is therefore zero. As for the remaining contour integral C, the electric or magnetic field vector outside the light beam is zero, so that only the integral value of the path PQ that is within the light beam is remaining (see FIG. 7(d)). Therefore, the contour integral C is not zero so that, by calculation, it is equivalent to a condition where light is radiated inside the closed path. When the width W of the light beam is as small as about 1/10 of the wavelength, the contour integrals C and C' become closer to each other as shown in FIG. 7(e) so that the paths PQ and Q'P' overlap with each other. Accordingly, the contour integral of C plus C' is zero, so that light cannot be radiated within the closed path.

On the other hand, on the assumption that light beams between which the phase difference is π occur side by side along the refracting surface as shown in FIG. 7(f), the contour integral A which extends over these light beams is now considered. In this case also, when the width W of the light is several ten times smaller than the wavelength, the width t is nonnegligible. Here, when the contour integral A is divided into B, C, and B' (see FIG. 7(g)), the contour integrals B and B' are included in the light beams so that they are zero. As for the remaining contour integral C, the components along the refracting surface are negligible, so that only the integral value of the paths PQ and Q'P' that extend along the boundary between the two light beams is remaining (see FIG. 7(h)). Since the integral along the path Q'P' in a field in which the phase of the light beam is π is equal to the integral along the path P'Q' of a field in which the phase of the light beam is 0, the contour integral C is twice the integral along the path PQ so that, by calculation, it is equivalent to a condition where light is radiated inside the closed path. Therefore, not only in the case of a narrow light beam but also in the case where light beams in different phases occur side by side with a narrow gap therebetween, light occurs near the boundary of the width. (This phenomenon is not actual emission of light but behavior of light which is effectively equivalent to emission of light. This is similar to a phenomenon called "boundary diffraction" by Young prior to the establishment of the diffraction theory, and is therefore referred to as a "boundary diffraction effect.")

If radiation of light occurs on the refracting surface T, the light would propagate through both media on the opposite sides of the refracting surface irrespective of the incidence conditions on the refracting surface T. That is, even in the case of a light ray that is incident at an angle equal to or greater than the critical angle, it is estimated that transmitted light rays would occur without being totally reflected so long as the structure is configured by calculation such that radiation of light occurs on the refracting surface. Based on the results of such examinations, the present inventors studied the structure of the refracting surface, as will be described below, with the view of actually producing a phenomenon that light is transmitted through the refracting surface even when the incidence angle of the light on the refracting surface exceeds the critical angle.

Two examples are shown in FIG. 8, in which a large boundary diffraction effect is obtained. (a) A pinhole is provided at the boundary between a transparent substrate placed on a light emitting body and the air layer while light is blocked in the other area so that pinhole light is obtained (light exists only in a white square box). (b) 180°-phase shifters 18 are arranged at random in the boxes of a chessboard-like grid, each box having width w. First, the pinhole example was examined, but actual light extraction via the pinhole could not be achieved. The example of phase shifters in a random arrangement was examined which was expected to achieve an equal light extraction characteristic to that of the pinhole.

FIG. 9 illustrates the incidence angle dependence of the transmittance t at the refracting surface in the structure shown in FIG. 8. Here, a light beam at the wavelength of 0.635 μm, the light amount of which is 1 in a transparent substrate with the refractive index of 1.457, impinges on the boundary between the transparent substrate and the air layer at the incidence angle θ (the angle between the light beam and the normal to the refracting surface). The curves show how much of the light impinging on the refracting surface for the first time is emitted into the air, with the parameter of width w (w=0.1, 0.2, 0.4, 0.6, 0.8, 1.0, 2.0, 4.0, 20.0 (μm)). (The 180°-phase shifters 18 are used instead because the pinhole light and the 180°-phase shifters exhibit exactly equal characteristics.) As for the characteristic for w=20 μm which is approximate to that obtained in the conditions of FIG. 7(a), the transmittance is approximately zero when the critical angle (43.34°) is exceeded. When w decreases to 0.4 to 1.0 μm, the transmittance is large even when the critical angle is exceeded, due to the boundary diffraction effect which has been described with reference to FIGS. 7(d) and 7(h). When w is further decreased (w=0.1 μm, 0.2 μm), the transmittance becomes closer to 0 at every incidence angle as described with reference to FIG. 7(e). Note that the analysis result of FIG. 9 is based on the Helmholtz's wave equation (so called "scalar wave equation"), and therefore, no difference occurs between the P-polarization and the S-polarization.)

Figure 10:
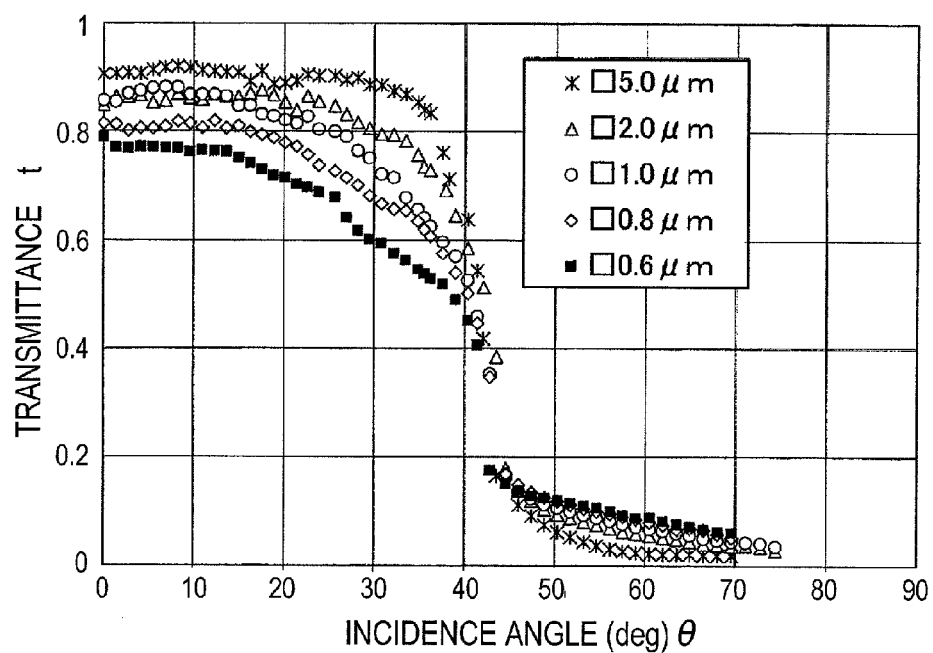
FIG. 10 is an experimental explanation diagram which illustrates the transmittance over the incidence angle at the refracting surface over which 180°-phase shifters are randomly arranged.
Figure 11:
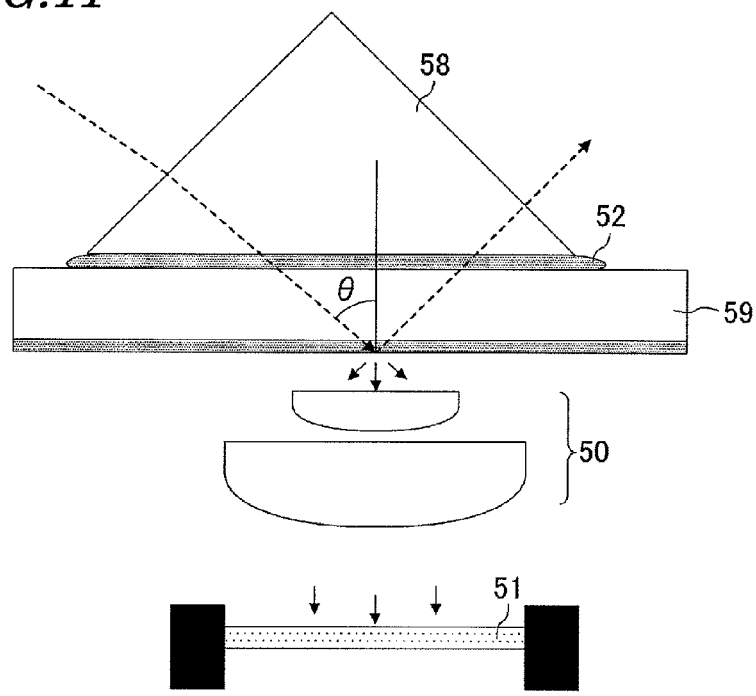
FIG. 11 shows the structure of an experimental apparatus for measuring the transmittance relative to the incidence angle.

FIG. 10 shows the experimental results which illustrate the incidence angle dependence of the transmittance t of incident P-polarization for the first time. Since fabrication of minute phase shifters 18 is difficult in actual manufacturing, a mask in which portions of phase 0° transmit light while portions of phase 180° are covered with a light blocking film (Cr film) is used instead in experiments. (The mask is formed by randomly arranging light blocking films in the boxes of a chessboard-like grid, each box having width w. This mask is equivalent to a random arrangement of pinhole light spots). In the actually fabricated mask patterns, width w was 0.6 μm, 0.8 μm, 1.0 μm, 2.0 μm, and 5.0 μm. The apparatus used in the experiments was composed of a semiconductor laser (wavelength: 0.635 μm), a triangular prism 58 (BK7), a mask substrate 59 (synthetic quartz, refractive index: 1.457, with a mask pattern formed on the back surface), a light collecting lens system 50, and a photodetector 51 as shown in FIG. 11. The triangular prism was tightly placed on the surface of the mask substrate with the intervention of a matching solution 52 of refractive index 1.51. A laser light beam was provided from the triangular prism side while the directional angle was measured, and transmitted light leaking from the back surface side was collected by the light collecting lens system 50. The amount of the transmitted light was measured by the photodetector 51. In the case of the mask, the light was blocked by the light blocking film portions which are equal to ½ of the total area, and as such, the amount of the transmitted light was ½ of that transmitted when the phase shifters were used. Thus, the transmittance t was normalized with the amount of light impinging on the portions that are not provided with a light blocking film (½ of the total light amount). The experimental results exhibit a good agreement with the analysis results shown in FIG. 9. It is understood that the transmittance is large even when the critical angle (43.34°) is exceeded, and that this tendency grows as w becomes smaller.

Based on the above results, the present inventors continued studies to finally arrive at a novel light emitting device in which total reflection is prevented so that the light extraction efficiency can be greatly improved.

Hereinafter, embodiments of the present invention will be described in detail with reference to the drawings. In the drawings that will be referred to in the following sections, components that have substantially the same functions are denoted by the same reference numerals for the sake of simplicity of description.

First Embodiment

The first embodiment is described with reference to FIGS. 12 and 20.

FIG. 12 shows a cross-sectional structure of a light emitting device which includes an organic EL element according to the first embodiment and propagation of light. An electrode 2, a light emitting layer 3, a transparent electrode 4 are stacked on a substrate 1 in this order, and a transparent substrate (transparent protection layer) 5 is provided on the transparent electrode 4. The substrate 1, the electrode 2, the light emitting layer 3, and the transparent electrode 4 constitute a light emitting body. A surface of the transparent substrate 5 is provided with a surface structure 13 which is divided into minute regions and which has fine recessed and raised portions.

Application of a voltage between the electrode 2 and the transparent electrode 4 causes radiation of light at the point S in the light emitting layer 3. This light enters the transparent electrode 4 directly or after being reflected by the electrode 2 and is transmitted therethrough. The transmitted light impinges on the surface structure 13 of the surface of the transparent substrate 5 at point P at the incidence angle θ relative to the normal to the surface. At this point, the light is diffracted by the surface structure 13 to be emitted into the air layer 6.

Total reflection must occur when the incidence angle θ is greater than the critical angle $\theta c = \sin^{-1}(n_0/n_1)$ where $n_0$ is the refractive index of the air layer 6 and $n_1$ is the refractive index of the transparent substrate 5. However, there is the surface structure 13 in the surface of the transparent substrate 5, and therefore, light impinging on point Q at an incidence angle equal to or greater than the critical angle $\theta_c$ is diffracted without being totally reflected, so that the diffracted light is emitted into the air layer 6 (first light extraction). Note that, at point Q, part of the light is reflected. The reflected component is then reflected by the electrode 2 and again impinges on the surface structure 13 at point R. Part of the light impinging on the surface structure 13 at point R is emitted into the air layer 6 (second light extraction) while the remaining part of the light is reflected. This process is repeated endlessly.

Now, consider a light emitting device which includes a conventional organic EL element that does not have the surface structure 13. Light transmitted through the transparent substrate and impinging on the interface between the transparent substrate and the air layer at an incidence angle equal to or greater than the critical angle is totally reflected. Even if the totally reflected light is then reflected by the electrode, the light reflected by the electrode impinges on the interface between the transparent substrate and the air layer again at an incidence angle equal to or greater than the critical angle, so that the second and subsequent light extractions do not occur. In this point, the example considered herein is different from the present embodiment.

Hereinafter, the surface structure 13, which is a feature of the present embodiment, is described in detail.

Figure 2:
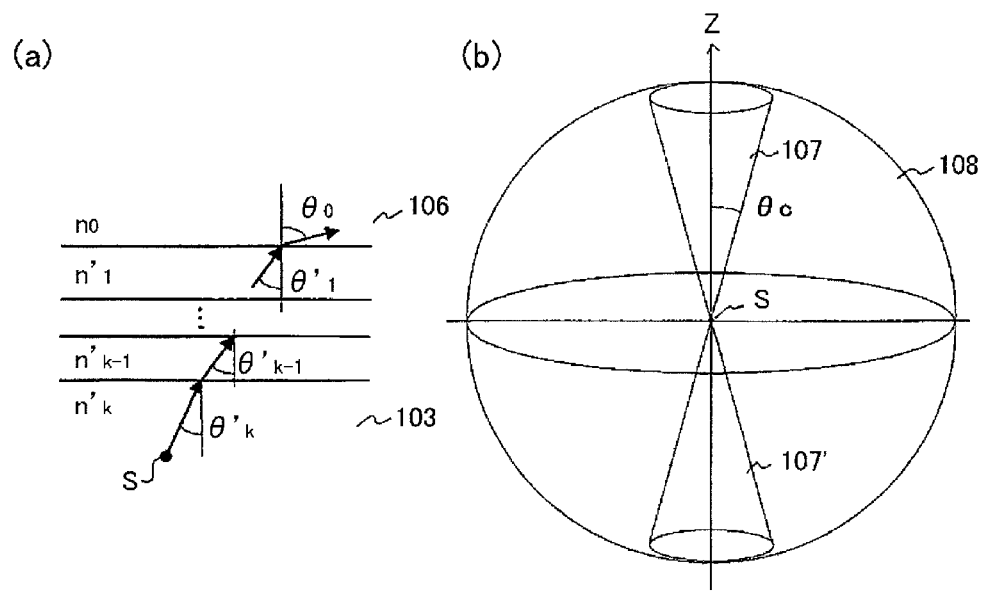
FIG. 2(a) shows a transparent substrate which has a multilayer structure.
FIG. 2(b) is a diagram illustrating the range of light which can be extracted.

FIG. 13 shows a pattern diagram of the surface structure 13 of the first embodiment. The left part of FIG. 13(a) is a top view, and the right part is a cross-sectional view taken along line A-A of the top view. As shown in FIG. 2(a), the surface structure 13 is formed by dividing the surface of the transparent substrate 5 into square boxes of a chessboard-like grid (square minute regions $\delta$) without leaving any gap therebetween such that each box has width w (referred to as "boundary width"), and randomly allocating raised portions (which are denoted by "13a" in the drawing (minute regions $\delta_1$), dotted boxes) or recessed portions which are defined relative to the raised portions (which are denoted by "13b" in the drawing (minute regions $\delta_2$), white boxes) to respective ones of the boxes (minute regions 5) such that the proportion of the raised portions or recessed portions is 50%. FIG. 13(b) shows an example where w=0.4 μm (black boxes correspond to the raised portions, and white boxes correspond to the recessed portions). The height of the raised portions from the bottom of the recessed portions is d. Specifically, one of the minute regions $\delta$ is adjoined by and surrounded by some other ones of the minute regions $\delta$. The minute regions $\delta_1$ protrude above the surface of the transparent substrate 5 to a level higher than the minute regions $\delta_2$. Considering that there is a reference plane which is parallel to the surface of the transparent substrate 5 and which is equidistant from the minute regions $\delta_1$ and the minute regions $\delta_2$ in terms of a direction perpendicular to the surface of the transparent substrate 5, the minute regions $\delta_1$ are protruding above the reference plane by d/2, and the minute regions $\delta_2$ are receding below the reference plane by d/2. This can be explained in a different way. Consider that a surface of the transparent substrate 5 at its border with the air 6 has a plurality of recesses (white boxes) while the other portions of the surface than the recesses are coplanar, and the depths of the recesses are substantially equal to d, the bottom surfaces of the recesses being referred to as the first reference plane. In this case, the first reference plane includes a plurality of divisional minute regions $\delta$ having equal areas, each of which is 1.5×1.5 μm² or smaller. The shape of the bottom surface of the recess is identical with a shape of two or more minute regions $\delta$ joined together or a shape of only one minute region $\delta$. The recesses are randomly arranged over the first reference plane. Note that the first reference plane is different from the above-described reference plane.

The formation of the surface structure 13 may be realized by preparing a mold which has recessed portions and raised portions formed by means of etching, transferring the shape of the mold to a resin sheet by pressing, and attaching the resultant sheet onto the transparent electrode 4 with the intervention of the transparent substrate 5 which functions as an adhesive layer. In this case, the transparent substrate 5 is a transparent sheet. Alternatively, the surface structure 13 may be realized by directly forming recessed portions and raised portions by means of etching or the like in a surface of a sheet or in the surface of the transparent substrate 5 which has been formed as a protection layer.

Figure 14:
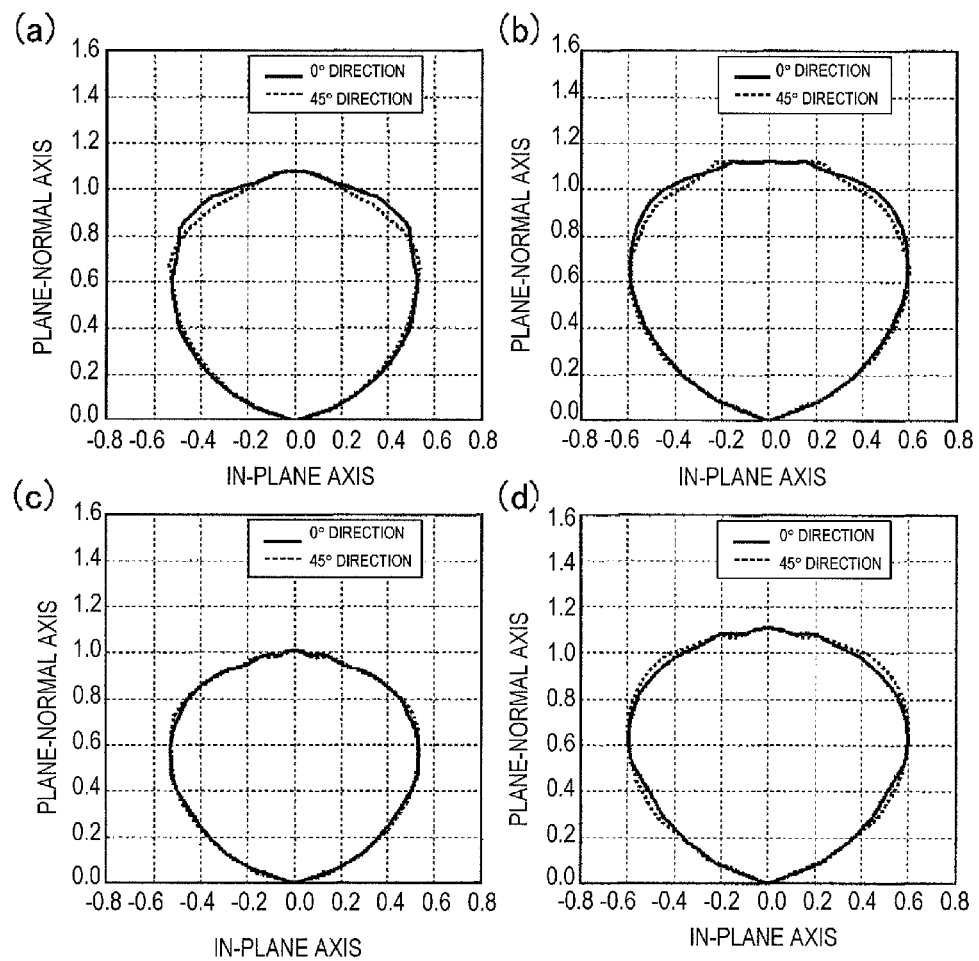
FIGS. 14(a) to 14(d) illustrate the viewing angle dependence of light which is emitted from the surface structure of the first embodiment.
Figure 15:
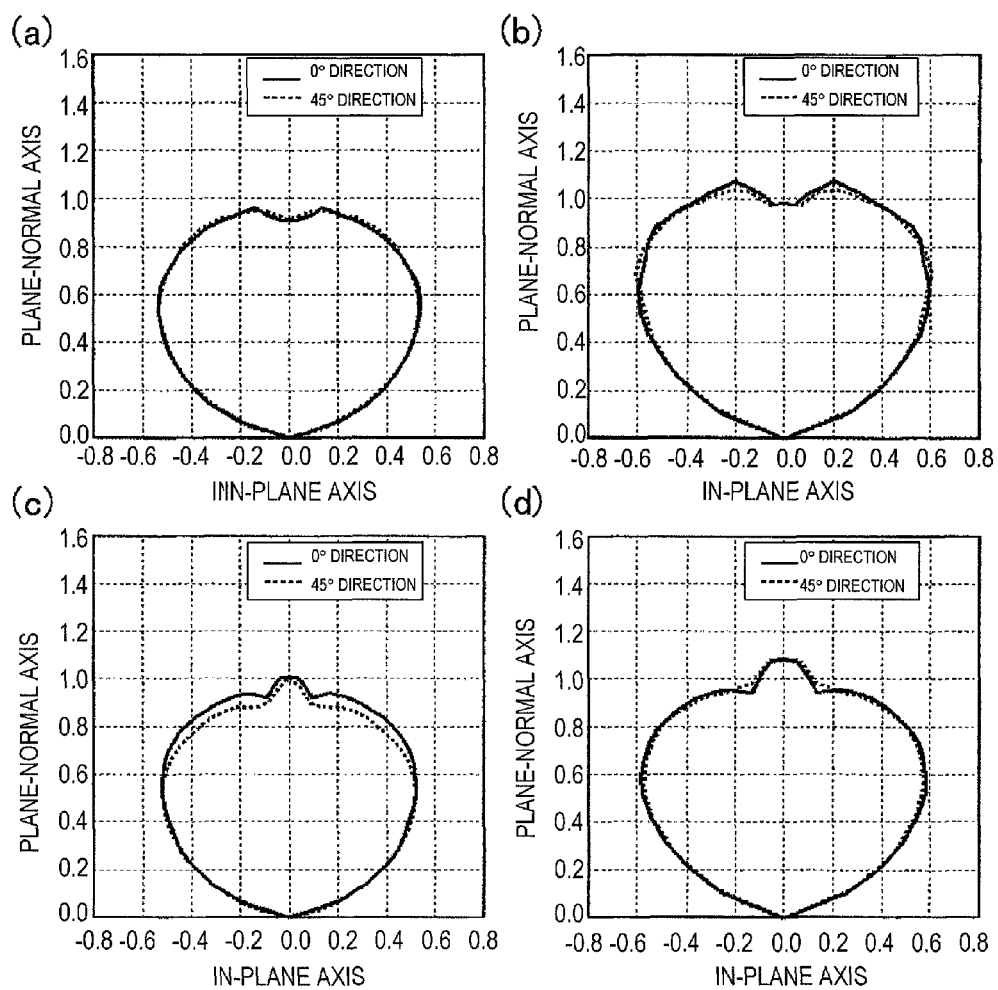
FIGS. 15(a) to 15(d) illustrate the viewing angle dependence of light which is emitted from the surface structure of the first embodiment.

Light diffracted by such a random pattern has random propagation directions. Therefore, variation in light intensity distribution and color imbalance which would occur depending on the direction in the light emitting device described in Patent Document 1 would not occur in the present embodiment. Light incoming from the external environment (air layer side) is reflected by the surface structure 13 formed in the surface of the transparent substrate 5. This reflected light is diffracted in random directions, so that an ambient image is not reflected in the surface. Therefore, an optical treatment, such as an antireflection film or the like, is not necessary and, accordingly, the manufacturing cost can be decreased. FIG. 14 and FIG. 15 show the results of analysis of the viewing angle dependence of the light which is extracted from, i.e., emitted from the surface structure of the first embodiment in the first light extraction (first extracted light). Here, the height difference is d=0.7 μm, and the wavelength $\lambda$ and the boundary width w are parameters. In FIG. 14(a), these parameters are $\lambda$=0.450 μm and w=0.5 μm; in FIG. 14(b), $\lambda$=0.635 μm and w=0.5 μm; in FIG. 14(c), $\lambda$=0.450 μm and w=1.0 μm; in FIG. 14(d), $\lambda$=0.635 μm and w=1.0 μm; in FIG. 15(a), $\lambda$=0.450 μm and w=1.5 μm; in FIG. 15(b), $\lambda$=0.635 μm and w=1.5 μm; in FIG. 15(c), $\lambda$=0.450 μm and w=2.0 μm; and in FIG. 15(d), $\lambda$=0.635 μm and w=2.0 μm. A vector extending from the origin to a point on the curve represents the light intensity and the emission direction of emitted light. The length of the vector corresponds to the light intensity, and the direction of the vector corresponds to the emission direction. The vertical axis corresponds to the direction of an axis normal to the plane (plane-normal axis), and the horizontal axis corresponds to the direction of an axis in the plan (in-plane axis). The solid line represents the characteristic in a cross section in which the in-plane axis extends along the x-axis or y-axis of FIG. 13(b) (longitudes 0° and 90°). The broken line represents the characteristic in a cross section in which the in-plane axis extends along the line of y=x or y=−x (longitudes 45° and 135°). (The result for the longitude 90° is equal to that for the longitude 0°, and the result for the longitude 135° is equal to that for the longitude 45°. Therefore, the results for these longitudes are not shown.) For the boundary widths w=0.5 μm and 1.0 μm, both the solid line and the broken line exhibit moderate variations relative to the declination (latitude), i.e., exhibit a small difference in intensity that may be caused due to the parallax, and exhibit an agreement with each other. As w is increased to w=2.0 μm, the variation in intensity relative to the declination increases around the plane-normal direction. When $\lambda$=0.450 μm, the separation of the solid line and the broken line is larger. w=1.5 μm is the critical condition at which the intensity variation occurs. Therefore, it is understood that the viewing angle dependence with which the light intensity in the plane-normal direction is strong, with which the variation in light intensity relative to the declination (latitude) is moderate, and with which the light intensity difference in the longitude direction is small can be obtained under the condition that the boundary width w is 1.5 μm or less.

FIG. 16 illustrates the incidence angle dependence of the transmittance t of the surface structure 13 of the first embodiment. FIG. 16(a) illustrates how much of light whose light amount is 1 in the transparent substrate 5 and which impinges on the surface structure at the incidence angle θ (the angle from the normal to the refracting surface) is emitted into the air 6 in the first light extraction. FIG. 16(b) illustrates the incidence angle dependence of the transmittance for the light which is reflected by the surface structure 13 and then reflected by the electrode 2 to impinge on the surface structure 13 again, i.e., the incidence angle dependence of the transmittance in the second light extraction. In both diagrams, the refractive index of the transparent substrate 5 is $n_1=1.457$, the refractive index of the air 6 is $n_0=1.0$, the wavelength of light is $\lambda=0.635$ μm, the protrusion height of the minute regions $\delta_1$ relative to the minute regions $\delta_2$ is d=0.70 μm, and the area proportion of the minute regions $\delta_1$ (i.e., the proportion of the raised portions) is P=0.5. The width of the surface structure, w, is a parameter (w=0.1, 0.2, 0.4, 0.6, 0.8, 1.0, 2.0, and 4.0 μm). Note that the protrusion height of d=0.70 μm is equivalent to a condition where, as for vertically incident light, the phase difference between light transmitted through the recessed portions and light transmitted through the raised portions is $\pi$ (d=$\lambda/2(n_1-n_0)$).

The probabilities that each of the minute regions $\delta$ is the minute region $\delta_1$ or the minute region $\delta_2$ are P and 1-P, respectively. Thus, among the minute regions $\delta$, two or more minute regions $\delta_1$ or minute regions $\delta_2$ successively adjoin one another. In this case, no boundary is formed between the adjoining minute regions $\delta_1$ or minute regions $\delta_2$, and the boundary is imaginary. However, the boundary between these regions is not formed only because the minute regions $\delta_1$ or minute regions $\delta_2$ are successively adjoining and, in this case also, it can be said that the surface of the transparent substrate 5 is divided with one minute region $\delta$ being the basic unit of the division.

Figure 17:
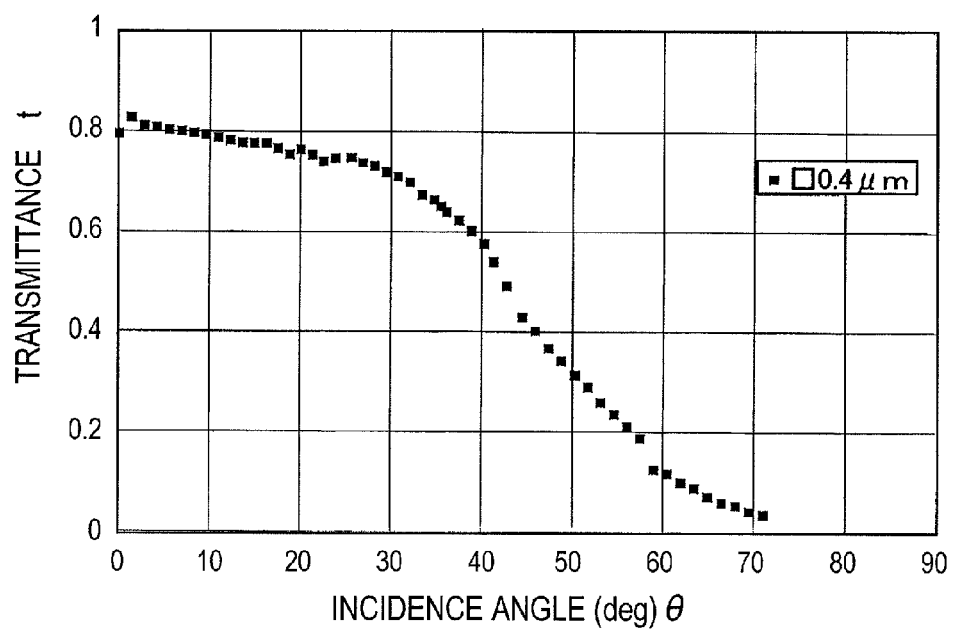
FIG. 17 is an experimental explanation diagram which illustrates the incidence angle dependence of the transmittance t of the surface structure of the first embodiment.

The results shown in FIG. 16(a) are approximate to the results from the 180°-phase shifter (FIG. 9), except for the results for w=0.1 μm and 0.2 μm, so that the transmittance is large even if the critical angle is exceeded. FIG. 17 is an experimental result which illustrates the incidence angle dependence of the transmittance t when the incident light is P-polarization. The experiment was carried out with a quartz substrate in which a random pattern of recessed portions and raised portions, depth d=0.70 μm and boundary width w=0.4 μm, was actually formed according to an electron beam method, with the use of the measurement apparatus shown in FIG. 11. The experimental result exhibited good agreement with the analysis result shown in FIG. 16(a), and it is understood that the transmittance is large even if the critical angle) (43.34°) is exceeded. As previously described in the section provided before the present embodiment, if equivalent emission of light (so called "boundary diffraction effect") occurs on the refracting surface, the light would propagate through both media on the opposite sides of the refracting surface irrespective of the incidence conditions on the refracting surface. The phenomenon illustrated in FIG. 16, in which light is transmitted through the refracting surface even if the critical angle is exceeded, can be explained based on the conditions which allow occurrence of equivalent radiation of light on this refracting surface.

Assuming that point light radiation occurs and light uniformly diffuses inside the transparent substrate 5 in the form of a spherical wave, the total amount of light in the range of the directional angle of radiation from θ (identical with the above-described incidence angle θ) to θ+dθ is proportional to sin θdθ. Therefore, the amount of extracted light is proportional to the transmittance t shown in FIGS. 16(a) and 16(b) multiplied by sine. FIGS. 18(a) and 18(b) illustrate the incidence angle dependence of the amount of extracted light at the surface structure of the first embodiment. FIG. 18(a) illustrates how much of light whose light amount is 1 and which is radiated from a point in the transparent substrate 5 (in actuality, a point in the light emitting layer) and impinges on the surface structure at the incidence angle θ (the angle from the normal to the refracting surface) is emitted into the air 6 in the first light extraction. FIG. 18(b) illustrates the incidence angle dependence of the amount of extracted light for the light which is once reflected by the surface structure 13 and then reflected by the electrode 2 to impinge on the surface structure 13 again, i.e., the incidence angle dependence of the amount of extracted light in the second light extraction.

Here, the light extraction efficiency is obtained by integrating the amount of extracted light by the incidence angle θ. FIGS. 19(a) and 19(b) illustrate the light extraction efficiency of the surface structure 13 of the first embodiment. The data are shown together, under the same conditions as those of FIG. 16, with the abscissa axis representing the boundary width w of the surface structure 13. FIG. 19(a) shows the light extraction efficiency for the protrusion height of the surface structure 13 d=0.70 μm, as well as for d=0.1, 0.30, 0.50, 1.40 μm (the light extraction efficiency in the first light extraction, $\eta_1$), and the light extraction efficiency for light which is reflected by the surface structure 13 and then reflected by the electrode 2 to impinge on the surface structure 13 again on the assumption that attenuation of light during its to-and-fro travel, such as absorption by the transparent electrode 4 and reflection loss at the electrode 2, would not occur (the light extraction efficiency in the second light extraction, $\eta_2$). The curves 5a and 5A represent the light extraction efficiencies in the first and second light extractions for d=0.70 μm. The curves 5b and 5B represent the light extraction efficiencies in the first and second light extractions for d=0.50 μm. The curves 5c and 5C represent the light extraction efficiencies in the first and second light extractions for d=0.30 μm. The curves 5g and 5G represent the light extraction efficiencies in the first and second light extractions for d=0.10 μm. In this case, the light extraction efficiency is lower than those for the other depths, and hence, the protrusion height d need to be 0.20 μm or more. As illustrated by the curve 5h, when d is equal to or greater than twice the visible light wavelength (d≧1.4 μm), the efficiency in the first light extraction greatly deteriorates in the region where width w is 1.5 μm or less. Therefore, the protrusion height d is preferably 1.4 μm or less. Thus, the recommended values of d are within the range of 0.2 μm to 1.4 μm. More generally speaking, the condition of $\lambda/(n_1-n_0)\geq d\geq\lambda/6(n_1-n_0)$ is the recommended value range for the height difference, where $n_1$ is the refractive index of the transparent substrate 5, $n_0$ is the refractive index of the air 6 (note that the medium with which the transparent substrate 5 is in contact does not need to be the air but may be a medium whose refractive index $n_0$ is smaller than the refractive index $n_1$ of the transparent substrate 5), and $\lambda$ is the center wavelength of the spectrum of light.

In the range of d≦0.70 μm, the light extraction efficiencies in the first light extraction achieve the local maximum when the boundary width w is from 0.4 μm to 2 μm. As w is decreased or increased, the light extraction efficiencies approach to 0.27 (which is a value of the light extraction efficiency given by Formula 3 when the surface is a specular surface). The light extraction efficiency in the second light extraction has the local maximum value in the range from w=0.10 μm to w=2.0 μm and approaches to 0.00 as w increases (although not shown in the range of FIG. 19). In the range of w≦0.10 μm, it converges to 0.00 as w decreases.

For comparison, in FIG. 19(b), the curves 5d and 5D represent the light extraction efficiencies in the first and second light extractions under the condition that the phase shifters which convert the phase of light by 180° are provided in the minute regions $\delta_1$ instead of the surface structure 13. In the surface structure 13 of the present embodiment, a phase difference occurs between the light transmitted through the recessed portions and the light transmitted through the raised portions during the transmission therethrough by the distance equal to the height difference, whereas the phase shifter is capable of producing an equivalent phase difference with no transmission distance. In the case of the phase shifter, as the boundary width w increases, the light extraction efficiencies in the first and second light extractions approach to 0.27 and 0.00, respectively, as they do for the surface structure 13. As w decreases to 0.3 μm or smaller, not only the light extraction efficiency in the second light extraction but also the light extraction efficiency in the first light extraction become zero (the reason for this has already been described with reference to FIG. 7(*e*)). One of the possible reasons for a higher light extraction efficiency obtained in the surface structure 13 of the present embodiment, under the condition that the boundary width is 0.4 μm or less, than that achieved in the phase shifter is the function of the raised portions as a light guiding path.

The light extraction efficiency in the second light extraction with consideration for attenuation of light during its to-and-fro travel between the surface of the transparent substrate 5 and the electrode 2 is $\tau \times \eta_2$ where $\tau$ is the transmittance of light during its to-and-fro travel between the surface of the transparent substrate 5 and the electrode relative to the transparent substrate 5. Extraction of light is not limited to once or twice but is repeated endlessly. On the assumption that the relationship is a geometric progression where the light extraction efficiency in the first light extraction is $\eta_1$ and the light extraction efficiency in the second light extraction is $\tau \times \eta_2$, the light extraction efficiency for the $n^{th}$ light extraction is expected to $\eta_1 \times (\tau \times \eta_2 / \eta_1)^{n-1}$. Thus, the total amount of extracted light up to the $n^{th}$ light extraction is:

$$\eta_1 \times \sum_{k=1}^{n} (\tau \times \eta_2 / \eta_1)^{k-1} \quad \text{(Formula 6)}$$

When n is infinite, it approaches to $\eta_1/(1-\tau \times \eta_2/\eta_1)$.

Figure 1:
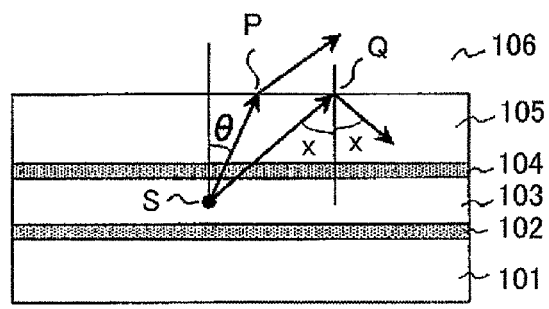
FIG. 1 shows a cross-sectional structure of an organic electroluminescence element and propagation of light.

In FIG. 19(*a*), as for the curves 5*a* and 5A (d=0.70 μm), when w=0.60 μm, $\eta_1$=0.318 and $\eta_2$=0.093, and the light extraction efficiency obtained for $\tau$=0.88 is 0.428. When w=1.00 μm, $\eta_1$=0.319 and $\eta_2$=0.102, and the light extraction efficiency obtained is 0.444. On the other hand, in the conventional light emitting device shown in FIG. 1 and FIG. 2(*a*), $\eta_1$=0.274 and $\mu_2$=0, and for the second and subsequent incidences, the efficiencies are all zero; thus, the total light extraction efficiency is 0.274. Therefore, it is understood that, under the condition of w=0.60 μm, the light emitting device of the present embodiment achieves a light extraction efficiency that is 1.56 times that of the light emitting device shown in FIG. 2(*a*). Under the condition of w=1.00 μm, the light emitting device of the present embodiment achieves a light extraction efficiency that is 1.62 times that of the light emitting device shown in FIG. 2(*a*). Thus, when w is greater than 0.2 μm (generally, when the diameter of the largest inscribed circle of the minute regions δ is 0.2 μm or greater), the light extraction efficiency can be greatly improved.

Next, the dependence on the wavelength of the light extraction efficiency of the surface structure 13 of the present embodiment is considered.

The curves 5*a*', 5A', 5*h*', and 5H' of FIG. 19(*a*) represent the light extraction efficiencies in the first and second light extractions for d=0.70 μm and 1.40 μm under the condition where the wavelength is 0.45 μm. These characteristics are substantially identical with the results for the wavelength of 0.635 μm. Therefore, it is understood that the variation in extraction efficiency due to the wavelength difference within the visible light range can be decreased.

Thus, the surface structure 13 of the present embodiment achieves a light extraction efficiency which is approximate to the optimum value for all the wavelengths within the visible light range even when the surface structure 13 has a single shape (defined by d and w). Therefore, when this structure is used in the display surface of a display device, it is not necessary to prepare different shapes for respective ones of the three types of pixels of RGB, so that the configuration and adjustments made during assemblage can be greatly simplified.

In some organic EL elements, a transparent adjustment layer may be provided on the transparent electrode 4 for adjusting the transmittance of light during its to-and-fro travel between the transparent substrate 5 and the electrode 2. In this case, the transparent substrate 5 is stacked on the adjustment layer (i.e., an organic EL element which further includes the adjustment layer may be referred to as "light emitting body"). When the refractive index $n_1$ of the transparent substrate 5 is smaller than the refractive index $n_1'$ of the adjustment layer, there is an interface between the transparent substrate 5 and the adjustment layer at which total reflection occurs. Especially when $n_1'-n_1>0.1$, the interface produces a nonnegligible effect. FIG. 20 shows the propagation of light under such a condition.

Figure 20:
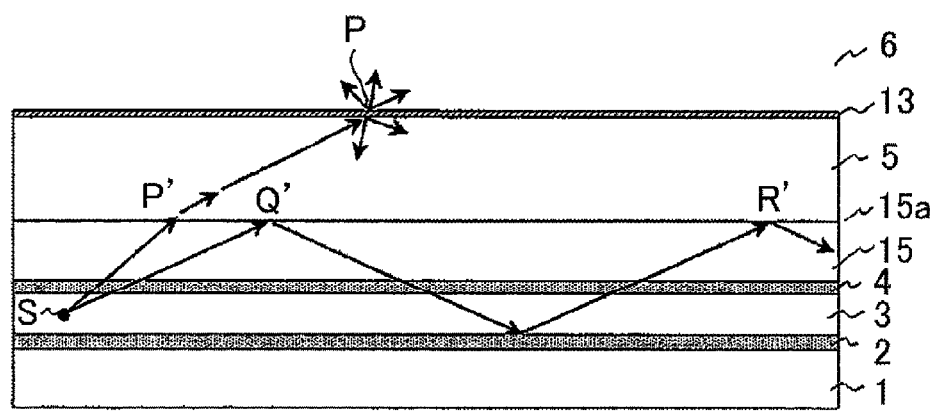
FIG. 20 shows a cross section of a light emitting device which includes an adjustment layer.

In FIG. 20, light radiated from the point S that is inside the light emitting layer 3 of the refractive index $n_2$ enters the transparent electrode 4 directly or after being reflected by the electrode 2 and is then transmitted therethrough. Then, the light is transmitted through an adjustment layer 15 of the refractive index $n_1'$ and refracted at point P' on an interface 15*a*. The refracted light is transmitted through the transparent substrate 5 of the refractive index $n_1$ to be emitted into the air 6 via point P on the interface between the transparent substrate 5 and the air 6. Here, $n_1' \geq n_2 > n_1 > 1.0$. Note that $n_1'$ may be smaller than $n_2$, but in such a case, total reflection occurs between the transparent electrode 4 and the adjustment layer 15. Since a surface of the transparent substrate 5 bordering on the air 6 has the surface structure 13 of the present embodiment, light that is incident at an angle greater than the critical angle can also be extracted to the air layer 6 side. However, due to the relationship of $n_1'>n_1$, total reflection also occurs on the interface 15*a*. Specifically, incidence of light at point Q' which occurs with a greater incidence angle than at point P' results in total reflection. This reflected light repeatedly undergoes total reflection between the interface 15*a* and the electrode 2 and therefore cannot be extracted to the air 6 side.

Figure 21:
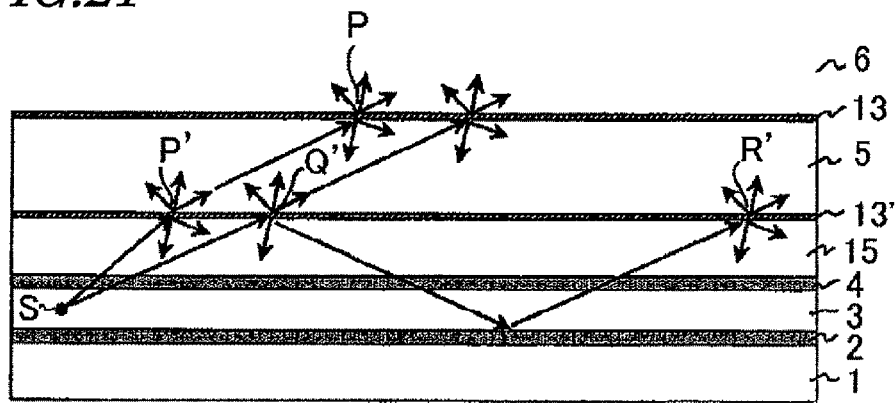
FIG. 21 shows a cross section of a light emitting device which has another surface structure at the border with the adjustment layer.

In such a case, as shown in FIG. 21, another surface structure 13' of the present embodiment is provided at the interface between the adjustment layer 15 and the transparent substrate 5, whereby light impinging on this surface at an incidence angle greater than the critical angle can be extracted to the air 6 side. Specifically, due to the surface structure 13', incidence of light at point Q' at an angle greater than the critical angle does not result in occurrence of total reflection. A component of the light which is reflected by this surface is then reflected by the electrode 2 to again impinge on the surface structure 13' at point R'. Part of the impinging light can be emitted into the air 6 via the surface structure 13. This process is repeated endlessly. The configuration of FIG. 21 has complexity in forming two layers of the surface structures 13, 13' which have recessed portions and raised portions. However, the configuration of FIG. 21 is advantageous because a material of a low refractive index can be used for the transparent substrate 5, so that a wider selection of materials can be provided.

Note that, as seen from formula 6, as the transmittance τ of light during its to-and-fro travel between the transparent substrate 5 and the electrode 2 increases, the light extraction efficiency increases. In an actual device, the light emitting layer 3 is surrounded by a plurality of transparent layers, such as the above-described adjustment layer 15, as well as by the electrode 2 and the transparent electrode 4. The design of these films (the refractive index and the thickness of the films including the light emitting layer 3) is to be determined such that the above-described transmittance τ achieves the maximum value. In this case, reflection by the surface structure 13 results in a random phase distribution, and therefore, superposition of reflected light beams is considered as being incoherent (it is not addition of amplitudes but addition of intensities). Thus, the effects of the reflection by the surface of the transparent substrate 5 are negligible, and therefore, it can be assumed that the reflectance is 0% and the transmittance is 100%. The refractive index and the thickness of respective one of the films are determined so as to maximize the amount of light obtained by superimposition of complex amplitudes of light beams which are radiated from the transparent substrate 5 and repeatedly travel to-and-fro through a multilayer film including the light emitting layer 3 to return to the transparent substrate 5 under the above assumption.

Second Embodiment

The second embodiment is described with reference to FIG. 22 and FIG. 23. Note that the second embodiment is different from the first embodiment only in the pattern of the surface structure 13, and the other elements are all the same as those of the first embodiment. The descriptions of the common elements are herein omitted.

In the second embodiment, the proportion of the raised portions of the surface structure, P, and the proportion of the recessed portions, 1-P, are not fixed to 0.5 but are within the range of P=0.4 to 0.98. Specifically, the minute regions $\delta_1$ (the regions protruding above the surface) constitute 40% to 98%, while the minute regions $\delta_2$ (recesses) constitute 60% to 2%.

FIG. 22(a) illustrates the light extraction efficiency of the surface structure of the present embodiment. The refractive index of the transparent substrate 5 is $n_1$=1.457. The refractive index of the air 6 is $n_0$=1.0. The wavelength of light is λ=0.635 μm. The protrusion height of the surface structure is d=0.70 μm. The abscissa axis represents the boundary width w of the surface structure. The light extraction efficiencies for the proportion P=0.2, 0.4, 0.6, 0.8, 0.9 (in the first and second light extractions). The curves 6a, 6b, 6c, 6d, 6e and 6A, 6B, 6C, 6D, 6E represent the light extraction efficiencies for P=0.2, 0.4, 0.6, 0.8, 0.9, respectively. The curves 27a and 27A of FIG. 23 represent the light extraction efficiencies (in the first and second light extractions) which are plotted over the abscissa axis that represents the proportion of the raised portions, P, under the above conditions for the boundary width of w=1.0 μm.

As seen from FIG. 22(a), in terms of the light extraction efficiency in the first light extraction, the characteristic for the proportion P=0.2 is the lowest in the entire range of w. In the range of w≦2 μm, the characteristic for P=0.6 exhibits the largest value. In terms of the light extraction efficiency in the second light extraction, in the range of w≦4 μm, the characteristic for P=0.9 is the highest, and the characteristic for P=0.2 is the lowest.

Figure 23:
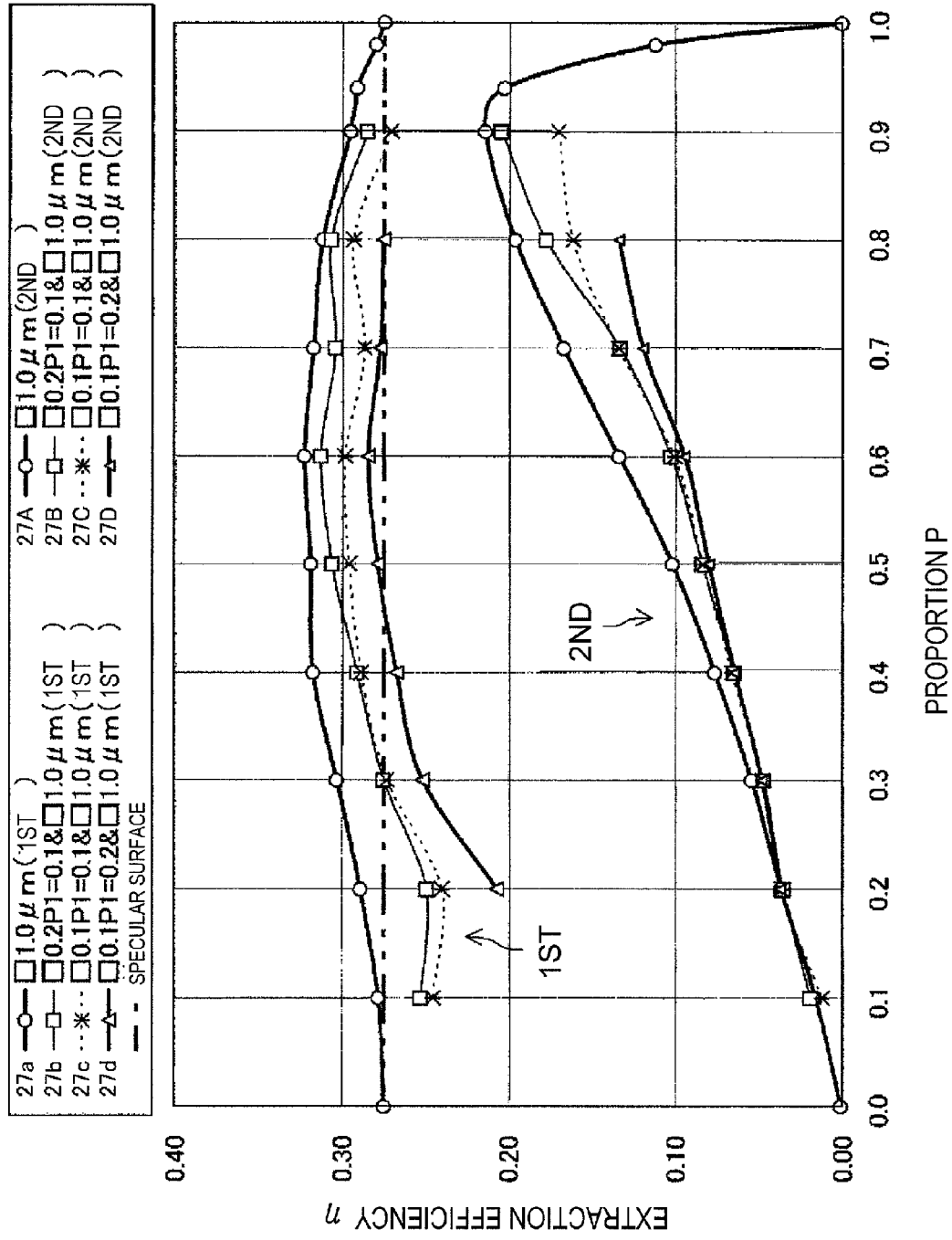
FIG. 23 illustrates the extraction efficiency according to the second embodiment.

As seen from the curve 27a of FIG. 23, in the first light extraction, the light extraction efficiency can be further improved by setting the proportion P, which determines the area ratio between the recessed portions and the raised portions, within a range centered at 0.6 and ranging from 0.4 to 0.8. This is presumably because the raised portions effectively function as a light guiding path in this range. (When P≦0.2, the area proportion of the raised portions which constitute a light guiding path is small. When P≧0.8, adjacent raised portions are too close to one another so that the wave guiding effect decreases.) On the other hand, as seen from the curve 27A of FIG. 23, as for the second light extraction, the light extraction efficiency can be further improved by setting the proportion P within a range centered at 0.9 and ranging from 0.5 to 0.98. Thus, in terms of the total light extraction efficiency including the light extraction efficiencies in the first and second light extractions, the proportion P is preferably set within the range of 0.4 to 0.98.

Thus, in the present embodiment, the proportion P is deviated from 0.5, whereby a higher light extraction efficiency than that of the first embodiment can be obtained. Also, as in the first embodiment, variation in light intensity distribution and color imbalance do not occur depending on the direction, and the light extraction efficiency can be greatly improved. Also, reflection of an ambient image can be prevented.

Third Embodiment

The third embodiment is described with reference to FIG. 22(b). The third embodiment is different from the first and second embodiments only in the height difference conditions of the surface structure 13, and the other elements are all the same as those of the first and second embodiments. The descriptions of the common elements are herein omitted.

In the third embodiment, the difference in height between two adjacent minute regions $\delta_1$, $\delta_2$ of the surface structure of the first or second embodiment varies randomly. The method of making such a random arrangement is realized by dividing the surface of the transparent substrate 5 into boxes of a chessboard-like grid (square minute regions δ) without leaving any gap therebetween as shown in FIG. 13(a), each box having the width w (herein referred to as "boundary width"), and randomly allocating arbitrary heights (or depths) within a range from $-d_m/2$ to $d_m/2$ relative to a single reference plane to respective ones of the boxes according to a random function. The single reference plane may be a plane which is parallel to the surface of the transparent substrate 5 and which is equidistant from a highest one of the minute regions δ and a lowest one of the minute regions δ in terms of a direction parallel to the normal to the surface of the transparent substrate 5. $d_m$ represents the difference in position in terms of a height direction between the highest one of the minute regions δ and the lowest one of the minute regions δ.

FIG. 22(b) illustrates the light extraction efficiency of the surface structure of the present embodiment. The refractive index of the transparent substrate 5 is $n_1$=1.457. The refractive index of the air 6 is $n_0$=1.0. The wavelength of light is λ=0.635 μm. The light extraction efficiencies $\eta_1$ in the first light extraction and the light extraction efficiencies $\eta_{12}$ in the second light extraction, for the maximum height differences $d_m$=1.4, 0.9, 0.7, and 0.3 μm, are shown over the abscissa axis that represents the boundary width of the surface structure (the width of the minute regions δ) w. For the convenience of calculation, the randomness in height difference relative to the reference plane is determined such that four height difference values are randomly selected (the probability of occurrence of each height difference value is 25%) as follows: for $d_m$=1.4 μm, 4 different height difference values from −0.7 μm to 0.7 μm at intervals of 0.467 μm; for $d_m$=0.9 μm, different height difference values from −0.45 μm to 0.45 μm at intervals of 0.3 μm; for $d_m$=0.7 μm, 4 different height difference values from −0.35 μm to 0.35 μm at intervals of 0.233 μm; and for $d_m$=0.3 μm, 4 different height difference values from −0.15 μm to 0.15 μm at intervals of 0.1 μm. Note that the probabilities of occurrence of the respective steps do not need to be equal. For example, the probabilities of occurrence of steps at lower (deeper) positions may be greater, while the probabilities of occurrence of steps at higher (shallower) positions may be smaller.

The curves 6i and 6I represent the light extraction efficiencies in the first and second light extractions, respectively, for $d_m$=1.4 μm. The curves 6h and 6H represent the light extraction efficiencies in the first and second light extractions, respectively, for $d_m$=0.9 μm. The curves 6g and 6G represent the light extraction efficiencies in the first and second light extractions, respectively, for $d_m$=0.7 μm. The curves 6f and 6F represent the light extraction efficiencies in the first and second light extractions, respectively, for $d_m$=0.3 μm. As in the first embodiment, the light extraction efficiency in the first light extraction achieves the local maximum when the boundary width w is from 0.2 μm to 2 μm. As w is decreased or increased, the extraction efficiency approaches to 0.27 (which is a value of the light extraction efficiency given by Formula 3 when the surface is a specular surface). The light extraction efficiency in the second light extraction converges to 0.00 as w decreases in the range of w≦0.20 μm. The light extraction efficiency approaches to 0.00 as w is increased from 8 μm, although not shown. Therefore, the range of the boundary width w needs to be 0.2 μm or greater. Further, as discussed with reference to FIG. 14 and FIG. 15 in conjunction with the first example, it is preferably 1.5 μm or less in consideration of the viewing angle dependence. In FIG. 22(*b*), the light extraction efficiencies in the first and second light extractions ($\eta_1, \eta_2$) calculated under the conditions of $d_m$=0.7 μm and the boundary width w=0.6 μm are 0.331 and 0.141, respectively. Therefore, the characteristic obtained for $d_m$=0.7 μm is better in terms of the light extraction efficiency in the second light extraction than the characteristic obtained in the first embodiment (curve 5A) and the characteristic obtained in the second embodiment (curves 6B and 6C). This is presumably because the tip ends of the raised portions are at different heights so that the randomness of the pattern increases. Accordingly, the randomness of the propagation direction of light reflected by the surface structure increases so that the diffusion of the reflected light improves. As a result, even in the second light extraction, light can be incident on the surface structure in approximately the same conditions as those of the first light extraction (the light intensity is uniform among all the directions).

In the range of w≧0.4 μm, the characteristic for $d_m$=0.30 μm in the first light extraction is inferior to that for $d_m$=0.70 μm. Therefore, $d_m$ is preferably $d_m$0.2 μm to 0.3 μm. (This range is equal to that of the first embodiment). In the range of w≧1.0 μm, the characteristic for $d_m$=1.40 μm in the first light extraction is slightly better than that for $d_m$=0.70 μm. However, when $d_m$ is too large, the processing is difficult, and the viewing angle characteristic deteriorates in the condition of w≧1.5 μm (see FIG. 14 and FIG. 15). Thus, 1.40 μm may be an appropriate value for the upper limit of $d_m$. These ranges are equal to the range of the first embodiment ($\lambda/(n_1-n_0) \geq d_m \geq \lambda/6(n_1-n_0)$).

As described hereinabove, in the third embodiment, the height difference is randomly varying, so that a higher light extraction efficiency than the first and second embodiments can be obtained. Also, as in the first embodiment, variation in light intensity distribution and color imbalance do not occur depending on the direction. Also, reflection of an ambient image can be prevented.

There are two possible conditions for the random height difference: (1) the height difference can have all the values from 0 to the maximum height difference $d_m$; and (2) the height difference can have any of three or more height difference values including 0 and the maximum height difference $d_m$. As an example of the condition (2), consider that the four different height difference values 0, $d_m/3$, $d_m\times2/3$, and $d_m$ are possible. A mold for shape transfer which is configured to form such a surface structure over a sheet surface can be fabricated by two cycles of an exposure-etching step (1st cycle: exposure with mask pattern of boundary width $w_1$ and etching to the depth of $d_m/3$; 2nd cycle: exposure with mask pattern of boundary width $w_2$ and etching to the depth of $d_m\times2/3$). Here, $w_2=w_1$ is the condition for maximizing the frequency of occurrence of discontinued boundary lines.

Now, consider a case where the seven different heights (height differences), 0, $d_m/6$, $d_m\times2/6$, $d_m\times3/6$, $d_m\times4/6$, $d_m\times5/6$, $d_m$, are possible. A mold for shape transfer which is configured to form such a surface structure over a sheet surface can be fabricated by three cycles of an exposure-etching step (1st cycle: exposure with mask pattern of boundary width $w_1$ and etching to the depth of $d_m/6$; 2nd cycle: exposure with mask pattern of boundary width $w_2$ and etching to the depth of $d_m\times2/6$; 3rd cycle: exposure with mask pattern of boundary width $w_3$ and etching to the depth of $d_m\times3/6$). Here, $w_1=w_2=w_3$ is the condition for maximizing the frequency of occurrence of discontinued boundary lines.

Fourth Embodiment

The fourth embodiment is described with reference to FIG. 24. Note that the fourth embodiment is different from the first embodiment only in the pattern of the surface structure, and the other elements are all the same as those of the first embodiment. The descriptions of the common elements are herein omitted.

Figure 24:
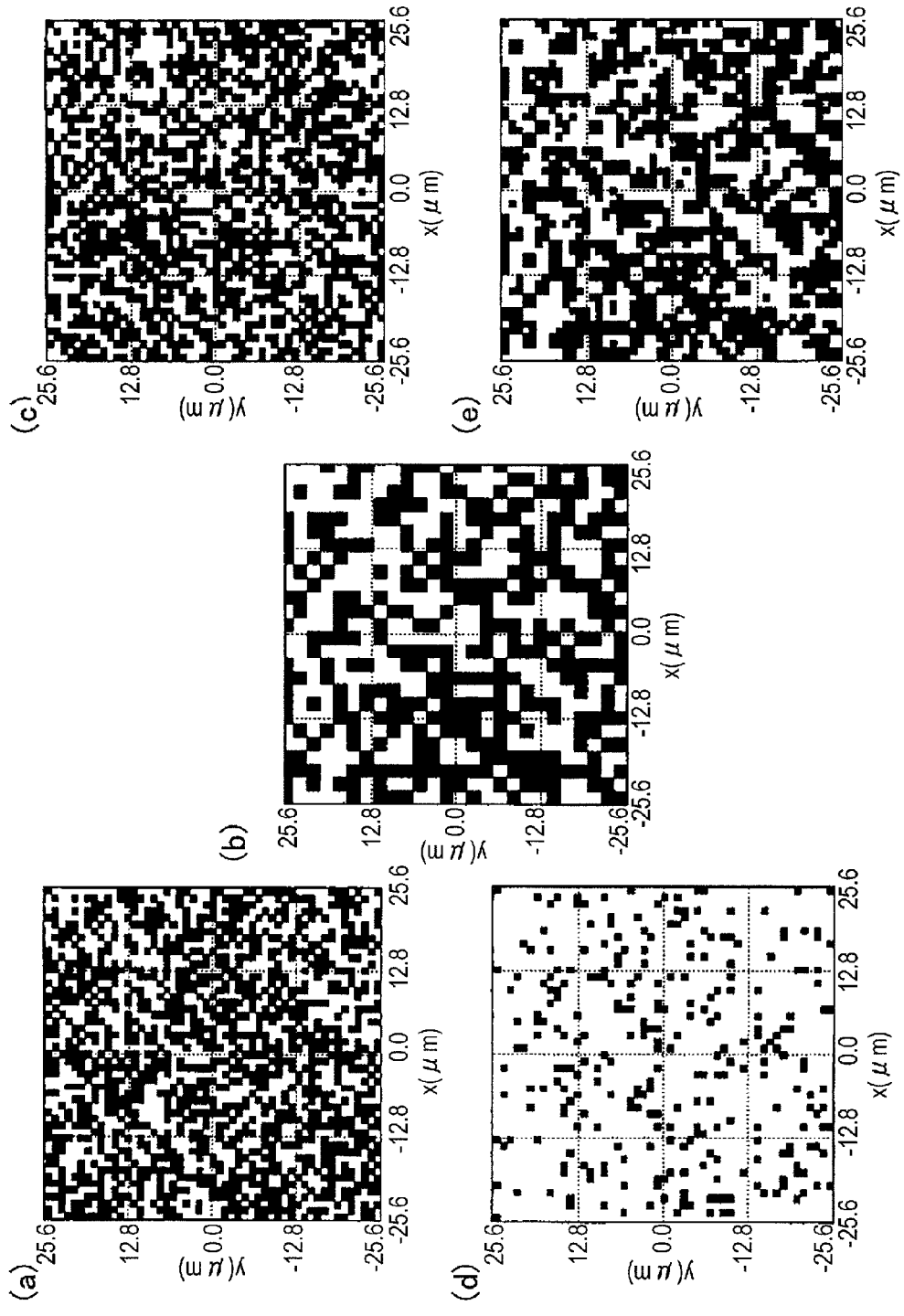
FIGS. 24(a) to 24(e) illustrate how to determine the pattern of the surface structure according to the fourth embodiment.

FIG. 24 illustrates the process of determining the pattern of the surface structure in the fourth embodiment. FIG. 24(*a*) shows the surface of the transparent substrate 5 which is divided into boxes of a chessboard-like grid (square minute regions α), each box having width $w_1$. To respective ones of the boxes, white and black are randomly allocated such that each of the proportion of black boxes and the proportion of white boxes is 50%. In the shown example, $w_1$=1 μm (note that the description below is given with this value for the sake of visibility of the drawing, although the optimum value for $w_1$ is far smaller than this). Some of the minute regions α to which black is allocated are referred to as "minute regions $\alpha_1$", and the other minute regions α to which white is allocated are referred to as "minute regions $\alpha_2$".

FIG. 24(*b*) shows the surface of the transparent substrate 5 which is divided into boxes of a chessboard-like grid (square minute regions β), each box having width $w_2$ that is an integral multiple of $w_1$. To respective ones of the boxes, white and black are randomly allocated such that the proportion of black boxes is P2, the proportion of white boxes is 1−$P_2$, and $P_2$=0.5. In the shown example, $w_2$=2 μm. Some of the minute regions β to which black is allocated are referred to as "minute regions $\beta_1$", and the other minute regions β to which white is allocated are referred to as "minute regions $\beta_2$".

FIG. 24(*c*) shows a pattern generated by superimposing the patterns of FIG. 24(*a*) and FIG. 24(*b*) such that the boxes are in alignment between these patterns according to a rule that superimposition of a black region ($\alpha_1$) and a black region ($\beta_1$) is to be replaced by a white box, superimposition of a white region ($\alpha_2$) and a white region ($\beta_2$) is to be replaced by a white box, and superimposition of a white region ($\alpha_2$) and a black region ($\beta_1$) and superimposition of a black region ($\alpha_1$) and a white region ($\beta_2$) are to be replaced by black boxes. As a result, the pattern generation rule of FIG. 24(c) is the same as that of the pattern of FIG. 24(a). The pattern of the surface structure in which the black boxes correspond to raised portions and, relatively, the white boxes correspond to recessed portions is the same as that described in the first embodiment.

FIG. 24(d) shows the surface of the transparent substrate 5 which is divided into boxes of a chessboard-like grid (square minute regions $\alpha$), each box having width $w_1$. To respective ones of the boxes, white and black are randomly allocated such that the proportion of black boxes is $P_1$ and the proportion of white boxes is $1-P_1$. In the shown example, $w_1=1$ μm and $P_1=0.1$. As in FIG. 24(a), the black boxes are referred to as "minute regions $\alpha_1$", and the white boxes are referred to as "minute regions $\alpha_2$".

FIG. 24(e) shows a pattern generated by superimposing the patterns of FIG. 24(d) and FIG. 24(b) such that the boxes are in alignment between these patterns according to a rule that superimposition of a black region ($\alpha_1$) and a black region ($\beta_1$) is to be replaced by a white box, superimposition of a white region ($\alpha_2$) and a white region ($\beta_2$) is to be replaced by a white box, and superimposition of a white region ($\alpha_2$) and a black region ($\beta_1$) and superimposition of a black region ($\alpha_1$) and a white region ($\beta_2$) are to be replaced by black boxes. The pattern of FIG. 24(e) has similar features to those of the pattern of FIG. 24(c). For example, the area ratio between black and white is 1:1, and the minimum sizes of the black marks and the white marks are equal. However, the pattern of FIG. 24(e) is different from the pattern of FIG. 24(c) in that the proportion of the minimum size marks is smaller. The finally determined black-white ratio (the area ratio between recessed portions and raised portions) depends on the proportions $P_1$ and $P_2$. The proportion of the black marks (the proportion of the raised portions), P, is given as $P=P_1+P_2-2P_1P_2$.

In FIG. 23, the curves 27b and 27B represent the characteristics of the light extraction efficiencies calculated for the first and second light extractions ($\eta_1$, $\eta_2$), which are plotted over the abscissa axis that represents the proportion of the raised portions, P, under the conditions that the protrusion height of the raised portions of the surface structure is $d=0.70$ μm, $w_1=0.2$ μm, $w_2=1$ μm, and $P_1=0.1$.

As seen from the curve 27b of FIG. 23, in the first light extraction, the light extraction efficiency can be further improved by setting the proportion P, which determines the area ratio between the recessed portions and the raised portions, within a range centered at 0.6 and ranging from 0.4 to 0.8, notwithstanding the distribution of the recessed and raised portions has a different pattern from that of the first example. On the other hand, as seen from the curve 27B, in the second light extraction, the light extraction efficiency can be further improved by setting the proportion P within a range from 0.5 to 0.9 (note that the curves 27b and 27B cannot be plotted in the range of 0.1 or less and in the range of 0.9 or more because $P_1=0.1$). Thus, the total light extraction efficiency, including the efficiencies in the first and second light extractions, can be improved by setting the proportion P, which is finally obtained from a combination of the proportions $P_1$ and $P_2$, within the range of 0.5 to 0.98 as in the first example. In FIG. 23, the curves 27c and 27C represent the characteristics of the light extraction efficiencies in the first and second light extractions, respectively, under the conditions that $w_1=0.1$ μm and $P_1=0.1$. The curves 27d and 27D represent the characteristics of the light extraction efficiencies in the first and second light extractions, respectively, under the conditions that $w_1=0.1$ μm and $P_1=0.2$. Since the efficiencies greatly deteriorate when $w_1$ is less than 0.2 μm, $w_1$ needs to be 0.2 μm or more. The upper limit for $w_1$ is preferably 1.5 μm or less in consideration of the viewing angle dependence as discussed in conjunction with the first embodiment with reference to FIG. 14 and FIG. 15.

The fourth embodiment is different from the first embodiment in that small changes are made in the formation conditions of the surface structure. The light extraction efficiency may be slightly inferior to that of the first embodiment under some conditions. However, the fourth embodiment can still achieve a light extraction efficiency which is much higher than that of the conventional light emitting device shown in FIG. 1 and FIG. 2(a). As in the first embodiment, the fourth embodiment has the following advantages: variation in light intensity distribution and color imbalance do not occur depending on the direction; the light extraction efficiency can be greatly improved; and reflection of an ambient image can be prevented. The fourth embodiment has moderate requirements for the shape of the surface structure as compared with the first embodiment, so that a large error margin can be secured, which will be a merit in terms of easy processing. For example, under the conditions of the first embodiment, the interval between adjacent recessed portions or the interval between adjacent raised portions is shorter, and therefore, the processing of a fine shape of the recessed or raised portions is relatively difficult. However, in the fourth embodiment, the proportion of the fine recessed or raised portions is small (see FIGS. 24(c) and 24(e)). Therefore, the interval between adjacent recessed portions or the interval between adjacent raised portions is effectively larger, so that a hurdle for the difficulty in processing is lowered. As a matter of course, application of the fourth embodiment to the second embodiment would achieve the same effects as those of the second embodiment.

Fifth Embodiment

The fifth embodiment is a combination of the fourth embodiment and the third embodiment. In the present embodiment, for the sake of easy recognition of allocation of regions, the respective regions are distinguished by color in the description below. In the fifth embodiment, firstly, the surface of the transparent substrate 5 is divided into boxes of a chessboard-like grid (square minute regions $\alpha$) such that each box has the width w, and black and white are randomly allocated to respective ones of the boxes such that the proportion of black boxes is $P_1$ and the proportion of white boxes is $1-P_1$. Regions to which white is allocated (minute regions $\alpha_2$) are lowered by the depth of $d_1$ (>0) by means of, for example, etching. Regions to which black is allocated are referred to as "minute regions $\alpha_1$".

Then, the surface of the transparent substrate 5 is divided into boxes of a chessboard-like grid (square minute regions $\beta$) such that each box has the width $w_2$, and blue and red are randomly allocated to respective ones of the boxes such that the proportion of blue boxes is $P_2$ and the proportion of red boxes is $1-P_2$. Regions to which red is allocated (minute regions $\beta_2$) are lowered by the depth of $d_2$ (>0) by means of, for example, etching. Regions to which blue is allocated are referred to as "minute regions $\beta_1$". Note that the width $w_2$ is an integral multiple of the width $w_1$ ($w_2=w_1$ is the most preferred case). The two chessboard-like grids are superimposed with each other such that the boundary lines are in alignment between the grids.

By superimposition of the grids, relative to the surface of an area in which a white region and a red region are superimposed with each other (herein referred to as "reference plane"), superimposition of a black region and a blue region has a height of $d_1+d_2$, superimposition of a white region and a blue region has a height of $d_2$, and superimposition of a black region and a red region has a height of $d_1$. Therefore, the height differences can randomly have the four values from 0 to $d_1+d_2$ (0, $d_1$, $d_2$, $d_1+d_2$), so that the same effect as those of the third embodiment can be achieved.

Under the conditions of $d_1=d_m\times1/3$ and $d_2=d_m\times2/3$, the pattern of the width $w_1$, which has a finer structure and therefore has difficulty in processing, can have a decreased depth, which will be a merit in terms of easy processing. Under the conditions of $d_1=d_m\times1/3$ and $d_2=d_m\times2/3$, the proportion $P_2$ has a similar meaning to that of the proportion $P_2$ of the fourth embodiment which determines the area ratio between the recessed portions and the raised portions, i.e., the average level of the depth because it corresponds to the more deeply lowered side (in actuality, the proportion $P_2$ side relates to the average depth with a weight of 2, while the proportion $P_1$ side relates to the average depth with a weight of 1). On the other hand, the proportion $P_1$ relates to the proportion of the finer structures (width $w_1$) and therefore has a similar meaning to that of the proportion $P_1$ of the fourth embodiment.

In the above example, 2 sets of conditions of the exposure-etching step are combined. When 3 sets of conditions of the exposure-etching step are combined, the height can have a value randomly selected from 8 different values. In this case, the following steps are added to the above-described two etching steps. Specifically, the surface of the transparent substrate 5 is divided into boxes of a chessboard-like grid (square minute regions γ) such that each box has the width $w_3$, and yellow and green are randomly allocated to respective ones of the boxes such that the proportion of green boxes is $P_3$ and the proportion of yellow boxes is $1-P_3$. Regions to which yellow is allocated (minute regions $\gamma_2$) are lowered by the depth of $d_3$ (>0) by means of, for example, etching. Regions to which green is allocated are referred to as "minute regions $\gamma_1$". Note that the width $w_3$ is an integral multiple of the width $w_2$ ($w_3=w_2$ is the most preferred case). The two chessboard-like grids are superimposed with each other such that the boundary lines are in alignment between the grids.

By superimposition of the grids, relative to the surface of an area in which a white region, a red region, and a yellow region are superimposed with one another (herein referred to as "reference plane"), superimposition of a black region, a blue region, and a green region has a height of $d_1+d_2+d_3$, superimposition of a white region, a blue region, and a green region has a height of $d_2+d_3$, superimposition of a black region, a blue region, and a yellow region has a height of $d_1+d_2$, superimposition of a black region, a red region, and a green region has a height of $d_1+d_3$, superimposition of a black region, a red region, and a yellow region has a height of $d_1$, superimposition of a white region, a blue region, and a yellow region has a height of $d_2$, and superimposition of a white region, a red region, and a green region has a height of $d_3$. Therefore, the height differences can randomly have the eight values from 0 to $d_1+d_2+d_3$ (0, $d_1$, $d_2$, $d_3$, $d_1+d_2$, $d_2+d_3$, $d_3+d_1$, $d_1+d_2+d_3$), so that the same effect as those of the third embodiment can be achieved.

Under the conditions of $d_1=d_m\times1/6$, $d_2=d_m\times2/6$, and $d_3=d_m\times3/6$, the patterns of the widths $w_1$ and $w_2$, which have finer structures and therefore have difficulty in processing, can have decreased depths, which will be a merit in terms of easy processing. Under the conditions of $d_1=d_m\times1/6$, $d_2=d_m\times2/6$, and $d_3=d_m\times3/6$, $P_2$ and $P_3$ have similar meanings to that of the proportion $P_2$ of the fourth embodiment which determines the area ratio between the recessed portions and the raised portions, i.e., the average level of the depth because the proportions $P_2$ and $P_3$ correspond to the more deeply lowered sides (in actuality, the proportion $P_3$ side relates to the average depth with a weight of 3, the proportion $P_2$ side relates to the average depth with a weight of 2, and the proportion $P_1$ side relates to the average depth with a weight of 1). On the other hand, the proportion $P_1$ relates to the proportion of the finer structures (width $w_1$) and therefore has a similar meaning to that of the proportion $P_1$ of the fourth embodiment.

Sixth Embodiment

The sixth embodiment is described with reference to FIG. 12. Note that the sixth embodiment is different from the first embodiment only in the pattern of the surface structure 13, and the other elements are all the same as those of the first embodiment. The descriptions of the common elements are herein omitted.

In the sixth embodiment, two adjacent minute regions $\delta_1$, $\delta_2$ in the surface structure of the first embodiment are formed by phase shifters. The phase shifters may be formed by, for example, a multilayer film which includes layers of different refractive indices. Specifically, the phase of light transmitted through the multilayer film is adjusted by means of multiple reflection caused by the multilayer film. By changing the configuration of the multilayer film (the film thickness and the number of layers), regions of 180° and regions of 0° can be randomly formed. Also, the same effects can be obtained by using polarizers to change the polarization of light transmitted through the two types of regions. Here, the polarizers used herein are configured such that the polarization of transmitted light corresponding to the 180° regions is P-polarization or right-handed circular polarization, and the polarization of transmitted light corresponding to the 0° regions is S-polarization or left-handed circular polarization. These polarizers can be realized by ½-wave plates whose directions are different by 90°. When using the uneven structure of recessed portions and raised portions which are formed at the interface between media of different refractive indices as in the first example, the phase of transmitted light is varying between the recessed portions and the raised portions, and thus, such an uneven structure can also be classified as one form of the phase shifter.

The incidence angle dependence of the transmittance t and the light extraction efficiency of the surface structure 13 in the present embodiment have already been illustrated in FIG. 9 and FIG. 19(b) (curves 5d and 5D). The light extraction efficiency in the first light extraction can exceed the light extraction efficiency which would be achieved when w is in the range of 0.4 µm to 1 µm and the surface is a specular surface. FIG. 19(b) also shows the results obtained when the phase difference is 90°. The light extraction efficiencies in the first and second light extractions are represented by the curves 5d' and 5D'. The both light extraction efficiencies are inferior to those for the phase difference of 180° (curves 5d and 5D). Thus, it is understood that the optimum value for the phase difference is 180°.

In this way, the surface structure 13 of the sixth embodiment is formed by phase shifters, whereby a higher light extraction efficiency than that of the conventional example can be achieved. Also, as in the first embodiment, variation in light intensity distribution and color imbalance do not occur depending on the direction, and reflection of an ambient image can be prevented.

Seventh Embodiment

Figure 25:
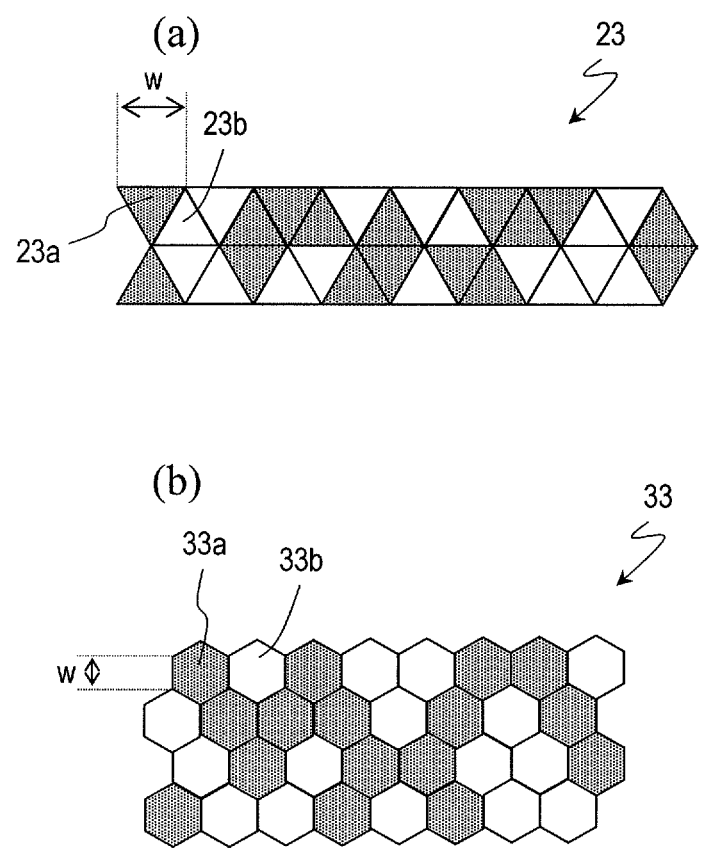
FIG. 25(a) shows the first surface structure of the sixth embodiment.
FIG. 25(b) shows the second surface structure.

The seventh embodiment is described with reference to FIG. 25. Note that the seventh embodiment is different from the first embodiment only in the pattern of the surface structure, and the other elements are all the same as those of the first embodiment. The descriptions of the common elements are herein omitted.

FIG. 25(a) shows a pattern diagram of a first surface structure 23 according to the present embodiment. As shown in FIG. 25(a), the surface structure 23 is obtained by dividing the surface of the transparent substrate 5 into right triangles (minute regions δ) such that each side of the triangle has a length w, and randomly allocating raised portions (which are denoted by "23a" in the drawing (minute regions $\delta_1$), dotted triangles) or recessed portions (which are denoted by "23b" in the drawing (minute regions $\delta_2$), white triangles) to respective ones of the minute regions δ such that the proportion of the raised portions or recessed portions is 50%. Here, w is 2.25 μm or less.

FIG. 25(b) shows a pattern diagram of a second surface structure 33 according to the present embodiment. This is obtained by dividing the surface of the transparent substrate 5 into right hexagons (minute regions β) such that each side of the hexagon has a length w, and randomly allocating raised portions (which are denoted by "33a" in the drawing (minute regions $\delta_1$), dotted hexagons) or recessed portions (which are denoted by "33b" in the drawing (minute regions $\delta_2$), white hexagons) to respective ones of the minute regions δ such that the proportion of the raised portions or recessed portions is 50%. Here, w is 0.93 μm or less.

Generally speaking, the requirement for the size of the minute regions is that the largest one of the inscribed circles of the minute regions has a diameter of from 0.2 μm to 1.5 μm.

The seventh embodiment is different from the first embodiment only in the shape of the patterns of the surface structures 23 and 33. The seventh embodiment is however based on the same principles as those of the first embodiment and produces the same effects as those of the first embodiment. The shape of the minute regions is not limited to a right triangle or a right hexagon but may be any polygon so long as the surface can be divided into geometrically congruent polygonal regions without leaving any gap therebetween.

Note that, in actually manufactured products according to the first to seventh embodiments, the surface structures 13, 23, 33 may not strictly have a right square, right triangular, or right hexagonal shape. For example, a vertex of one polygonal minute region may be rounded, and a vertex of a minute region adjacent to the vertex-rounded region may be accordingly deformed. However, even in such a case, as a matter of course, the characteristics do not degrade, and the same effects can be achieved. The variations of the second to sixth embodiments to which the seventh embodiment is applied can achieve the same effects as those of the second to sixth embodiments.

Eighth Embodiment

The eighth embodiment is described with reference to FIG. 26. Note that the elements of the eighth embodiment are all the same as those of the first embodiment except for a micro periodic structure for reduction of reflection. The descriptions of elements which are common among the first and eighth embodiments are herein omitted.

FIGS. 26(a) and 26(b) are a cross-sectional view and a top view showing a light emitting device 107 of the eighth embodiment. As shown in FIG. 26(a), an electrode 102, a light emitting layer 103, a transparent electrode 104, and a transparent electrode 105 are stacked on a substrate 101 in this order. As shown in FIGS. 26(a) and 26(b), a surface of the transparent electrode 105 (which is opposite to the side that is in contact with the transparent electrode 104) is provided with a surface structure 113 which is formed by recessed portions and raised portions, each having a boundary width w.

Figure 27:
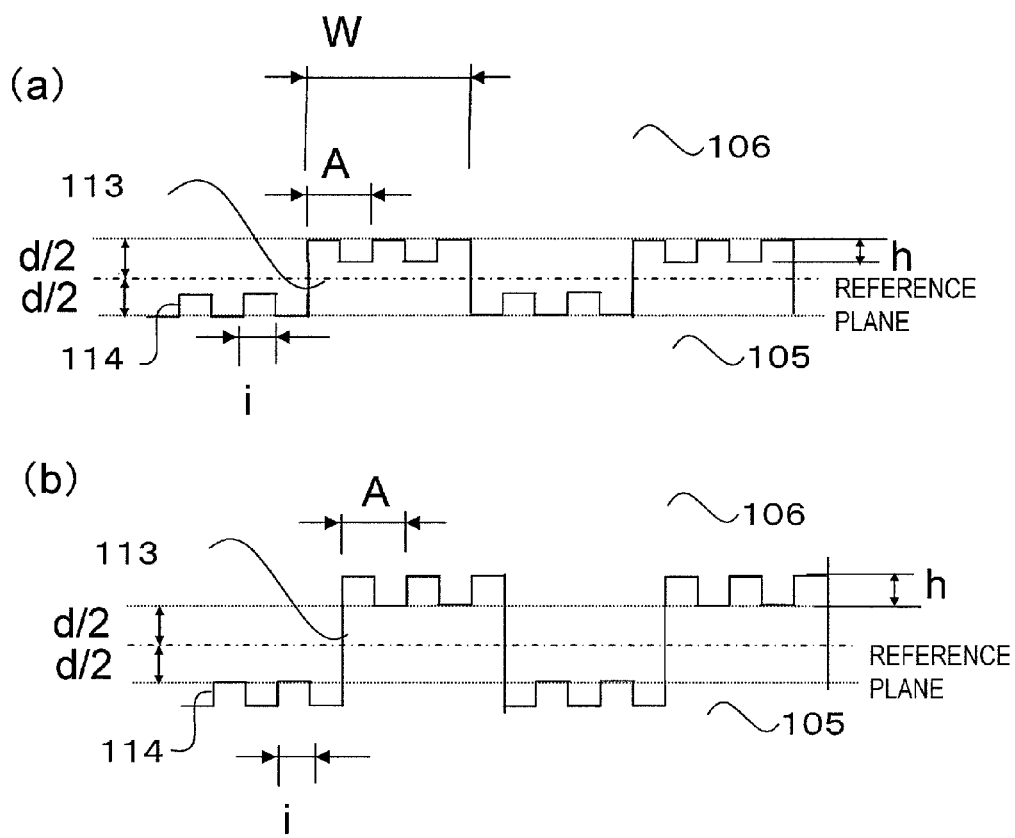
FIGS. 27(a) and 27(b) are enlarged views of a surface structure 113 and a micro periodic structure 114 which are formed in the transparent substrate 105.

In the surface structure 113, the upper surface of the raised portion and the bottom surface of the recessed portion are provided with a micro periodic structure 114 for reduction of reflection. FIGS. 27(a) and 27(b) are enlarged views of the surface structure 113 and the micro periodic structure 114 formed in the transparent electrode 105. As shown in FIGS. 27(a) and 27(b), the surface structure 113 has raised portions which are at a higher level than the reference plane by d/2 and recessed portions which are at a lower level than the reference plane by d/2. Each of the raised portions and the recessed portions forms a minute region δ. The upper surfaces of the raised portions and the bottom surfaces of the recessed portions are provided with the micro periodic structure 114 that is formed by indentations and projections. The indentations and projections of the micro periodic structure 114 may be realized by forming indentations of width i and depth h in the surface of the surface structure 113 as shown in FIG. 27(a) or by forming projections of width i and height h on the surface of the surface structure 113 as shown in FIG. 27(b). In the micro periodic structure 114 shown in FIGS. 27(a) and 27(b), the bottom surface of the indentations and the upper surface of the projections have a rectangular shape of width A/2. For example, in the micro periodic structure 114 shown in FIG. 27(b), the bottom surface of the indentations and the upper surface of the projections have a square shape (the length of one side: A/2). The boundary width w of the light extracting structure is an integral multiple of the width i of the indentations and projections of the micro periodic structure 114. The end surfaces of these structures are preferably coincident with each other but are not necessarily be coincident with each other. The recessed portions and the raised portions of the micro periodic structure 114 shown in FIGS. 27(a) and 27(b) may be inverted. In this case also, the same effects can be achieved.

The period A of the micro periodic structure 114 (the period along a direction parallel to the surface of the transparent electrode 105) is smaller than the wavelength of light emitted from the light emitting layer 103. Specifically, the period A of the indentations and projections of the micro periodic structure 114 is preferably equal to or smaller than ¼ of the wavelength of the light. Specifically, the period of the indentations and projections of the micro periodic structure 114 is preferably from 0.1 μm to 0.2 μm. If the period A is smaller than 0.1 μm, the processing is difficult. If the period A is larger than 0.2 μm, diffraction of light occurs, so that reduction of reflection of external light becomes difficult. The depth h (or height h) of the indentations and projections of the micro periodic structure 114 is preferably from 0.1 μm to 1.4 μm. If the depth h is smaller than 0.1 μm, the processing is difficult, and a variation in refractive index in terms of the thickness direction is large, so that the effect of reducing reflection is difficult to obtain. Also, as the depth h increases, the variation in refractive index is more moderate, but the processing is more difficult. If the depth h is larger than 1.4 μm, the shape of the boundary diffraction structure is difficult to maintain.

In the light emitting device 107 shown in FIG. 26(a), application of a voltage between the electrode 102 and the transparent electrode 104 causes radiation of light from the light emitting layer 103. Light radiated from the point S in the light emitting layer 103 may be transmitted through the transparent electrode 104 and then enters the transparent electrode 105. Then, the light is emitted into the outside via the surface structure 113 and the micro periodic structure 114. In this course, there is the surface structure 113 so that the above-described boundary diffraction effect is achieved. The light extraction efficiency improves as compared with a case where the transparent electrode 105 has a specular surface.

According to the present embodiment, the micro periodic structure 114 is formed in the surface of the light extraction sheet 105 so that reflection of external light can be reduced. Hereinafter, the details of this feature are described.

As previously described, when only the surface structure 113 is formed in the surface of the light extraction sheet 105 while no antireflection structure is formed, light incoming from the outside (from the air layer 106 side) is reflected by the surface structure 113 in random directions. Therefore, reflection which would cause an image to be visually perceived does not occur. Although this prevents ambient light reflection, light scattered by reflection however makes the display surface appear whitish, so that the minimum luminance is increased, i.e., it is visually perceived as occurrence of a poor black state. For example, when the structure discussed herein is applied to an organic EL display, there is a probability that the capability for expression at low luminance levels, which is one of the features of the organic EL display, will be degraded.

A common solution to this problem is forming an AR (Anti-Reflection) coat. The AR coat causes light rays coming to the inside of the coat to interfere with one another such that they cancel out one another, thereby realizing an antireflection effect. However, to obtain the antireflection effect, a film thickness of about 0.3 µm is necessary, so that the size of the light emitting device increases. Also, the film thickness needs to be accurately controlled, and therefore, the manufacturing steps become complicated. Further, when forming the AR coat over the surface of the surface structure 113, it is difficult to form the AR coat so as to have a uniform thickness. Also, the surface structure 113 may disadvantageously be buried in the AR coat. If the indentations and projections of the surface structure 113 are buried in the AR coat, the shape of the outermost surface would be changed to an approximately flat surface. In such a case, the above-described total reflection phenomenon occurs, and the light extraction efficiency decreases.

Structures such as the micro periodic structure 114 formed in the present embodiment are called a motheye structure, which was discovered by C. G. Bernhard in 1967 (see Non-patent Documents 1 and 2). For example, assuming that there is light coming from the air side into a material and that the surface of the material is provided with a two-dimensional periodic structure, the light is affected by the periodic structure as if a substance which has a refractive index at the midpoint between those of the air and the material were lying between the air and the material, so that the reflectance of the light decreases. It is known that, when the micro periodic structure is formed by tapered cones such that the refractive index moderately changes between the air and the material, the reflectance of light further decreases. In the present embodiment, by forming the micro periodic structure 114 that is a motheye structure, external light can be guided into the light emitting device 107 without forming a flat surface over the surface of the sheet. Part of the light guided into the light emitting device 107 is confined inside the light emitting device 107 (e.g., in the substrate, the color filter, the electrode layer) and absorbed or diffused. The amount of light which again goes out of the light emitting device 107 is smaller than the amount of light coming into the light emitting device 107. As a result, the reflection of external light can be reduced. Thus, a light extraction sheet can be provided which is capable of reducing not only ambient light reflection but also occurrence of a poor black state. For example, thinner display panels can be realized, and the assembly steps can be reduced.

The micro periodic structure 114 may be formed by means of a semiconductor process or a transfer process which employs nanoimprinting, as is the surface structure 113.

Figure 28:
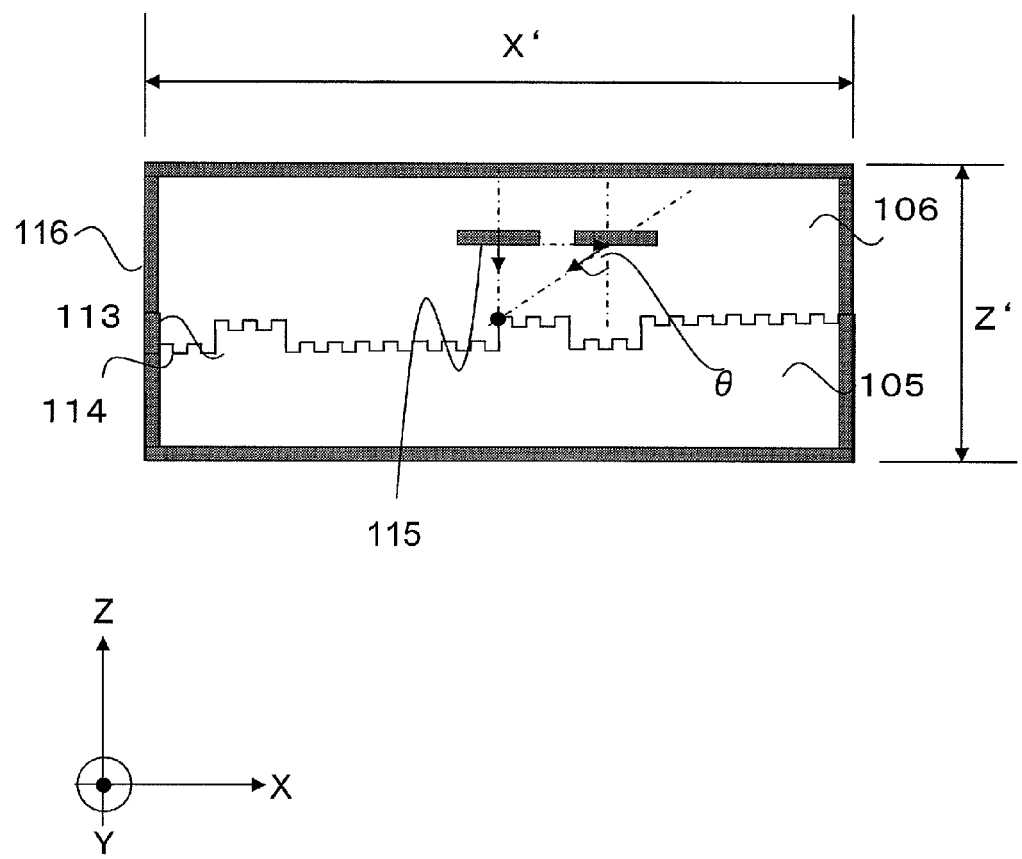
FIG. 28 shows a reflectance analysis model according to the eighth embodiment.

Results of a numerical analysis which was carried out in order to verify the external light reducing effect of the micro periodic structure 114 are described. The numerical analysis was carried out with the use of an analysis model shown in FIG. 28 in accordance with a two-dimensional FDTD (Finite Difference Time Domain) method. The analysis wavelength was 635 nm. The refractive index of the transparent electrode 105 was 1.457. The refractive index of the air layer 106 was 1.0. As shown in FIG. 28, the system of coordinates is set such that the Y axis is identical with a direction perpendicular to the sheet of the drawing. The X-direction analysis range X' was 120 µm, and the Z-direction analysis range Z' was 20 µm. The major excitation component in the Y direction for the electric field Ey is considered as a TE wave. The major excitation component in the Y direction for the magnetic field Hy is considered as a TM wave. With the arrangement as shown in FIG. 28, the TE wave represents the s-wave component, and the TM wave represents the p-wave component. A light source 115 used herein was a continuous wave which spatially has a Gaussian distribution. The analysis was carried out while changing the positional coordinates of the light source 115 as well as the propagation direction θ such that the continuous wave always impinges on the same point even when the propagation direction θ of the continuous wave from the light source 115 is changed.

An observation plane 116 was placed over the entire analysis region. The reflectance was calculated by dividing the accumulation value of the power measured across the analysis region on the air layer 106 side by the accumulation value of the power measured across the entire analysis region.

As for the micro periodic structure 114 which is the subject of the analysis, a shape which has indentations receding below the upper surface of the surface structure 113 as shown in FIG. 27(a) was used as a model of the present embodiment. The period A of the micro periodic structure 114 was 0.2 µm. The boundary width w was 1 µm. The boundary depth d was 0.6 µm.

Models used herein for the sake of comparison were a model of a specular surface, a model in which only the micro periodic structure 114 of rectangular indentations with the period of A=0.2 µm and the depth of h=0.1 µm is formed in a specular surface, and a model in which only the surface structure 113 with the boundary width of w=1 µm and d=0.6 µm is formed in a specular surface. The TE wave and the TM wave were produced to come into the four models in total including the model of the present embodiment and the comparison models, and the average values were compared. The incidence angles were two angles, 25° and 45°.

Figure 29:
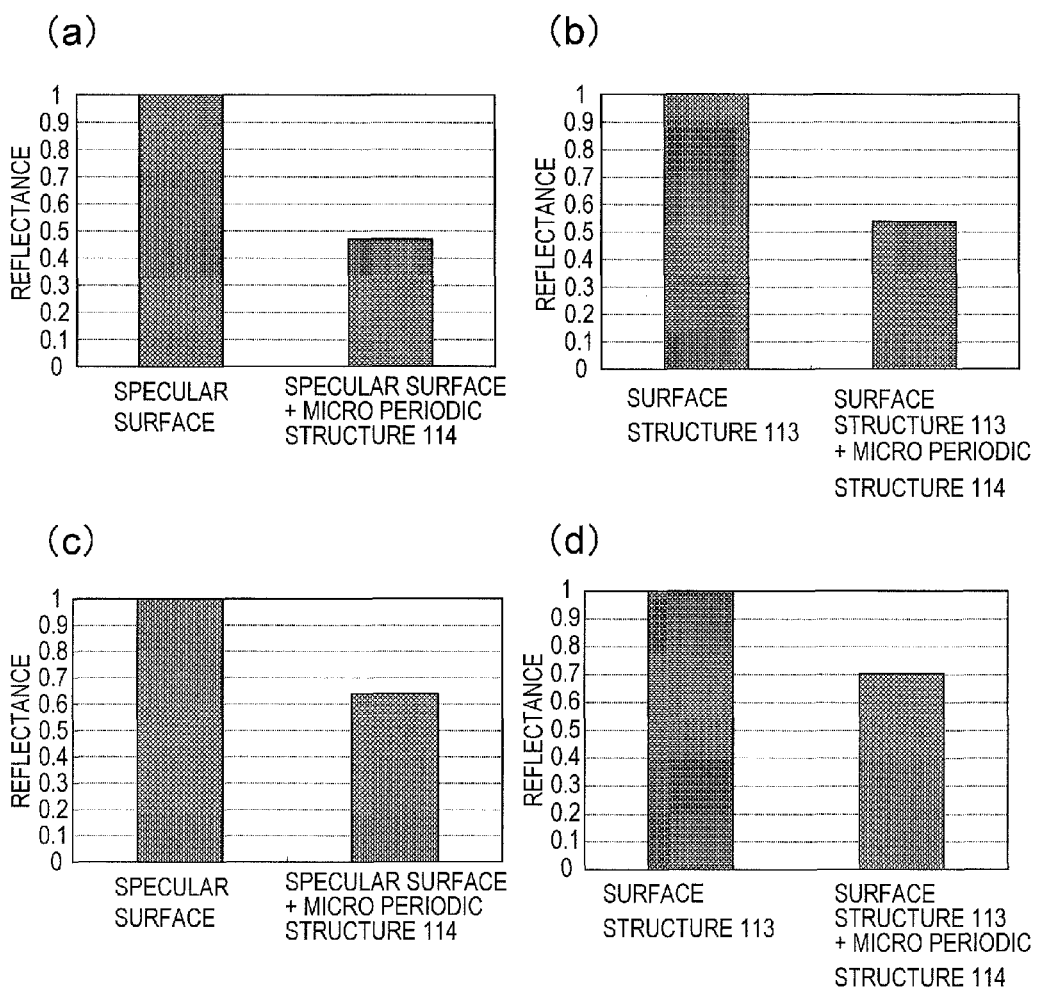
FIG. 29(a) shows the reflectance of a specular surface model and the reflectance of a model in which the micro periodic structure 114 is added to the specular surface, for the incidence angle of 25°.
FIG. 29(b) shows the reflectance of a model in which only the surface structure 113 is provided and the reflectance of a model of the present embodiment in which the micro periodic structure 114 is added to the surface structure 113, for the incidence angle of 25°.
FIG. 29(c) shows the reflectance of a specular surface model and the reflectance of a model in which the micro periodic structure 114 is added to the specular surface, for the incidence angle of 45°.
FIG. 29(d) shows the reflectance of a model in which only the surface structure 113 is provided and the reflectance of a model in which the micro periodic structure 114 is added to the surface structure 113, for the incidence angle of 45°.

FIG. 29 shows the analysis results. FIG. 29(a) shows the reflectance of the specular surface model and the reflectance of the model in which the micro periodic structure 114 is added to the specular surface, for the incidence angle of 25°. FIG. 29(b) shows the reflectance of the model in which only the surface structure 113 is provided and the reflectance of the model of the present embodiment in which the micro periodic structure 114 is added to the surface structure 113, for the incidence angle of 25°. FIG. 29(c) shows the reflectance of the specular surface model and the reflectance of the model in which the micro periodic structure 114 is added to the specular surface, for the incidence angle of 45°. FIG. 29(d) shows the reflectance of the model in which only the surface structure 113 is provided and the reflectance of the model in which the micro periodic structure 114 is added to the surface structure 113, for the incidence angle of 45°.

In FIGS. 29(a) and 29(c), the results are compared on the assumption that the reflectance of the specular surface model is 1. In FIGS. 29(b) and 29(d), the results are compared on the assumption that the reflectance of the model which has only the surface structure 113 is 1. Comparing the reflectance of the specular surface model and the reflectance of the model in which the micro periodic structure 114 is provided to the specular surface based on the results shown in FIGS. 29(a) and 29(c), it is seen that the reflectance of the latter model is smaller for both incidence angles 25° and 45°. From these results, it was confirmed in this analysis that the reflection reducing effect of the micro periodic structure 114 (motheye structure) was reproduced. On the other hand, comparing the model in which only the surface structure 113 is provided and the model in which the micro periodic structure 114 is added to the surface structure 113, it was confirmed from the results shown in FIGS. 29(b) and 29(d) that the reflection reducing effect of the micro periodic structure 114 was obtained for both incidence angles 25° and 45°.

Figure 30:
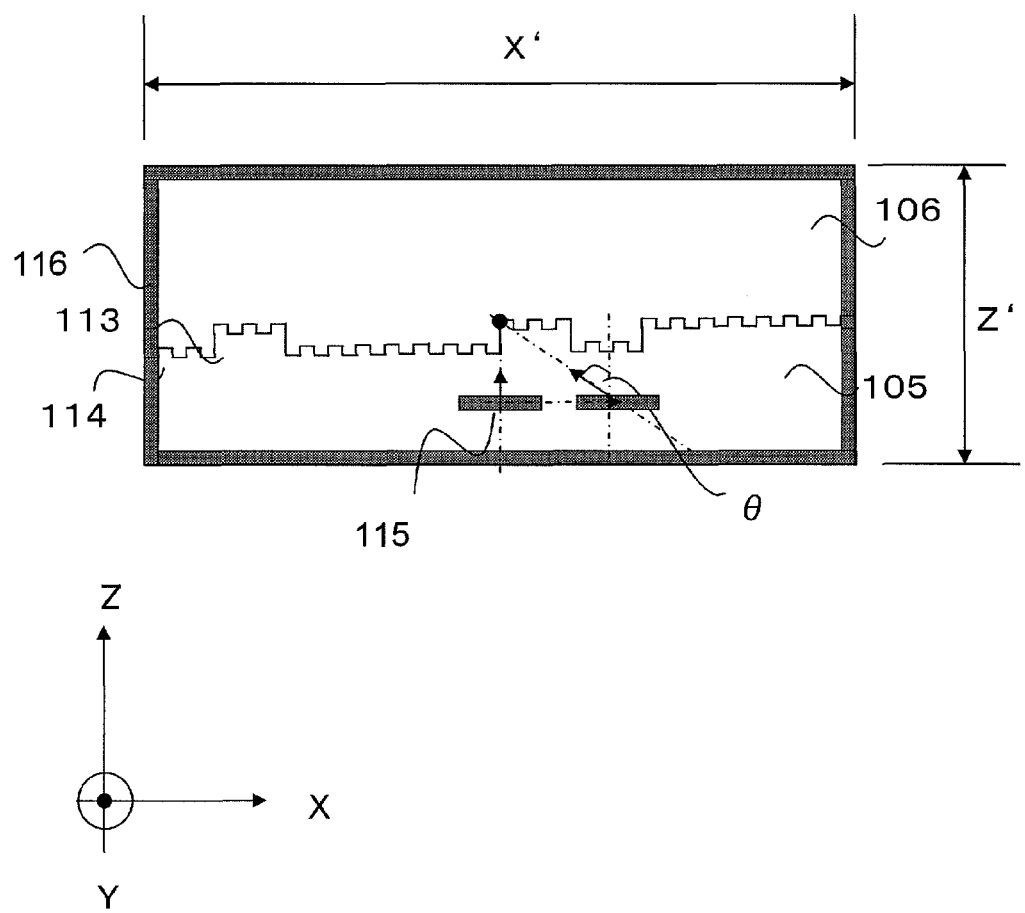
FIG. 30 is a transmittance analysis model in the eighth embodiment.

Next, to examine whether or not the micro periodic structure 114 affects the light extraction efficiency of the surface structure 113, the results of analysis of the light extraction efficiency are now described. The position of the light source 115 was moved to the higher refraction side as shown in FIG. 30 to derive the light extraction efficiency. The other analysis model conditions and analysis conditions were the same as those given in the above examination of the reflectance. The two light extraction efficiencies, the light extraction efficiency of the model which only has the surface structure 113 and the light extraction efficiency of the model which has both the surface structure 113 and the micro periodic structure 114, were compared relative to the transmittance of the specular surface model. The observation plane 116 was placed over the entire analysis region. The transmittance t was calculated by dividing the accumulation value of the power measured across the analysis region on the air layer 106 side by the accumulation value of the power measured across the entire analysis region. The average value of the TE wave and the TM wave was the transmittance t' of that model.

FIG. 31(a) shows the analysis results of the angle dependence of the transmittance t. FIG. 31(b) shows the light extraction efficiencies of the three models. The transmittance t shown in FIG. 31(a) is a value normalized with the maximum value exhibited at an angle in the vicinity of the Brewster angle of the specular surface relative to the transmittance t'. FIG. 31(a) shows the analysis results of the model which only has the surface structure 113 and the model which has both the surface structure 113 (boundary width: 1 μm) and the micro periodic structure 114. As seen from the analysis results of the model which only has the surface structure 113, the light extraction efficiency for an incidence angle equal to or greater than the critical angle was reproduced. Comparing this analysis result with the analysis result of the model which has both the surface structure 113 and the micro periodic structure 114, there is not a large difference between them, although small variations in transmittance t are found at respective angles. Comparing the light extraction efficiencies shown in FIG. 31(b), the decrease of the light extraction efficiency due to the micro periodic structure 114 is scarcely found.

From the above analysis results, it was confirmed that even when the micro periodic structure 114 is further formed in the surface of a sheet which has the surface structure 113, reflection of external light can be reduced without decreasing the light extraction efficiency. Note that the micro periodic structure 114 of the present embodiment is applicable to all the patterns from the first embodiment to the seventh embodiment. The micro periodic structure 114 may have the shape of a circular cone or polygonal pyramid as does the conventional motheye structure, in which the period A and the height h are optimized for external light, whereby the reflection reducing effect is further improved. When the indentations and projections of the micro periodic structure 114 have the shape of a circular cone or polygonal pyramid, the height h of the conical shape is preferably from 0.1 μm to 0.2 μm, and the period A is preferably from 0.1 μm to 1.4 μm.

As described above, according to the present embodiment, a boundary diffraction light extracting sheet which does not cause ambient light reflection or a poor black state can be provided.

Other Embodiments

The above-described embodiments are merely examples of the present invention, and the present invention is not limited to these examples. In the above embodiments, the cross-sectional shape of the raised portion of the surface structure perpendicular to the surface is not limited to a rectangle but may be a trapezoid or a circular cone. The lateral surface of the raised portion may be defined by a curved line.

When the transparent substrate 5 has a large thickness, the point of light emission occurs at more distant positions from the light radiation point S as the number of times of light extraction increases. If this applies to a device in which the structure is divided for respective ones of the pixels of about 300 μm, such as an EL element for display applications, light leaks into an adjacent pixel so that the image quality degrades. One possible solution to this problem is the structure shown in FIG. 32(a) in which the transparent substrate 5 with the surface structure 13 has a small thickness of about several micrometers, and the transparent substrate 5 is covered with a protection substrate 14 of about 0.2 mm to 0.5 mm with an intervening air layer. The front surface 14a and the rear surface 14b of the protection substrate need an AR coat, although total reflection does not occur on these surfaces. In this case, over the surface structure 13, the air layer may be replaced by a transparent material of a low refractive index, such as an aerogel or the like. This configuration provides an integral structure and therefore improves the device stability.

In the above embodiments, only one surface has the surface structure 13. However, like structures may be formed on the opposite surfaces of the transparent substrate 5. A common diffraction grating 13' may be provided between the surface structure 13 and the light radiation point S. In this case, for example, as shown in FIG. 32(b), the transparent substrate 5 has a film-like shape, with the surface structure 13 on the front surface and the diffraction grating 13' or a surface structure 13" of a modified configuration on the rear surface, and is adhered to the light emitting body side via an adhesive layer 21. When the refractive index of the transparent substrate 5 is small and the difference in refractive index between the transparent substrate 5 and the light emitting layer 3 is 0.1 or more, the material of the adhesive layer 21 may be selected from materials of refractive indices smaller than that of the light emitting layer 3 by 0.1 or more, so that total reflection scarcely occurs at the refracting surface between the adhesive layer 21 and the light emitting layer 3. Total reflection which would occur at the refracting surface between the adhesive layer 21 and the transparent substrate 5 and total reflection which would occur at the refracting surface between the transparent substrate 5 and the air 6 can be avoided by the surface structure 13" (or diffraction grating 13') and the surface structure 13, respectively. Note that, in the diffraction grating 13' and the surface structure 13", the preferred depth of the recessed portions or the preferred height of the raised portions are determined to meet a condition that light transmitted through the recessed portions and light transmitted through the raised portions have a phase difference of π. However, the depth of the recessed portions and the height of the raised portions may be smaller than those that meet the above condition.

FIG. 33 is a pattern diagram showing a surface structure for comparison, which has a checker pattern. In FIG. 33, in the surface structure, the surface of the transparent substrate 5 is divided into squares, each side having length w, such that gray squares 13a and white squares 13b form a checker pattern. The gray squares correspond to the raised portions, and relatively, the white squares correspond to the recessed portions.

FIG. 34 illustrates the incidence angle dependence of the transmittance t of the surface structure shown in FIG. 33, in which the height difference of the raised or recessed portions is d=0.70 μm, under the same conditions as those of FIG. 19(a). The curves show how much of a light beam whose light amount is 1 in the transparent substrate 5 and which is incident on the refracting surface at the incidence angle e (the angle from the normal to the refracting surface) for the first time is emitted into the air 6, with the parameter of width w (w=0.1, 0.2, 0.4, 1.0, 2.0, 4.0 (μm)). Comparing FIG. 34 with FIG. 16(a) which shows the characteristics of the random pattern, it can be seen that there are small undulations in the curves, except for the curves for w=0.1 μm and 0.2 μm (in the range of a so-called nanostructure which does not cause diffraction of light). This is because diffracted light appears and disappears on the air layer side due to diffraction by the checker pattern. Therefore, this indicates that there is a light intensity distribution which varies depending on the direction. This is a problem inherent to periodic patterns.

FIG. 19(b) also shows the light extraction efficiencies of this checker-pattern surface structure and the matrix-lattice surface structure shown in FIG. 4(b) (in which the square areas correspond to the recessed portions) in the first and second light extractions (d=0.70 μm, curves 5e, 5f, 5E, and 5F). The light extraction efficiency in the second light extraction for the matrix-lattice pattern increases as in the phenomenon described in connection with FIG. 23. This is because the proportion of the raised portions is P=0.75 in the matrix-lattice pattern. Both the checker pattern and the matrix-lattice pattern exhibit the characteristics with undulations which occur depending on the variation of w as compared with the characteristics of the random pattern. This problem is also inherent to periodic patterns. This relates to a light intensity distribution which varies depending on the direction.

FIGS. 35(a) and 35(b) also shows the analysis results of the viewing angle dependence of light extracted in the first light extraction, which was emitted from the checker-pattern surface structure. Here, the height difference is d=0.7 μm, and the boundary width is w=0.5 μm. FIG. 35(a) is under the condition of λ=0.450 μm. FIG. 35(b) is under the condition of λ=0.635 μm. It can be seen that both solid lines (directions of longitudes 0° and 90°) and dotted lines (directions of longitudes 45° and 135°) exhibit a large variation relative to the declination, and their separation from each other is large. Also, the shape of the lines largely changes depending on the wavelength. Variation in the light intensity distribution and color imbalance which occur depending on the direction are detrimental disadvantages for periodic patters as in the light emitting device described in Patent Document 1. These disadvantages are all overcome by every one of the first to eight embodiments.

The boundary diffraction effect occurs when portions of light in which the phase is discontinuous are separated by a predetermined distance or more. To maximize this effect, it is necessary to locally maximize the proportion of the phase-discontinuous portions within a restricted area. When the refracting surface is divided into an infinite number of minute regions such that the phase is discontinuous at the boundary between the minute regions, the aforementioned proportion is locally maximized under the following two conditions. The first one is that the areas of the minute regions are as equal as possible. The second one is that there is a phase difference between adjacent minute regions. Specifically, if one of the minute regions is larger than the others, the number of phase-discontinuous boundaries is increased by dividing this large minute region. If one of the minute regions is smaller than the others, this means that another one of them is larger than the others, and the number of phase-discontinuous boundaries is increased by dividing this large minute region. According to an extension of this logic, the proportion of the boundaries between the minute regions can be locally maximized under the conditions that the areas of the minute regions are as equal as possible, and that each of the areas of the minute regions is at least from 0.5 times to 1.5 times a predetermined reference area (the diameter of the largest one of the inscribed circles of the minute regions is from 0.7 times to 1.3 times a predetermined reference diameter). The first to eighth embodiments meet these conditions. Even when the division into the minute regions is locally maximized, the achieved effect decreases if adjacent minute regions have equal phases. Therefore, a phase difference is required between adjacent minute regions, i.e., random phase allocation is required. The fourth and fifth embodiments meet this condition. In other words, the light emitting devices of the above embodiments do not realize improvements in the extraction efficiency by the antireflection effect of the light emitting device such as described in Patent Document 2, but by the effect of local maximization of the boundary diffraction effect.

Note that the surface shapes in the first to eighth embodiments are different from the surface state of frosted glass, surface roughening, or the like, or the surface state of a light emitting device described in Patent Document 2. In the first, fourth and seventh embodiments, the surface is divided into square boxes (or polygonal boxes) of a predetermined grid, each box having width w, and raised portions and recessed portions are allocated to the respective boxes in the ratio of 1:1. This pattern has a specific scale, width w, and a specific shape of the minute regions, and the ratio of the total area of the raised portions to the total area of the recessed portions is 1:1. By contrast, the surface state of frosted glass, surface roughening, or the like, does not have a specific width w, and the shape of the minute regions is indefinite. The ratio of the total area of the raised portions to the total area of the recessed portions is not 1:1. In the second embodiment, the ratio of raised portions to recessed portions is shifted from 50%, and accordingly, the ratio of the total area of the raised portions to the total area of the recessed portions is shifted from 1:1. However, there is still a specific width w, and the ratio between the total area of the recessed portions and the total area of the raised portions has a predetermined value. This is clearly distinguishable from perfectly random patterns. The third and fifth embodiments also have a specific width w, and the respective ones of the square boxes (or polygonal boxes) defined by width w have different heights. Thus, the surface shapes of the above embodiments do not have a perfectly random pattern but a random pattern which is determined under a predetermined rule.

The difference of the random patterns of the present embodiments from a perfectly random pattern is further discussed. As shown in FIG. 36(a), eight cards 17 having a width w are randomly arranged on a table 16 having a width 4w. The total area of the eight cards 17 is ½ of the area of the table 16. Here, it is assumed that none of the cards 17 should extend out of the table 16. FIG. 36(b) shows an arrangement in which some of the cards 17 are overlapping. FIG. 36(c) shows an arrangement in which none of the cards 17 are overlapping. In FIG. 36(b), the total area of the cards is smaller than ½ of the table area by the area of overlapping portions of the cards 17. As previously illustrated by the curves 27a and 27A of FIG. 23, the light extraction efficiency decreases as the area ratio deviates from a predetermined ratio. In FIG. 36(c), there is a small gap j between the cards, which is smaller than w, although the area ratio is maintained at ½. This is also the case with FIG. 36(b). When the small gap j occurs and the frequency of its occurrence increases, the gap j can be regarded as a new boundary width. As seen from FIG. 22, the light extraction efficiency greatly decreases under the condition of j<0.2 µm. As seen from FIG. 23, as the proportion $P_1$ of the recessed or raised portions of the minute uneven structure increases (the proportion $P_1$ of the structure of $w_1$=0.1 µm increases, such as 0.0, 0.1, and 0.2, in the order of the curves 27a, 27c, and 27d), both the light extraction efficiencies in the first and second light extractions decrease, although the total proportion of the raised portions is equal. Thus, a perfectly random pattern alone cannot constitute a condition for maximizing the light extraction efficiency.

The principle of random pattern generation employed in the above embodiments is different from that of FIG. 36. In the above embodiments, the area ratio is maintained at a predetermined ratio, so that a scale smaller than the width w, such as the minute gap j, does not occur. Thus, it can be said that the surface shapes of the above embodiments do not have a perfectly random pattern, but a random pattern which is determined under a predetermined rule for locally maximizing the light extraction efficiency.

The phenomenon caused by the surface shapes of the first to eighth embodiments is a form of diffraction phenomenon. As shown in FIG. 5, in the diffraction phenomenon, a light ray resulting from virtual refraction relative to a flat reference plane which is equivalent to the average of the surface shape is referred to as a zeroth order diffraction component (which does not occur in the case of total reflection), and higher-order diffraction components occur in directions shifted from the zeroth order diffraction component which is used as a reference of the direction. In a random surface shape such as disclosed in the present application, the diffraction components other than the zeroth order occur in random propagation directions. By contrast, frosted glass and surface roughening cause a form of refraction phenomenon, which is different from the diffraction phenomenon. Across an uneven refracting surface, the direction of the normal to the refracting surface randomly varies, and accordingly, the direction of refraction also randomly varies. For example, when the surface shape of one of the first to eighth embodiments is formed in one surface of a parallel flat plate, the contour of an image of an object on the opposite side of the plate can be clearly seen through the plate. This is because the light diffracted by the surface shape always includes a zeroth order diffraction component, and this component serves to maintain the contour of the image of the object on the opposite side of the plate. By contrast, in the case of frosted glass or surface roughening, the light does not include a component which is equivalent to the zeroth order diffraction component, so that the contour of the image of the object on the opposite side appears blurred when seen through the plate. Patent Document 2 only describes that light is "obediently emitted into the air" by means of projections formed in the surface but fails to mention the term "diffraction." The word "obediently" can be interpreted as "being obedient to Snell's law (law of refraction)." In this context, it is interpreted as being in the same category as frosted glass and surface roughening. Thus, Patent Document 2 can be said to be different from the present invention.

The technical feature disclosed in Patent Document 2 is to perfectly randomly arrange a plurality of transparent projections over a transparent insulative substrate. Patent Document 2 fails to describe or suggest the feature of the present invention that recessed and raised portions are treated as one or more groups of minute regions having the same shape and the ratio between the raised portions and the recessed portions is set to a specific value. For example, in the first embodiment, a structure in which the recessed portions and the raised portions are exchanged or a structure in which the height and depth of the respective minute regions are exchanged is substantially the same as the original structure. This is not the case with the light emitting device of Patent Document 2. The present inventors are the first to find that the features of the illustrative embodiments achieve excellent light extraction effects, whereas Patent Document 2 fails to describe such excellent effects as obtained in the above embodiments. In the light emitting device described in Patent Document 2, projections having a width of 0.4 µm to 20 µm are in a perfectly random arrangement at a density of 5000 to $10^6$ projections per unit area (/mm²). Part of the light emitting devices of the above embodiments fall within the extent of the light emitting device of Patent Document 2 in terms of the formal aspects. However, the relationship between the projections and the other portions and the relationship of the proportion of the projections, as well as the effects which cannot achieved without such relationships, are no described or suggested in Patent Document 2. Therefore, the above embodiments are not substantially within the scope of the technologies disclosed in Patent Document 2. The subject matter disclosed in Patent Document 2 and the invention of the present application are totally different.

In the first to sixth embodiments and the eighth embodiment, the phase of light is shifted by an uneven shape consisting of recessed and raised portions. However, the shift of the phase can be realized by using any other means than the uneven shape. For example, the shift of the phase can be realized by determining the thickness and the refractive index conditions of the multilayer film so as to be different between the regions corresponding to the recessed portions and the regions corresponding to the raised portions. In this case also, as a matter of course, the same effects as those of the above embodiments can be achieved. Parts of the first to eighth embodiments may be combined into a new example instead of independently enabling respective one of these embodiments. Although the first to eighth embodiments have been described with the examples of the organic electroluminescence element, the embodiments are applicable to any element which is capable of emitting light in a medium whose refractive index is greater than 1. For example, the present embodiments are applicable to an LED, a light guide plate, and the like. The medium into which the light emitting device emits light is not limited to the air. The surface structures of the above embodiments are applicable to a transparent substrate whose refractive index is greater than that of a medium with which the transparent substrate is in contact, specifically greater than that of the medium by 0.1 or more.

INDUSTRIAL APPLICABILITY

As described above, a light emitting device of the present invention greatly improves the light extraction efficiency and provides excellent viewing angle characteristics of emitted light, and is therefore useful for displays, light sources, etc.

REFERENCE SIGNS LIST

| | |
|---|---|
| 1 | substrate |
| 2 | electrode |
| 3 | light emitting layer |
| 4 | transparent electrode |
| 5 | transparent substrate |
| 6 | air |
| 13, 13', 13" | surface structure |
| 14 | micro periodic structure |
| 15 | light source |
| 16 | observation plane |
| s | light radiation point |
| 101 | substrate |
| 102 | electrode |
| 103 | light emitting layer |
| 104 | transparent electrode |
| 105 | transparent substrate |
| 106 | air layer |
| 107 | light emitting device |
| 113 | surface structure |
| 114 | micro periodic structure |
| 115 | light source |
| 116 | observation plane |

The invention claimed is:

1. A transparent sheet for use with a light emitting body with one of surfaces of the transparent sheet being adjacent to the light emitting body,
wherein an other surface of the transparent sheet includes a plurality of minute regions $\delta$, a largest inscribed circle of the minute regions $\delta$ having a diameter from 0.2 μm to 1.5 μm, one of the minute regions $\delta$ being adjoined by and surrounded by some other ones of the minute regions $\delta$,
the plurality of minute regions $\delta$ include a plurality of minute regions $\delta_1$ which are selected from the plurality of minute regions $\delta$ so as to constitute 40% to 98% of the minute regions $\delta$ and a plurality of minute regions $\delta_2$ which constitute a remaining portion of the minute regions $\delta$,
the minute regions $\delta_1$ include a raised portion protruding above the other surface, the raised portion having a height of d/2 relative to a predetermined reference plane parallel to the other surface,
the minute regions $\delta_2$ include a recessed portion receding below the other surface, the recessed portion having a depth of d/2 relative to the predetermined reference plane,
the predetermined reference plane is equidistant from the minute regions $\delta_1$ and the minute regions $\delta_2$ in terms of a direction perpendicular to the other surface,
d is from 0.2 μm to 1.4 μm, and
at least part of the raised portions and the recessed portions has a micro periodic structure that is formed by indentations and projections.

2. The sheet of claim 1, wherein the minute regions $\delta$ are polygonal and congruent with one another.

3. The sheet of claim 1, wherein
in the micro periodic structure, a bottom surface of each of the indentations and an upper surface of each of the projections have a rectangular shape with a width of A/2,
in the micro periodic structure, a period A of the indentations or projections along a direction parallel to the other surface is from 0.1 μm to 0.2 μm, and
a height h of the indentations or projections of the micro periodic structure is from 0.1 μm to 1.4 μm.

4. The sheet of claim 1, wherein
in the micro periodic structure, the indentations and the projections have a conical shape,
a period A of the conical indentations or projections along a direction parallel to the other surface is from 0.1 μm to 0.2 μm, and
a height h of the conical indentations or projections is from 0.1 μm to 1.4 μm.

5. A light emitting device, comprising a light emitting body and a transparent protection layer provided on a light emitting surface of the light emitting body,
wherein the transparent protection layer has a surface which adjoins the light emitting surface and a surface opposite to the adjoining surface, the opposite surface including a plurality of minute regions $\delta$, a largest inscribed circle of the minute regions $\delta$ having a diameter from 0.2 μm to 1.5 μm, one of the minute regions $\delta$ being adjoined by and surrounded by some other ones of the minute regions $\delta$,
the plurality of minute regions $\delta$ include a plurality of minute regions $\delta_1$ which are selected from the plurality of minute regions $\delta$ so as to constitute 40% to 98% of the minute regions $\delta$ and a plurality of minute regions $\delta_2$ which constitute a remaining portion of the minute regions $\delta$,
the minute regions $\delta_1$ include a raised portion protruding above the other surface, the raised portion having a height of d/2 relative to a predetermined reference plane parallel to the other surface,
the minute regions $\delta_2$ include a recessed portion receding below the other surface, the recessed portion having a depth of d/2 relative to the predetermined reference plane,
the predetermined reference plane is equidistant from the minute regions $\delta_1$ and the minute regions $\delta_2$ in terms of a direction perpendicular to the other surface,
the light emitting body is configured to emit light whose center wavelength of an emission spectrum is $\lambda$,
$\lambda/6(n_1-n_0)<d<\lambda/(n_1-n_0)$ holds where $n_1$ is a refractive index of the protection layer and $n_0$ is a refractive index of a medium with which the protection layer is in contact at the opposite surface, $n_0$ being smaller than $n_1$, and
at least part of the raised portions and the recessed portions has a micro periodic structure that is formed by indentations and projections.

6. The light emitting device of claim 5, wherein the medium is air.

7. The light emitting device of claim 5, wherein the medium is aerogel.

8. The light emitting device of claim 5, wherein $n_2-n_1<0.1$ holds where $n_2$ is a refractive index of part of the light emitting body from which light is radiated.

9. The light emitting device of claim 5, wherein
in the micro periodic structure, a bottom surface of each of the indentations and an upper surface of each of the projections have a rectangular shape with a width of A/2,
in the micro periodic structure, a period A of the indentations or projections along a direction parallel to the other surface is from 0.1 μm to 0.2 μm, and
a height h of the indentations or projections of the micro periodic structure is from 0.1 μm to 1.4 μm.

10. The light emitting device of claim 5, wherein
in the micro periodic structure, the indentations and the projections have a conical shape, a period A of the conical indentations or projections across a plane parallel to the opposite surface is from 0.1 μm to 0.2 μm, and a height h of the conical indentations or projections is from 0.1 μm to 1.4 μm.

11. A light emitting device, comprising a light emitting body and a transparent protection layer provided on a light emitting surface of the light emitting body, wherein the transparent protection layer has a surface which adjoins the light emitting surface and a surface opposite to the adjoining surface, the opposite surface including a plurality of minute regions δ, a largest inscribed circle of the minute regions δ having a diameter from 0.2 μm to 1.5 μm, one of the minute regions δ being adjoined by and surrounded by some other ones of the minute regions δ, respective ones of the plurality of minute regions δ include raised portions protruding above the other surface, the raised portions having heights within a range of 0 to d/2 relative to a predetermined reference plane parallel to the other surface, or recessed portions receding below the other surface, the recessed portions having depths within a range of 0 to d/2 relative to the predetermined reference plane, the predetermined reference plane is equidistant from a highest one of the minute regions δ and a lowest one of the minute regions δ in terms of a direction perpendicular to the other surface, the light emitting body is configured to emit light whose center wavelength of an emission spectrum is λ, $\lambda/6(n_1-n_0) < d < \lambda/(n_1-n_0)$ holds where $n_1$ is a refractive index of the protection layer and $n_0$ is a refractive index of a medium with which the protection layer is in contact at the opposite surface, $n_0$ being smaller than $n_1$, and at least part of the raised portions and the recessed portions has a micro periodic structure that is formed by indentations and projections.

12. The light emitting device of claim 11, wherein the medium is air.

13. The light emitting device of claim 11, wherein $n_2 - n_1 < 0.1$ holds where $n_2$ is a refractive index of part of the light emitting body from which light is radiated.

14. The light emitting device of claim 11, wherein
in the micro periodic structure, a bottom surface of each of the indentations and an upper surface of each of the projections have a rectangular shape with a width of A/2,
in the micro periodic structure, a period A of the indentations or projections along a direction parallel to the other surface is from 0.1 μm to 0.2 μm, and
a height h of the indentations or projections of the micro periodic structure is from 0.1 μm to 1.4 μm.

15. The light emitting device of claim 11, wherein
in the micro periodic structure, the indentations and the projections have a conical shape,
a period A of the conical indentations or projections across a plane parallel to the opposite surface is from 0.1 μm to 0.2 μm, and
a height h of the conical indentations or projections is from 0.1 μm to 1.4 μm.

16. A light emitting device, comprising a light emitting body and a transparent protection layer provided on a light emitting surface of the light emitting body, wherein the transparent protection layer has a surface which adjoins the light emitting surface and a surface opposite to the adjoining surface, the opposite surface including a plurality of minute regions δ, a largest inscribed circle of the minute regions δ having a diameter from 0.4 μm to 1.0 μm, one of the minute regions δ being adjoined by and surrounded by some other ones of the minute regions δ, the plurality of minute regions δ include a plurality of minute regions $\delta_1$ and a plurality of remaining minute regions $\delta_2$, the minute regions $\delta_1$ and the minute regions $\delta_2$ are configured to produce a phase difference of 180° between part of light perpendicularly impinging on the adjoining surface which is transmitted through the minute regions $\delta_1$ and another part of the light perpendicularly impinging on the adjoining surface which is transmitted through the minute regions $\delta_2$, and at least part of respective ones of the minute regions δ1 and the minute regions δ2 has a micro periodic structure that is formed by indentations and projections.

17. The light emitting device of claim 16, wherein
in the micro periodic structure, a bottom surface of each of the indentations and an upper surface of each of the projections have a rectangular shape with a width of A/2,
in the micro periodic structure, a period A of the indentations or projections along a direction parallel to the other surface is from 0.1 μm to 0.2 μm, and
a height h of the indentations or projections of the micro periodic structure is from 0.1 μm to 1.4 μm.

18. The light emitting device of claim 16 wherein
in the micro periodic structure, the indentations and the projections have a conical shape,
a period A of the conical indentations or projections across a plane parallel to the opposite surface is from 0.1 μm to 0.2 μm, and
a height h of the conical indentations or projections is from 0.1 μm to 1.4 μm.

* * * * *